(12) United States Patent
Ludwig

(10) Patent No.: US 10,036,579 B2
(45) Date of Patent: *Jul. 31, 2018

(54) INCREMENTAL DEPLOYMENT OF STAND-ALONE AND HIERARCHICAL ADAPTIVE COOLING AND ENERGY HARVESTING ARRANGEMENTS FOR INFORMATION TECHNOLOGY

(71) Applicant: Lester F. Ludwig, San Antonio, TX (US)

(72) Inventor: Lester F. Ludwig, San Antonio, TX (US)

(73) Assignee: NRI R&D PATENT LICENSING, LLC, San Antonio, TX (US)

( * ) Notice: Subject to any disclaimer, the term of this patent is extended or adjusted under 35 U.S.C. 154(b) by 31 days.

This patent is subject to a terminal disclaimer.

(21) Appl. No.: 15/243,542

(22) Filed: Aug. 22, 2016

(65) Prior Publication Data
US 2017/0047497 A1  Feb. 16, 2017

Related U.S. Application Data

(63) Continuation of application No. 13/674,945, filed on Nov. 13, 2012, now Pat. No. 9,423,161, which is a
(Continued)

(51) Int. Cl.
*H01L 35/28* (2006.01)
*F25B 21/02* (2006.01)
(Continued)

(52) U.S. Cl.
CPC .............. *F25B 21/02* (2013.01); *F25B 21/04* (2013.01); *F25B 47/006* (2013.01); *G06F 1/20* (2013.01);
(Continued)

(58) Field of Classification Search
CPC ........ F25B 21/04; F25B 21/02; F25B 47/006; F25B 2321/0212; H01L 23/38;
(Continued)

(56) References Cited

U.S. PATENT DOCUMENTS 4,125,122 A * 11/1978 Stachurski .............. H01L 35/30
136/205
4,519,780 A 5/1985 Strohmaier et al.
(Continued)

*Primary Examiner* — Mohammad M Ali
(74) *Attorney, Agent, or Firm* — Procopio, Cory, Hargreaves & Savitch LLP

(57) ABSTRACT

Arrangements for incremental deployment of stand-alone and hierarchical adaptive cooling and energy harvesting arrangements for use in information technology and other heat-producing equipment are disclosed. The arrangements provide for individual cooling and energy harvesting subsystems, each of which can operate in isolation and be interconnected with additional subsystems in peer and hierarchical relationships. Each subsystem comprises at least one thermoelectric device capable of acting as a thermoelectric cooler and as a thermoelectric generator, a control system, and electronics controlled to selectively configure the thermoelectric device in at least in a thermoelectric cooler operating mode and in a thermoelectric generation operating mode. The thermoelectric device can incorporate quantum-process and quantum-well materials for higher heat transfer and thermoelectric generation efficiencies. The control system of each subsystem can operate in isolation but also work together with the control system of one or more other associated subsystems interconnected in peer or hierarchical arrangements.

20 Claims, 67 Drawing Sheets

Related U.S. Application Data continuation of application No. 13/385,411, filed on Feb. 16, 2012, now abandoned.

(60) Provisional application No. 61/443,701, filed on Feb. 16, 2011.

(51) Int. Cl.
  *F25B 21/04* (2006.01)
  *H01L 23/38* (2006.01)
  *G06F 1/20* (2006.01)
  *F25B 47/00* (2006.01)

(52) U.S. Cl.
  CPC .............. *H01L 23/38* (2013.01); *H01L 35/28* (2013.01); *F25B 2321/0212* (2013.01); *H01L 2924/0002* (2013.01)

(58) Field of Classification Search
  CPC ............. H01L 35/28; H01L 2924/0002; H01L 2924/00; G06F 1/20
  USPC .............. 62/3.1, 3.2, 3.3; 136/200, 202, 205
  See application file for complete search history.

(56) References Cited

U.S. PATENT DOCUMENTS

| | | |
|---|---|---|
| 5,419,780 A | 5/1995 | Suski |
| 6,125,636 A | 10/2000 | Taylor et al. |
| 6,942,728 B2 | 9/2005 | Caillat et al. |
| 8,267,983 B2 | 9/2012 | Rogers et al. |
| 2003/0184941 A1 | 10/2003 | Maeda et al. |
| 2003/0218464 A1 | 11/2003 | Harman |
| 2005/0139248 A1* | 6/2005 | Strnad ............ H01L 35/30 136/205 |
| 2006/0196505 A1 | 9/2006 | Izuchukwu |
| 2007/0153033 A1 | 7/2007 | Wu et al. |
| 2008/0152482 A1 | 6/2008 | Patel |
| 2008/0190480 A1 | 8/2008 | Joshi |
| 2008/0245352 A1* | 10/2008 | Solecki ............ F24B 1/02 126/58 |
| 2008/0264464 A1 | 10/2008 | Lee et al. |
| 2009/0120116 A1 | 5/2009 | Fuselier |
| 2009/0191594 A1 | 7/2009 | Ohashi |
| 2009/0277490 A1 | 11/2009 | Chu |
| 2009/0294117 A1 | 12/2009 | Hodes et al. |
| 2010/0081191 A1* | 4/2010 | Woods ............ B01L 7/52 435/303.1 |
| 2010/0154855 A1 | 6/2010 | Nemir et al. |
| 2010/0198204 A1 | 8/2010 | Rogers |

* cited by examiner

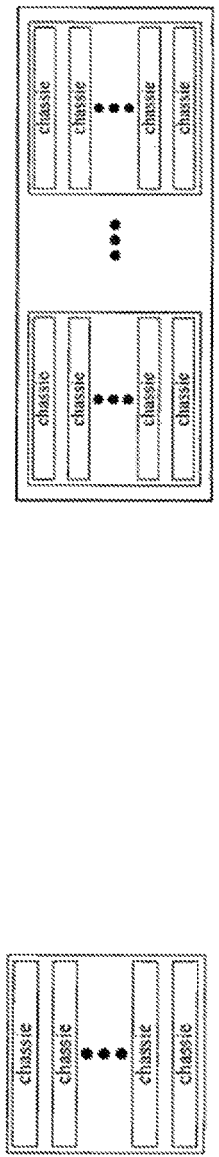
Figure 2E Cage
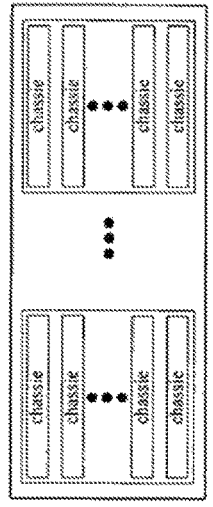
Figure 2F Rack
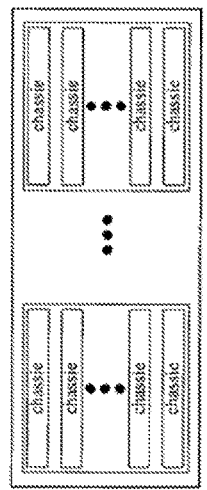
Figure 2H
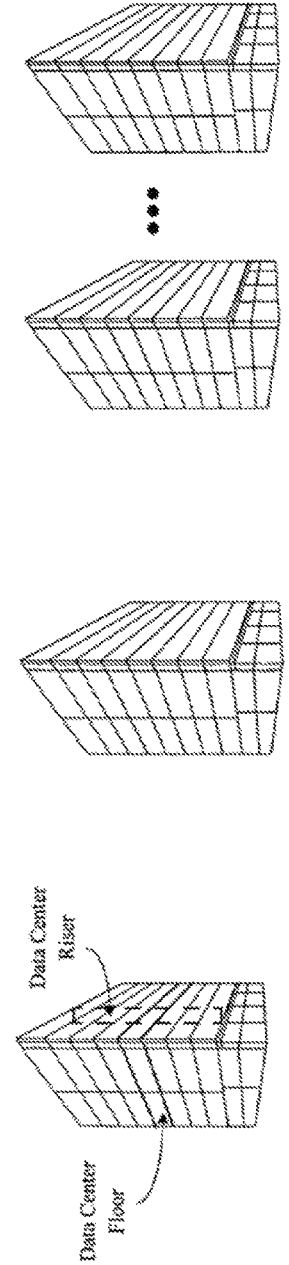
Figure 2G Rack Cluster
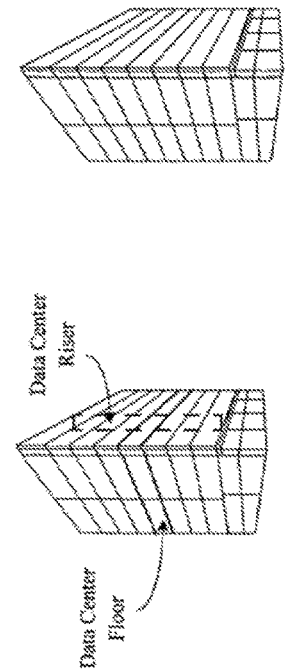
Figure 2I Data Center Building
Figure 2J Campus of Data Buildings Adapted from Li Adapted from Li Adapted from Li

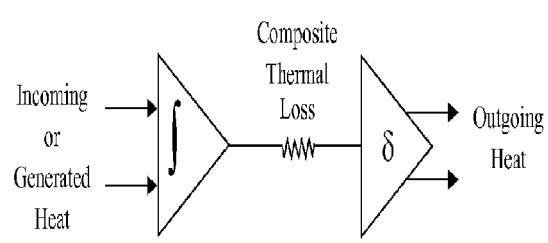
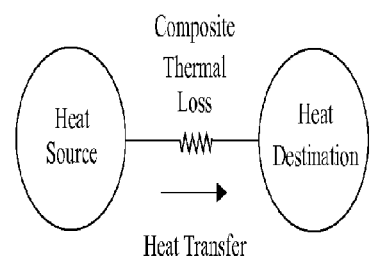
Figure 5a
Figure 5b
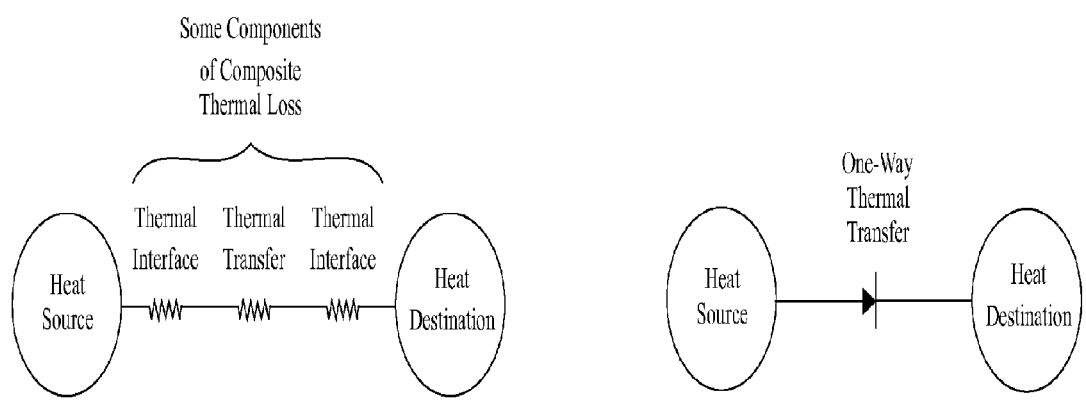
Figure 5c
Figure 5d

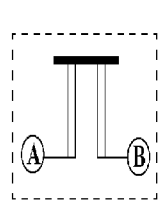 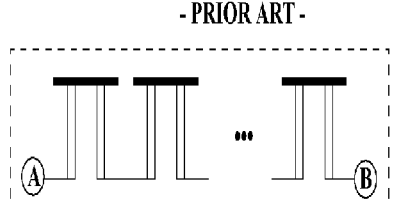
Figure 7c    Figure 7d
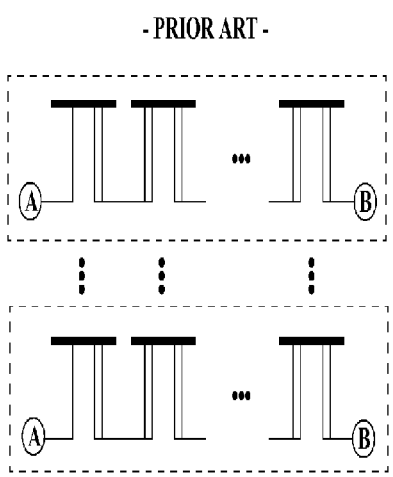
Figure 7e    Figure 7f

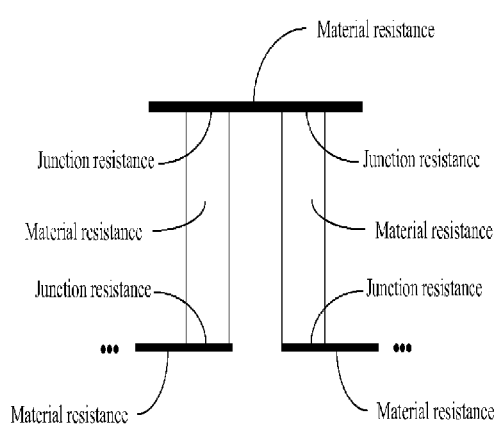
Figure 8a
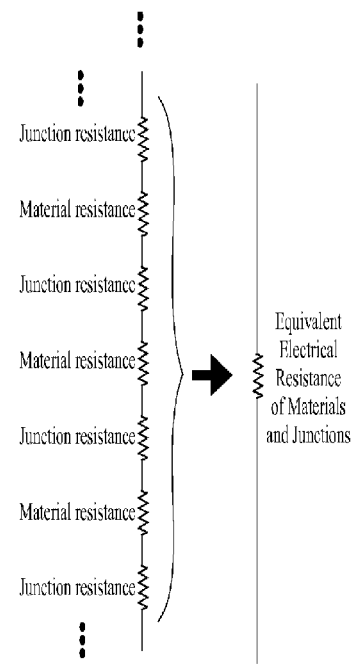
Figure 8b
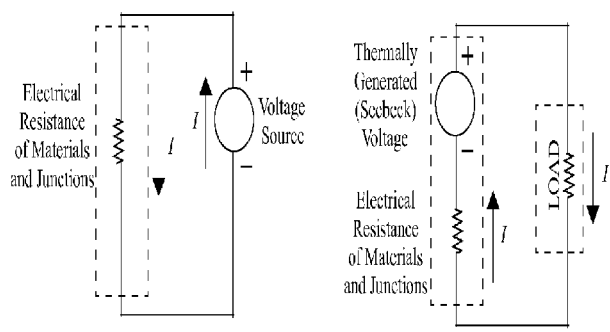
Figure 8c  Figure 8d

Adapted from http://knol.google.com/k/andre-szykier/thermo-electric-energy/3sqds0076vqoz/2

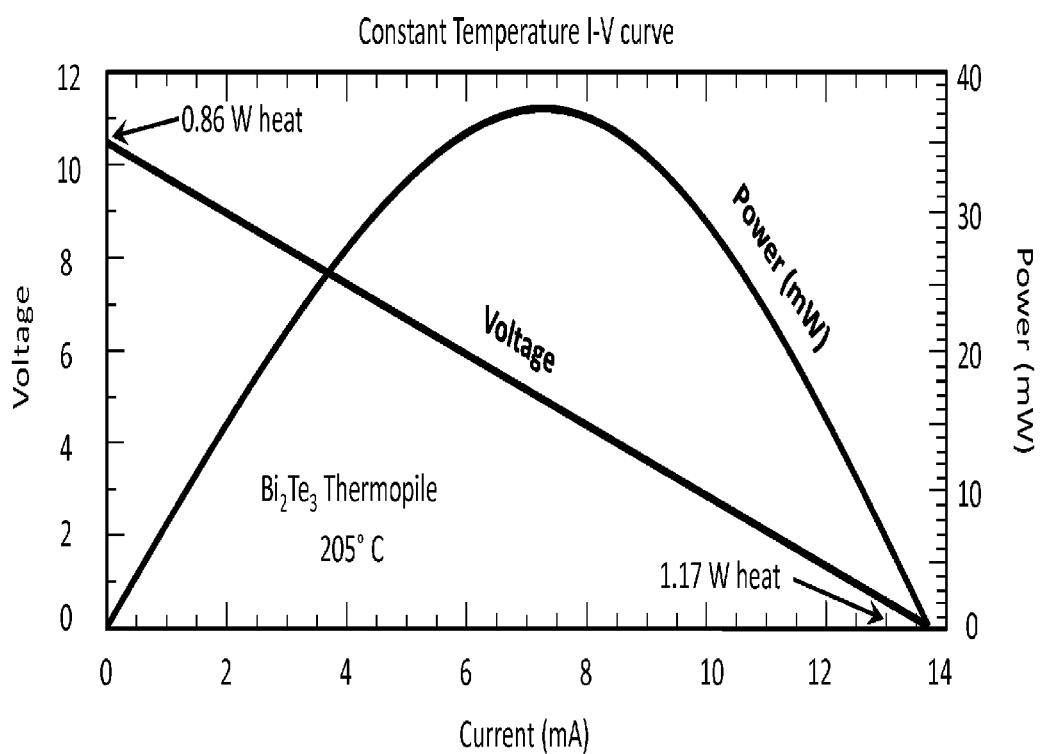
Figure 9b Adapted from http://knol.google.com/k/andre-szykier/thermo-electric-energy/3sqds0076vqoz/2

Adapted from http://knol.google.com/k/andre-szykier/thermo-electric-energy/3sqds0076vqoz/2

Adapted from http://knol.google.com/k/andre-szykier/thermo-electric-energy/3sqds0076vqoz/2

Adapted from http://www.powerchips.gi/technology/overview.shtml

Adapted from http://www.powerchips.gi/technology/overview.shtml

Adapted from http://www.powerchips.gi/technology/overview.shtml

Adapted from http://www.powerchips.gi/technology/overview.shtml

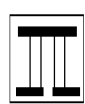
Figure 11a
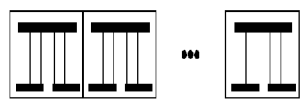
Figure 11b
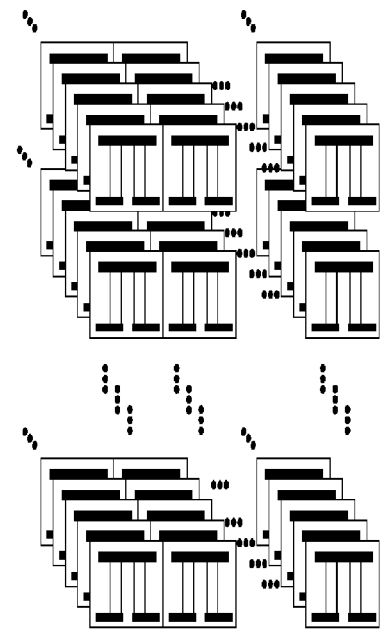
Figure 11e
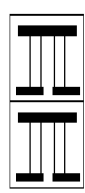
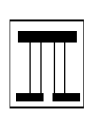
Figure 11d    Figure 11c Adapted from Li Adapted from Marquand and Croft Adapted from Gray Adapted from Gray Unit-step change in current Adapted from Gray Unit-step change in heat load Adapted from Gray Unit-step change in ambient temperature Adapted from Gray Adapted from Gray Adapted from Gray Adapted from Gray Unit step in input power
Adapted from Gray Adapted from Gray Unit step in ambient temperature
Adapted from Gray Unit step in load resistance
Adapted from Gray Adapted from Gray Unit step in load back-emf
Adapted from Gray Adapted from Gray Adapted from Paik, Chakrabarty and Pamula Adapted from Paik,
Chakrabarty
and Pamula Adapted from Paik, Chakrabarty and Pamula Adapted from Paik, Chakrabarty and Pamula Adapted from Paik, Chakrabarty and Pamula Adapted from Paik, Chakrabarty and Pamula

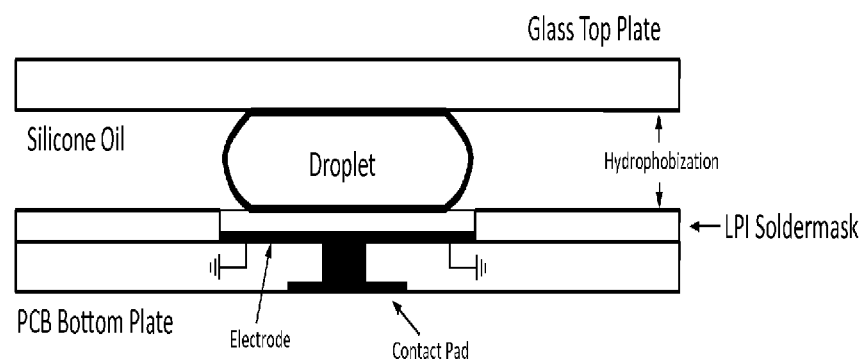
Figure 28a  Confined System
Adapted from Paik, Chakrabarty and Pamula
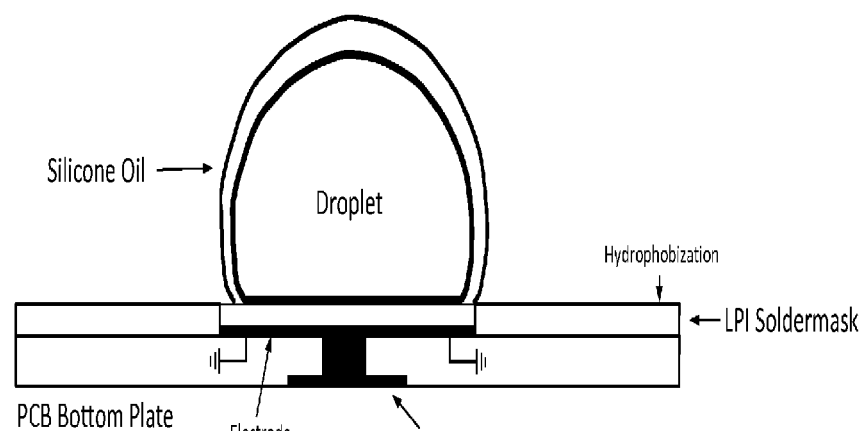
Figure 28b  "Open" System
Adapted from Paik, Chakrabarty and Pamula Adapted from Paik, Chakrabarty and Pamula Adapted from Paik, Chakrabarty and Pamula

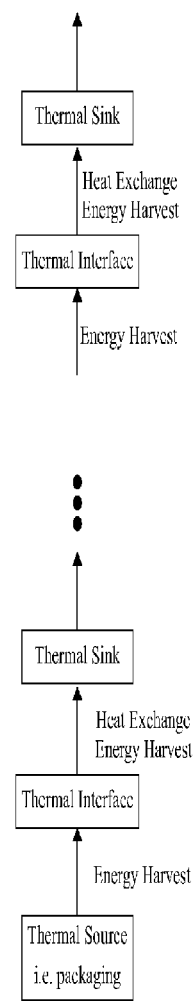
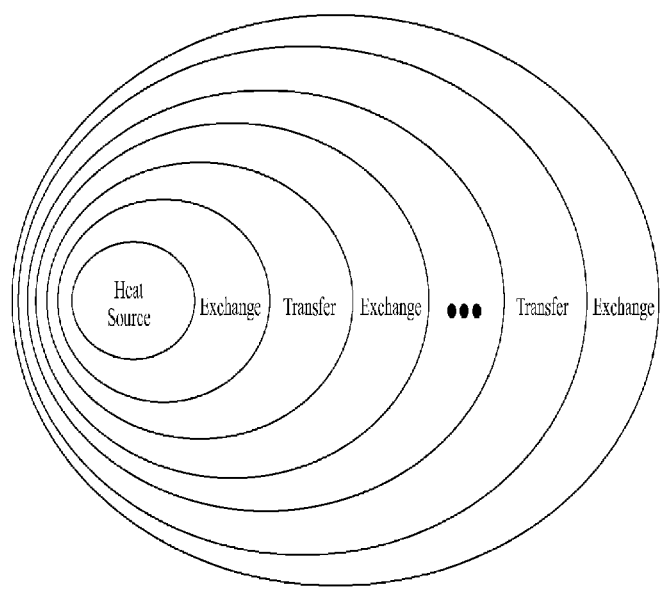
Figure 40
Figure 39

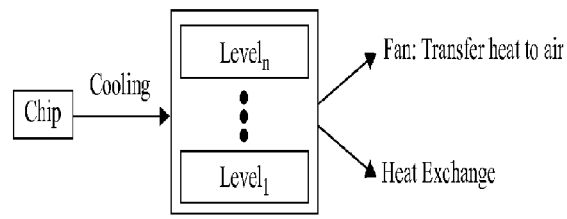
Figure 41a Heat Aggregating Subsystem
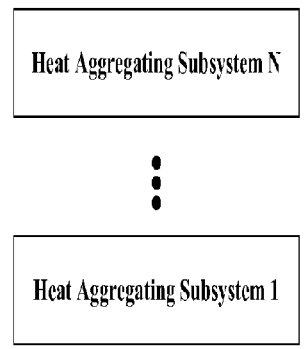
Figure 41b Heat Aggregating System
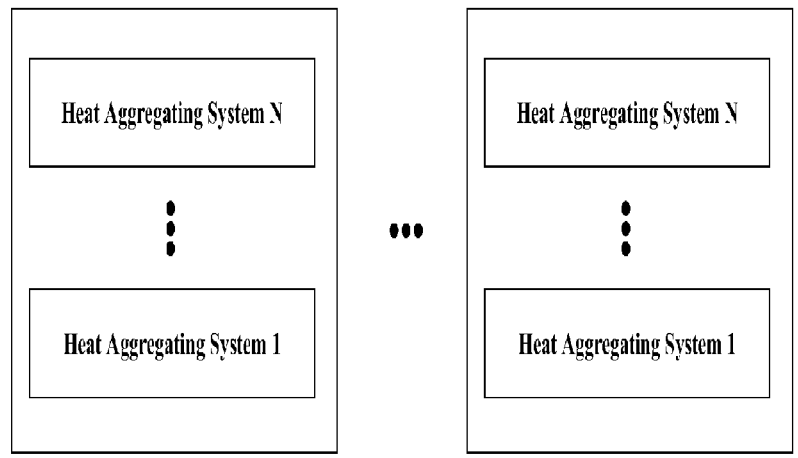
Figure 41c Multiple Heat Aggregating Systems

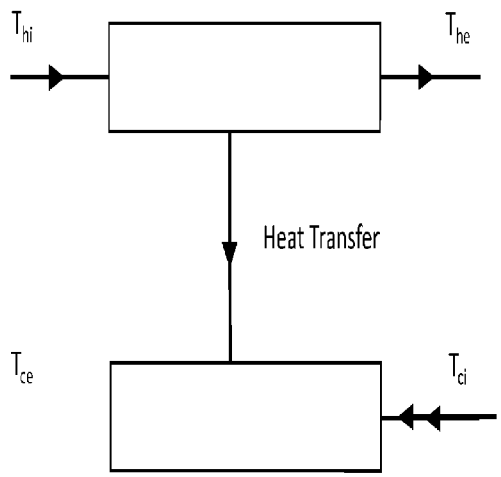
Figure 42a
Adapted from Li
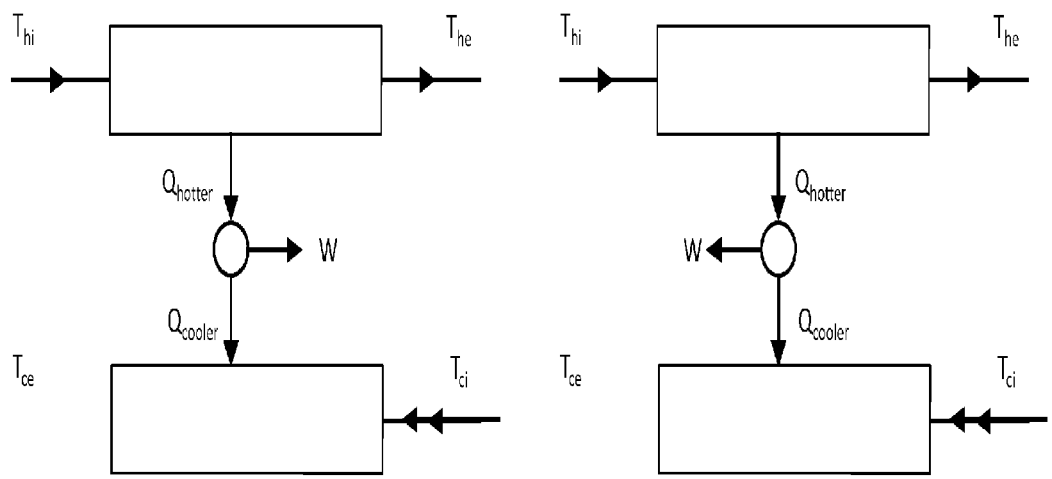
Figure 42b
Adapted from Li
Figure 42c
Adapted from Li Pressure Fit Fastener Contact Mating Arrangement

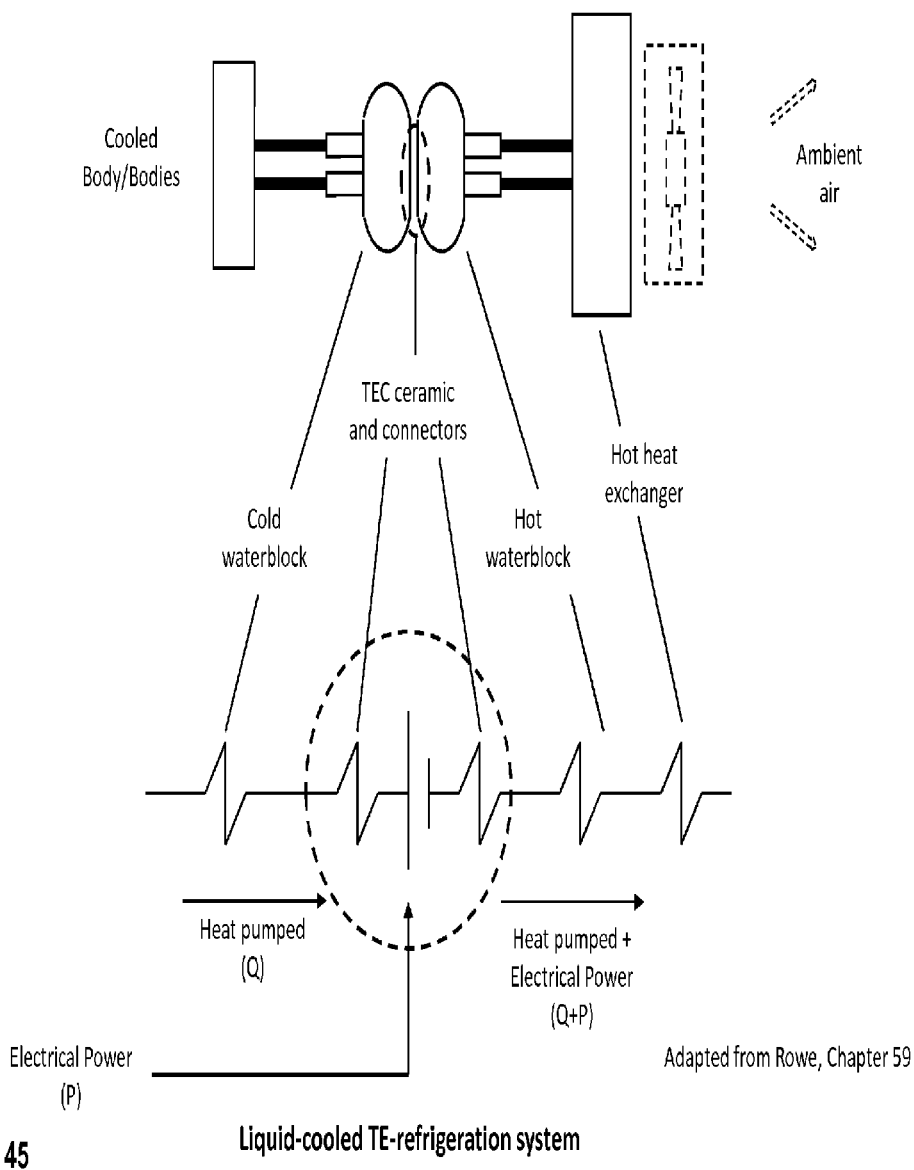
Figure 45 — Liquid-cooled TE-refrigeration system

INCREMENTAL DEPLOYMENT OF STAND-ALONE AND HIERARCHICAL ADAPTIVE COOLING AND ENERGY HARVESTING ARRANGEMENTS FOR INFORMATION TECHNOLOGY

CROSS-REFERENCE TO RELATED APPLICATIONS

Pursuant to 35 U.S.C. § 120, this application claims benefit of priority from U.S. patent application Ser. No. 13/674,945, filed Nov. 13, 2012, which in turn claims benefit of priority from U.S. patent application Ser. No. 13/385,411, filed Feb. 16, 2012, which in turn claims benefit of priority from Provisional U.S. Patent application Ser. No. 61/443, 701, filed Feb. 16, 2011, the contents of which are incorporated by reference.

COPYRIGHT & TRADEMARK NOTICES

A portion of the disclosure of this patent document may contain material, which is subject to copyright protection. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

BACKGROUND OF THE INVENTION

In the normal course of operation, the electronic Integrated Circuit ("IC") chips that are comprised by computer hardware generate heat. In CMOS and related technologies, the heat generation is a function of the rate of state transitions per unit time, so as software tasks are handled there are frequent, rapid increases and decreases of emitted heat from a given chip as computers operate. Additionally, as heat builds up in CMOS and other semiconductor devices, leakage currents typically increase, creating yet more heat.
Data Centers The amount of heat generated is considerable even when only one computer is involved. In the case of server farms and other data centers the heat generation problem assumes vast proportions. Most of the heat in data centers is removed by costly and relatively inefficient means that also consumes yet more energy and generates yet more heat. Unlike many industrial processes where waste heat is harnessed for site-based energy reuse of power-cogeneration, most of the heat in data centers is simply dissipated into the environment.

Providing a cost-effective, efficient and practical solution to this IC-chip and electronic component generated heat is therefore crucial. As cloud computing, search, download, and other network services radically increase centralized computing demands, creating needs for computation and data centers to becoming larger and larger, the need for massive facilities increases, causing the magnitude of the heat generation problem to become increasingly urgent.

The increasing demand and trend to ever-larger and more robust computer data centers necessitates that the industry practice of utilizing cheap, passive traditional thermal design be replaced with more advanced thermal technologies.
Leveraging Data-Center Turn-Over to Rapidly Introduce Cooling and Energy Harvesting Technologies into Data Centers Fortuitously, new inventions (such as the present invention) that address these problems all or in part can conveniently take reliance upon Moore's Law (which observes that approximately every 18 months computer power doubles while the cost roughly halves) and ongoing changes in computer server architecture. The resulting combined forces of natural degradation and functional obsolescence force computer hardware (data center hardware in particular) to naturally be replaced or upgraded on a periodic basis. As each hardware replacement cycle brings in new computer hardware, this allows new cooling technologies to be introduced.
Approaches to Reduce Heat Production in Integrated Circuit Operation A large number and wide variety of approaches are currently under research, development, and deployment to reduce heat production in integrated circuit operation. A brief survey of these very active areas can be found in [1], Chapter 1, and the material there is summarized in the list below:
 Dynamic Power Consumption
 Reducing Capacitance
 Reducing Switching Activity
 Reducing Clock Frequency
 Reducing Supply Voltage
 Static Power Consumption
 Leakage currents arise from the flow current across a transistor even when the transistor is in an OFF state.
 Gate-oxide leakage is dependent on the thickness of the oxide that is used to insulate the gate from the substrate. As process technologies are decreasing, so is the gate-oxide thickness. Higher k dielectrics will have to be used to offset sub-threshold leakage. Flow of current between the drain and source of a transistor when the voltage is below threshold.
 Circuit-Level Power Consumption in Integrated Circuits
 Transistor Reordering
 Half-Frequency and Half-Swing Clocks
 Low-Power Flip-Flop Design
 Technology mapping automates the process of producing a power-optimized circuit in order to minimize the total power consumption.
 Bus Inversion
 Crosstalk Reduction
 Low-Swing Buses
 Segment the bus into multiple groups that allow the majority of the buses to be powered down while only the active buses are in use.
 Adiabatic circuits are a novel concept that reuses the electrical charge dissipated from one wire and recycles it for use in another wire
 replace the traditional shared-bus approach with a more generic interconnect network.
 Low-Power Memory Design
 Partitioning Memory
 Specialized Power-Friendly Caches
  Filter cache
  Trace cache
  Adaptive caches
  Drowsy cache The present invention is not directed in these directions, but rather as to what to be done with the electronic-component heat that must be generated, regardless of its source or cause, The present invention addresses this on several fronts:
 Improved heat transport, aggregation, management;
 Component thermal environment improvement;

Consideration of the full heat transport hierarchy;

Adaptive opportunistic energy harvesting;

Leveraging reciprocal (heat transfer, heat to electrical current conversion) properties of both classical semi-conducting thermoelectric devices and quantum-process thermoelectric devices;

Adaptively switching modes and/or multiplexing between cooling mode, energy-harvesting mode, and temperature sensing modes;

In switching among modes and in general operation, including consideration of and/or compensation for the dynamic behavior of the thermoelectric devices employed;

Various control systems to manage local and system-wide operation. Computer System Cooling Technologies A large number and wide variety of approaches are currently under research, development, and deployment to reduce, manage, and handle heat build-up in integrated computer systems and data centers. A survey of the many well-known classical and contemporary techniques for this these at the board and chassis level can be found in [2] and the references therein. A representative treatment of the many well-known and contemporary techniques for this these at the data center level can be found in [3]-[4], these largely involving forced air and chiller technologies. The present invention provides economical practical near-term supplements, enhancements, and alternatives to these approaches, including for example the invention innovations listed in the previous subsection and called out in bold font in FIG. 3.

Chip Cooling Technologies

A large number and wide variety of approaches are currently under research, development, and deployment employing thermoelectric devices. A survey of the many well-known classical and contemporary techniques for these employing semiconducting thermoelectric devices can be found in [5] and the references therein. A brief treatment of techniques and properties of quantum-well thermoelectric devices can be found in [6] and the references therein. Treatment of techniques and properties of Avto metal thermoelectric devices can be found in [7]-[10] and the references therein. Additionally, micro-droplet microfluidic cooling is also currently under research and development, some employing some minor interworking with thermoelectric devices. Treatment of such approaches employing planar (two-dimensional) micro-droplet transport can be found in [1] and the references therein, and approaches employing three-dimensional and multiple-layer micro-droplet transport are taught in U.S. Patent Application 61/599,643.

As background, FIG. 1a depicts an exemplary computer processor chip fitted with a traditional air-cooled finned heat sink. In practice the depicted cooling fins can be much larger than depicted here. One or more fan(s), each within or attached to a chassis which envelopes an associated computer processor chip, are used to force incoming air through and/or over the heat sink. The forced air absorbs heat radiating from the fins of the heat sink, transporting it away from the chip and thus preventing a higher degree of heat buildup. FIG. 1b shows an arrangement like that of FIG. 1a but fitted with a dedicated fan to increase the air flow through the air-cooled finned heat sink. FIG. 1c shows an arrangement like that of FIG. 1b but with a thermoelectric cooler layer provided to increase the heat flow from the Integrated Circuit chip to the air-cooled finned heat sink. FIG. 1d shows an arrangement like that of FIG. 1c but with a dedicated fan to increase the air flow through the air-cooled finned heat sink.

FIGS. 1e-1g depicts various alternative chip cooling arrangements wherein heat pipes are used to transport heat away from a computer processor chip. FIG. 1e depicts an exemplary heat pipe system employed in a laptop computer. FIG. 1f depicts an exemplary heat pipe system wherein the heat pipe connects transferred heat produced at the chip to a fan-cooled heat-sink. FIG. 1g depicts an exemplary arrangement heat pipe system wherein a principal heat sink is connected via heat pipes with expansion heat sinks.

Hierarchy of Heat Transfer in Data Center Environments

As yet further background, FIGS. 2a-2g illustrate a hierarchy of environments involved in heat transfer.

FIG. 2a shows a group of computer chips and related components (for example, voltage regulator components), for example, on a common printed circuit board. These are the primary source of heat generation, although heat is also generated by other elements such as power supply transformers and circuitry, fans, compressors, chillers, pumps, etc. included in cooling systems.

FIG. 2b depicts the two or more such groups of computer chips and related components, for example, sharing a common printed circuit board.

FIG. 2c illustrates two or more printed circuit boards, either as in FIG. 2a or FIG. 2b, which together are comprised by a common subsystem. FIG. 2d illustrates two or more subsystems, such as depicted in FIG. 2a or otherwise, which together are comprised in a common chassis. Such a chassis can be part of, for example, a computer server.

FIG. 2e shows a plurality of chassis comprised by a cage. Such arrangements are used in commercial "blade server" product configurations.

FIG. 2f depicts a plurality of cages, such as depicted in FIG. 2e or otherwise, fitted into a rack. Such rack configurations are used endemically in data centers. FIG. 2g represents a cluster of racks as commonly used in data centers.

Overview of the Innovation

The invention comprises a collection of interworking innovations. These include:

Systems and methods for combining Peltier-effect heat transport and Seebeck-effect energy harvesting for use at thermal interfaces in heat gathering and transfer structures;

Novel structures for multiple-mode thermoelectric devices providing heat transfer, heat-to-electricity conversion, temperature flux measurements for use in interfacing integrated circuit packages and in creating active heat pipes;

Arrangements in the above permitting simultaneous mixed-mode operation

Automatic control for optimizing multiple mode and mixed-mode operation in local or hierarchical contexts;

Pulse-width modulation and other duty-cycle control to prevent Peltier cooling induced condensation;

Use of traditional, contemporary, and emerging quantum-process and nanomaterial techniques for radical efficiency improvements in Peltier-effect heat transport and Seebeck-effect thermoelectric energy harvesting;

Configurable, reconfigurable, or real-time-controlled selective operation of combined Peltier-effect heat transport and Seebeck-effect thermoelectric energy harvesting;

Systems and methods for a modular-structure heat gathering and heat transfer infrastructure designed, for example, to work with existing familiar board, blade, cage, rack, data center, and building infrastructure, the systems and methods supporting optional advantageous additional features of:

Closed heat transport systems within each module terminating in a thermal interface which can be coupled to external heat transport stage, air cooling, energy transformation, or other alternatives;

Each module equally usable in isolation or as part of a hierarchy, allowing wide range of gradual phase-in deployments, trials, and strategies;

Internal energy harvesting within the module;

Hierarchical heat-gathering structures with dry thermal-transfer interfaces between pairs of closed level-internal cooling fluid and heat pipe structures within modules at each layer and fan backup for isolated operation or parent-level failure recovery;

Hierarchical heat-to-electricity energy harvesting structures with provisions for both local use of heat-harvested electricity as well as provisions for exporting power into hierarchical or peer arrangements;

Hierarchical control structures capability of working in isolation or coordinating with other control systems in hierarchical or peer arrangements.

FIG. 2h depicts a representation implying the innovation can be utilized when a data center occupies one or more whole or partial floors of a building and/or a vertical riser within a building. FIG. 2i depicts a representation implying the innovation can be applied when a data center occupies an entire building. FIG. 2j depicts a representation implying the innovation can be utilized when a data center is comprised of a campus of buildings.

FIG. 3 depicts an exemplary non-limiting, non-characterizing view of various aspects of the invention. The invention combines many new innovations (denoted by bolded font) together with novel utilizations and adaptations of known art (denoted by unbolded font).

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Aspects of the Invention Involving Heat Gathering at IC-Chip and Board Level

In an embodiment, the invention provides for the use of microfluidic micro-droplet heat transport at the IC-chip package level.

In an embodiment, the invention provides for the use of microfluidic micro-droplet heat transport at the multilayer Printed Circuit Board ("PCB") level.

In an embodiment, the invention provides for the collection of heat from at least one integrated circuit package.

In an embodiment, the invention provides for the collection of heat from at least a plurality of computer systems comprised by a data center.

In an embodiment, a thermal interface to at least one chip is used to collect heat and direct it to a heat sink in thermal contact with a circulating cooling fluid.

In an embodiment, the circulating cooling fluid possesses a high heat-carrying capacity.

In an embodiment, the invention provides for thermal interfaces with a circulating cooling fluid to be designed to easily connect mechanically with an associated chip.

In an embodiment, the invention provides for the thermal interface to be designed to direct heat to a fan where air convection can be utilized to remove the heat.

In an embodiment, the invention provides for the thermal interface to be designed to feed the heat into a heat transfer interface that utilizes a circulating coolant to remove the heat, or to both.

In an embodiment, the invention provides for one or both sides of the thermal interface to be constructed of thermoelectric materials to most efficiently collect the heat on one side and to most efficiently utilize the cooling fan or fluid on the other side.

In an embodiment, the invention provides for one portion of the chip-generated heat to be spatially transferred and another portion of the heat to be energy harvested.

In an embodiment, the invention provides pulse-width modulation and other duty-cycle control to prevent Peltier cooling induced condensation and icing.

In an embodiment, the invention provides for the use of high-efficiency thermoelectric devices comprising quantum-well materials.

In an embodiment, the invention provides for the use of high-efficiency thermoelectric devices comprising Avto Metals.

Aspects of the Invention Involving Energy Harvesting

In an embodiment, the invention provides for concerted effort to convert as much heat to electricity at the local chip level as possible.

In an embodiment, the invention provides for the placement of thermoelectric material inside, on top of, on the bottom of or around a chip package.

In an embodiment, the invention provides for repeated hierarchical steps of heat transfer from thermal sources, conducted through a heat exchange or other thermal interface, and transferred to a thermal sink.

In an embodiment, the hierarchy can comprise use of the heat gathered at a thermal sink at one hierarchy level to serve as the heat of the heat source in an adjacent level in the hierarchy.

In an embodiment, at any one or more places in the hierarchy, energy harvesting operations can be introduced.

In an embodiment, energy harvesting operations convert heat into electricity.

In an embodiment, electricity created by energy harvesting operations is used to provide power for current or future heat transfer operations.

In an embodiment, an energy harvesting operation improves the efficiency of the inventive cooling system.

In an embodiment, each energy harvesting operations improve the effectiveness of the inventive cooling system.

Aspects of the Invention Involving Combining Energy Harvesting and Heat Transport In an embodiment, the invention provides for the use of reciprocal thermoelectric devices capable of operating in either a thermoelectric cooler or a thermoelectric electric current generator as determined by imposed thermal conditions and electrical connections to the reciprocal thermoelectric device.

In an embodiment, the invention provides for at least one of the thermoelectric devices can serve as a temperature sensor In an embodiment, the invention provides for the mode of a given thermoelectric device is switched over time. As one example, a given thermoelectric device can be a thermoelectric cooler one moment and a temperature sensor at another moment. As another example, a given thermoelectric device can be a thermoelectric electric current generator one moment and a temperature sensor at another moment. As yet another example, a given thermoelectric device can be a thermoelectric cooler one moment and a thermoelectric electric current generator at another moment. As still another example, a given thermoelectric device can be a thermoelectric cooler one moment, a temperature sensor at another moment, and a thermoelectric electric current generator at yet another moment.

In an embodiment, the invention provides for a control system that selects the mode of operation of at least one reciprocal thermoelectric device, the selection made responsive to the state of the system, time, a measurement condition, or some combination of these.

In an embodiment, the invention provides for a control system to include consideration of the dynamic behavior of at least one type of thermoelectric device.

In an embodiment, the invention provides for a control system to include compensation for the dynamic behavior of at least one type of thermoelectric device.

In an embodiment, the invention provides for a control system that selects the mode of operation of at least one reciprocal thermoelectric device to include consideration of and/or compensation for the dynamic behavior of the reciprocal thermoelectric device.

Aspects of the Invention Involving Heat Migration out of a Subsystem

In an embodiment, the invention comprises one or more heat-aggregating system and/or one or more heat-aggregating subsystems.

In an embodiment, the invention provides for heat that cannot be efficiently or effectively harvested for energy to be dispersed via fan(s) at one or more suitable location(s) within the system.

Aspects of the Invention Involving Modular Hierarchical Structure

In an embodiment, the invention provides for a modular product hierarchy that can be designed to meet market need and demand.

In an embodiment, the invention provides for heat that cannot be efficiently or effectively harvested for energy to be dispersed via fan(s) at one or more suitable location(s) within the system.

In an embodiment, the invention comprises one or more heat-aggregating system and/or one or more heat-aggregating subsystems.

In an embodiment, the invention comprises a daisy-chain heat transfer arrangement employing closed systems of circulating fluids with dry thermal interfaces among them for use in a hierarchical or peer arrangement.

Aspects of the Invention Involving Interconnection of Heat Transfer Subsystems within a Cooling Hierarchy In an embodiment, the invention provides for the collection of heat from at least a number of computer chips forming a computing system.

In an embodiment, each module (board, chassis, cage, rack, rack cluster, etc.), comprises at least two separate closed circulating fluid cooling systems that are thermally linked by thermal-transfer coupling elements.

In an embodiment, thermal-transfer coupling elements comprise pressure-contact.

In an embodiment, thermal-transfer coupling elements comprise fastener arrangements.

In an embodiment, thermal-transfer coupling elements comprise a threaded structure.

In an embodiment, thermal-transfer coupling elements comprise a quick-lock structure.

Aspects of the Invention Involving Product Evolution and Phased Deployment

In an embodiment, the invention provides for a modular product hierarchy that can be designed to meet market need and demand.

In an embodiment, the invention provides for phased replacement as required due to the end of operating life, adequate degradation, or functional obsolescence.

In an embodiment, until such replacement or upgrade is enacted, the invention provides for incremental implementation via incremental retrofit of computers, chip(s) within individual computers, cages, racks, etc.

In an embodiment, modular features used to implement scalability of the innovation can be implemented in such a way that each modular level can operate in a stand-alone mode, for example, relying on backup fans to expel excess heat. This can also provide a failsafe backup for heat dispersion should some part of a hierarchical deployment fail.

In an implementation or a deployment, aspects of the invention can be deployed or implemented at any one or more levels as determined appropriate in a given situation or management decision.

Aspects of the Invention Involving Hierarchical Control Structures

In a further aspect of the invention, the invention provides a hierarchical multiple-level control system comprises a plurality of subsystems, each with their own associated control system, each of which (1) can operate in isolation and (2) can be interconnected or networked with additional subsystems associated with other hierarchical levels.

In a further aspect of the invention, a hierarchical multiple-level control system comprises a plurality of subsystems, each with their own control system, that can operate in isolation, but when interconnected or networked with additional subsystems associated with other hierarchical levels, each subsystem will assume their respective role in the hierarchy with respect to (those) additional subsystems.

In an embodiment, the invention provides for hierarchical multiple-level control system to include linear control systems, therein permitting the additive control of at least one controller state variables of one subsystem by control signals generated by or associated with at least one other subsystem.

In an embodiment, the invention provides for hierarchical multiple-level control system to include bilinear control systems, therein permitting the multiplicative control of at least one controller state variables of one subsystem by control signals generated by or associated with at least one other subsystem.

In an embodiment, the invention provides for hierarchical multiple-level control system to include bilinear control systems, therein permitting both (1) additive control of at least one controller state variables of one subsystem by control signals generated by or associated with at least one other subsystem and (2) multiplicative control of at least one controller state variables of one subsystem by control signals generated by or associated with at least one other subsystem.

In an embodiment, the invention provides for hierarchical multiple-level control system to include synthetic hysteresis.

BRIEF DESCRIPTION OF THE DRAWINGS

The above and other aspects, features and advantages of the present invention will become more apparent upon consideration of the following description of preferred embodiments taken in conjunction with the accompanying drawing figures.

FIG. 2e shows a plurality of chassis comprised by a cage.

FIG. 2f depicts a plurality of cages, such as depicted in FIG. 2e or otherwise, fitted into a rack.

FIG. 2g represents a cluster of racks as commonly used in data centers.

FIG. 2h depicts a representation implying the innovation can be utilized when a data center occupies one or more whole or partial floors of a building and/or a vertical riser within a building.

FIG. 2i depicts a representation implying the innovation can be applied when a data center occupies an entire building.

FIG. 2j depicts a representation implying the innovation can be utilized when a data center is comprised of a campus of buildings.

FIG. 5a depicts an exemplary thermal integration and transfer abstraction.

FIG. 5b depicts an exemplary thermal resistive abstraction.

FIG. 5c depicts an exemplary thermal resistive series.

FIG. 5d depicts an exemplary thermal diode abstraction.

FIG. 7c depicts an electrical symbol that will be used for an electrical instance of an arrangement involving an individual junction of dissimilar materials, the arrangement configured to provide one or more thermoelectric functions employing phenomenon such as the Peltier effect, Seebeck effect, or other adapted, related, or alternative thermoelectric effects. An instance of such an arrangement will be termed a "thermoelectric device."

FIG. 7d depicts an electrical series connection of a plurality of thermoelectric devices. (In the literature such an electrical arrangement combined with an associated thermal arrangement is called a "thermopile.")

FIG. 7e depicts a plurality of electrical series connections of a plurality of thermoelectric devices.

FIG. 7f depicts an exemplary physical array of thermoelectric cells such as the example provided in FIGS. 7c-7e.

FIG. 8a depicts an example accounting of various material-based and junction-based electrical resistance aspects inherent in a thermoelectric device.

FIG. 8b depicts a series-resistance aggregation of these various material-based and junction-based electrical resistance aspects inherent in a thermoelectric device into a composite equivalent electrical resistance.

FIG. 8c depicts an abstract electronics representation of the equivalent electrical resistance of a thermoelectric device or thermoelectric cell operating in Peltier mode.

FIG. 8d depicts an abstract electronics representation of voltage emf generated by Seebeck effect in a thermoelectric device or cell and the associated (Thevenin-equivalent) series resistance of the thermoelectric device or thermoelectric cell, the resulting arrangement connected to a load resistance resulting in a current/flowing around the resulting electrical loop.

FIG. 11a depicts a mechanical symbol that will be used for a physical instance.

FIG. 11b depicts an exemplary physical arrangement of thermoelectric devices in a linear side-by-side array.

FIG. 11c depicts an exemplary physical arrangement of thermoelectric devices in a side-by-side matrix array.

FIG. 11d depicts an exemplary physical arrangement of thermoelectric devices in a stacked "sandwich" array.

FIG. 11e depicts an exemplary physical arrangement of thermoelectric devices in a 3D array.

FIG. 28a (adapted from [1]) depicts a "confined system" adaptation of the microfluidic electrowetting micro-droplet planar microelectrode array and micro-droplet transport to implementations using Printed Circuit Boards ("PCBs").

FIG. 28b (adapted from [1]) depicts an "open system" adaptation of the microfluidic electrowetting micro-droplet planar microelectrode array and micro-droplet transport to implementations using Printed Circuit Boards ("PCBs").

FIG. 30 depicts an representation of the "top" or "bottom" view an example array of microelectrodes, each microelectrode rendered as conductor area on a Printed Circuit Board (PCB) and provided with an associated electrically-conducting "trace" for electrically connecting the microelectrode to voltage potential control circuitry, and interspersed between some pairs of electrodes a physical open hole suitable for a micro-droplet to travel through.

FIG. 39 illustrates the concept that an arbitrary number of thermal interface stages can be cascaded and arranged hierarchically so as to remove heat from any number of computer chips or other heat sources, transferring the heat via an associated number of heat exchanges and subject to an arbitrary number of energy harvesting operations. Energy harvesting can occur in heat exchange and/or heat transfer steps as advantageous.

FIG. 40 illustrates the concept that heat from an arbitrary number of computer chips or other heat sources can be transferred through an arbitrary number of heat exchanges and heat transfers as proves advantageous.

FIG. 41a represents a heat-aggregating subsystem wherein heat generated by an integrated circuit chip is transferred via circulating cooling fluid or heat pipes through a plurality of levels of heat handling and aggregation. At one or more of these levels heat can be either converted to electricity, eliminated via a fan, or transferred via a heat exchange for further transfer of the heat for harvest and reuse.

FIG. 41b represents a combination of any number of subsystems to form a heat-aggregating system wherein each component subsystem is comprised as described in FIG. 41a.

FIG. 41c shows multiple heat-aggregating systems wherein any number of subsystems make up each of the heat-aggregating systems and each subsystem is comprised as described in FIG. 41a. Multiple heat-aggregating systems can be formed by combining any number of computer cages, computer racks, rack clusters, data center floors, data center buildings or data center complexes.

FIG. 42a depicts an abstract thermodynamic representation of a passive heat transfer arrangement for the transfer heat from a hotter heat transport system to a cooler heat transport system.

FIG. 42b depicts an abstract thermodynamic representation of a heat transfer arrangement transfer heat from a hotter heat transport system to a cooler heat transport system further comprising a heat engine, generating energy or work. such a system can be used for opportunistic energy harvesting, for example under the careful operation of a control system.

FIG. 42c depicts an abstract thermodynamic representation of a heat transfer arrangement comprising a heat pump, using energy or work to uni-directionally transfer heat from a hotter heat transport system to a cooler heat transport system. Such an arrangement can be used to improve the rate of heat transfer and prevent a "stall" in heat transfer should both depicted heat transport systems operate at roughly the same temperature (for example, in heavy heat situations).

FIG. 45 (adapted from [15]) depicts an arrangement wherein a thermoelectric device is introduced at the thermal interface between two closed loop fluid cooling systems.

FIG. 48 illustrates a hierarchical system for heat gathering compatible with the hierarchical arrangements depicted in FIGS. 2a-2j.

FIG. 49 illustrates a hierarchical system for heat-to-electricity conversion compatible with the hierarchical arrangements depicted in FIGS. 2a2j.

FIG. 50 illustrates a hierarchical control system compatible with the hierarchical arrangements depicted in FIGS. 2a-2j.

FIG. 51 depicts a representation of an example hierarchical multiple-level control system comprising N levels, each level in the hierarchy comprising a single subsystem.

FIG. 52 depicts a representation of an example strictly-layer parent-to-child and child-to-parent communications between pairs of consecutive subsystem levels in the example hierarchy depicted in FIG. 51.

FIG. 53 depicts a representation wherein more general communications between pairs of subsystems in levels in the example hierarchy is provided for. In one extreme, all subsystems can be interconnected in a full-mesh topology.

FIG. 54 depicts a variation on the representation of FIG. 53 wherein additionally only some of the subsystems associated with some of levels in the example hierarchy are present.

FIG. 55 depicts a variation on the representation of FIG. 52 wherein there are a plurality of subsystems associated with each level in the example hierarchy.

FIG. 56 depicts a variation on the representation of FIG. 55 wherein there is at least one subsystem associated with each level in the example hierarchy.

FIG. 57a depicts a representation of an example linear control system accepting outside control and measurement inputs and internal feedback paths.

Figure 57A:
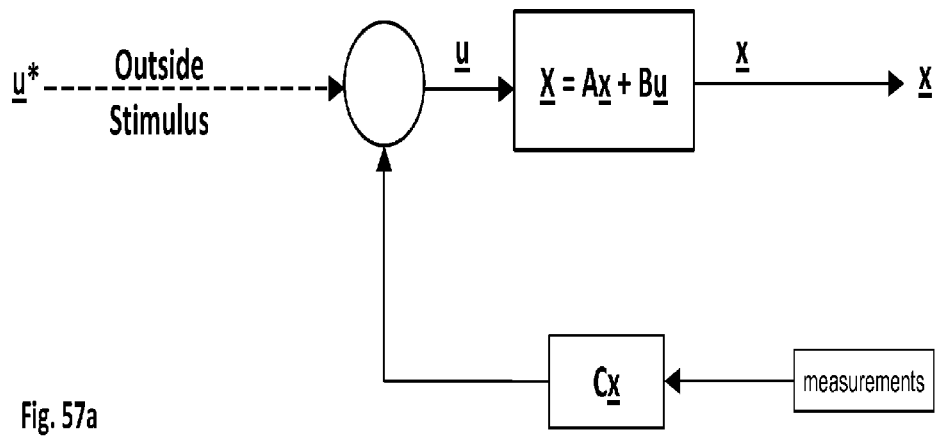
Figure 57B:
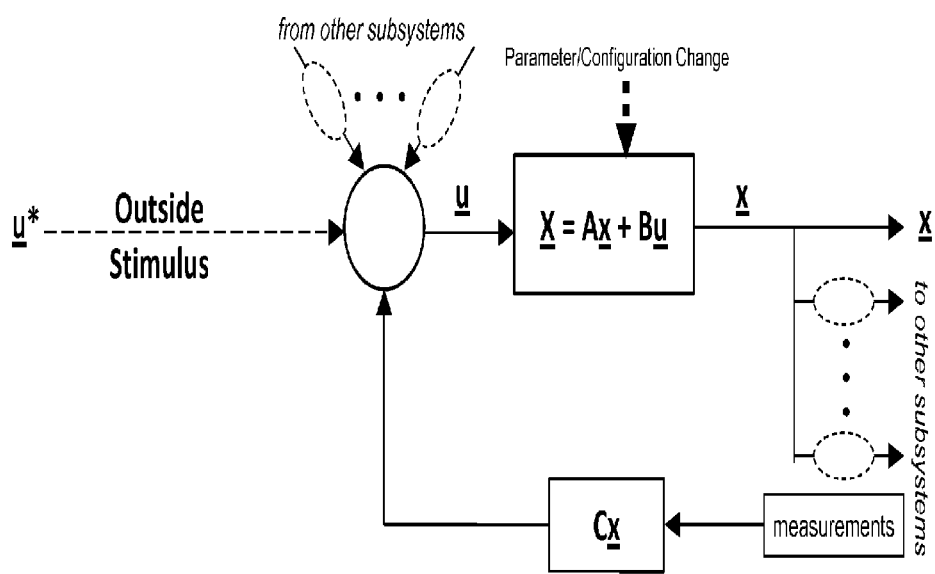

FIG. 57b depicts a representation of an example variation on the arrangement of FIG. 57a wherein additional inputs are provided by other subsystems and additional outputs are provided to other subsystems. Additionally, the representation provides for changes to parameters and/or configuration of the controller responsive to the presence or existence of other subsystems (in other layers of the hierarchy, same layer of the hierarchy, etc.) as advantageous in various implementations and embodiments.

Figure 58A:
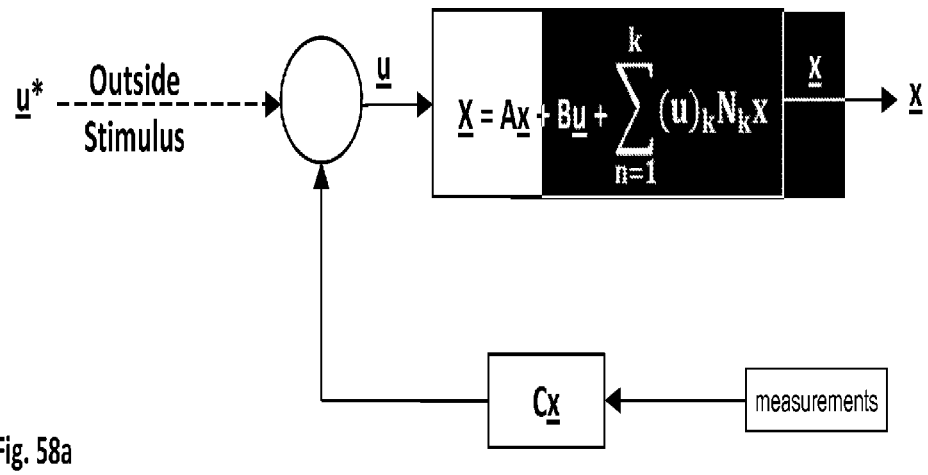

FIG. 58a depicts a representation of an example bilinear control system accepting outside control and measurement inputs and internal feedback paths.

Figure 58B:
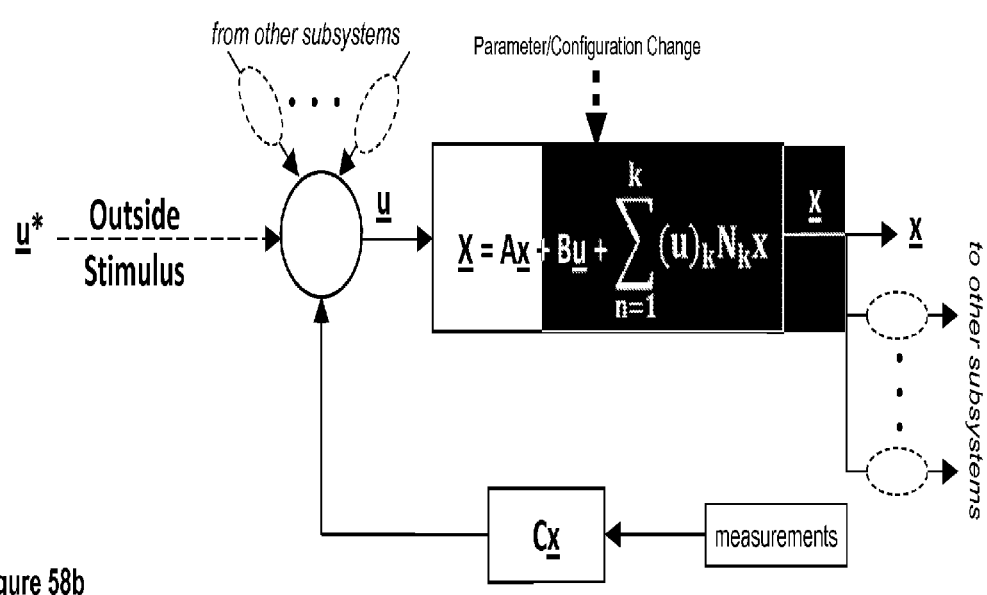

FIG. 58b depicts a representation of an example variation on the arrangement of FIG. 58a wherein additional inputs are provided by other subsystems and additional outputs are provided to other subsystems. Additionally, the representation provides for changes to parameters and/or configuration of the controller responsive to the presence or existence of other subsystems (in other layers of the hierarchy, same layer of the hierarchy, etc.) as advantageous in various implementations and embodiments.

Figure 59A:
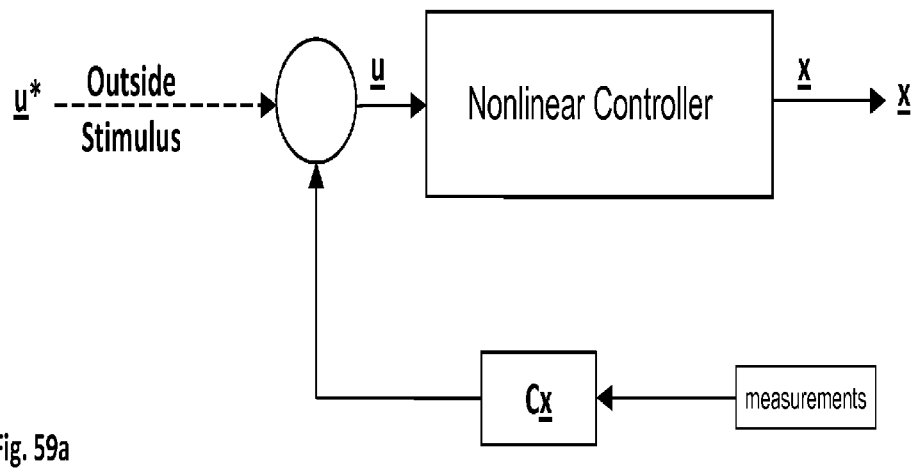

FIG. 59a depicts a representation of an example nonlinear control system accepting outside control and measurement inputs and internal feedback paths.

Figure 59B:
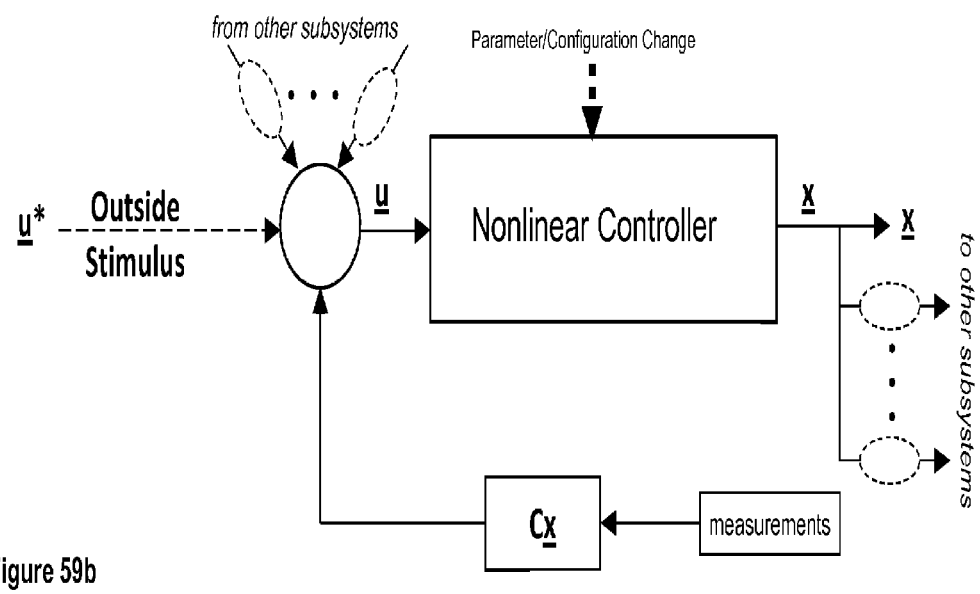

FIG. 59b depicts a representation of an example variation on the arrangement of FIG. 59a wherein additional inputs are provided by other subsystems and additional outputs are provided to other subsystems. Additionally, the representation provides for changes to parameters and/or configuration of the controller responsive to the presence or existence of other subsystems (in other layers of the hierarchy, same layer of the hierarchy, etc.) as advantageous in various implementations and embodiments.

DETAILED DESCRIPTION OF THE PREFERRED EMBODIMENTS

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

1. Heat Transfer Background

Figures 4A, 4B, 4C:
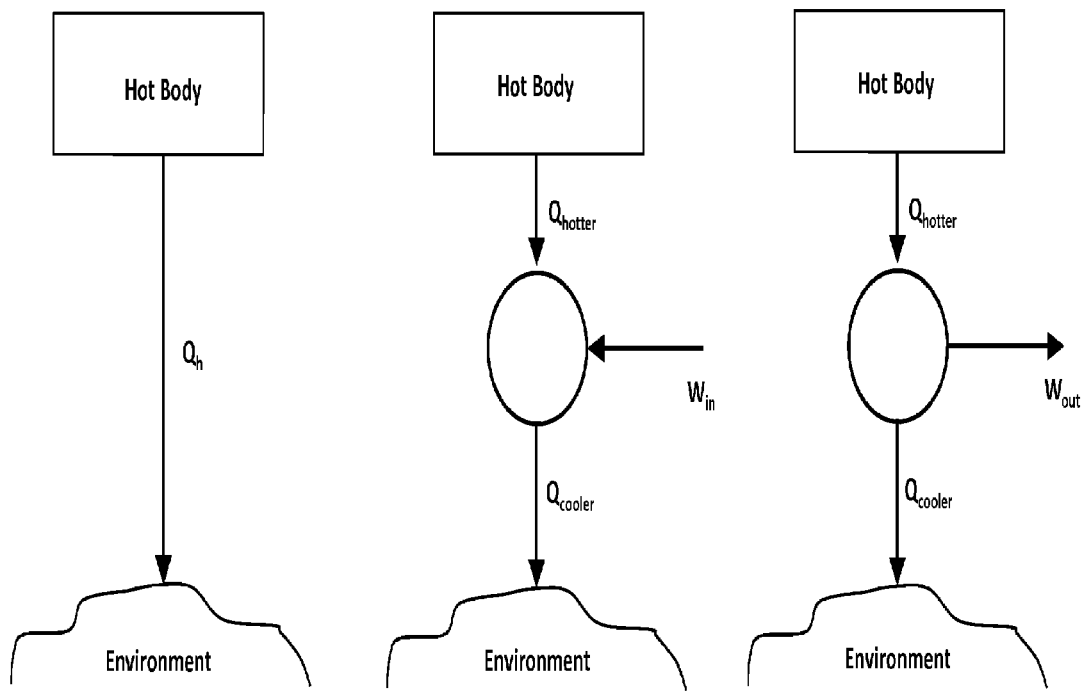
FIG. 4a depicts a general thermodynamics passive heat transfer process from a hot body to a broader environment.
FIG. 4b depicts a heat pump arrangement for active heat transfer process from a hot body to a broader environment. Energy is applied over time to the heat pump (amounting to applied work) and consumed in the heat-pumping process.
FIG. 4c depicts a heat engine arrangement for active heat transfer process from a hot body to a broader environment. Energy is harvested over time by the heat engine (amounting to harvested work) and consumed (at least in part) by external processes.

To begin, a brief thermodynamic framework is established. FIG. 4a depicts a general thermodynamics passive heat transfer process from a hot body to a broader environment. Here excess heat travels (typically according to the Heat Equation) from hot bodies to colder bodies (not depicted in FIG. 4a) or dissipates in the cooler environment (as depicted in FIG. 4a) with no power or energy is used to manage, direct, or control the flow of heat. Heat flows until all bodies in the thermally-connected systems reach the same uniform temperature.

FIG. 4b depicts a heat pump arrangement for active heat transfer process from a hot body to a broader environment. Energy is applied over time to the heat pump (amounting to applied work) and consumed in the heat-pumping process. Thermoelectric cooling (for example employing the Peltier process and analogous processes employing Avto metals and quantum well materials) is an example of such a heat pump arrangement. Additional considerations relating to the energy and work applied to the heat pump (for example Thomson effect, Joule heating, etc.) are not brought forth in this representation.

FIG. 4c depicts a heat engine arrangement for active heat transfer process from a hot body to a broader environment. Energy is harvested over time by the heat engine (amounting to harvested work) and consumed (at least in part) by external processes. Thermoelectric electric current generation (for example employing the Seebeck process and analogous processes employing Avto metals and quantum well materials) is an example of such a heat engine arrangement. Additional considerations relating to the energy and work applied to the heat engine (for example Benedicks effect, Joule heating, etc.) are not brought forth in this representation.

Regarding heat flow, analogies can readily be made with electrical currents and potentials. FIG. 5a depicts an exemplary thermal integration and transfer abstraction employing abstractions and operations familiar to electrical engineering. FIG. 5b depicts an exemplary thermal resistive abstraction familiar to electrical engineering. FIG. 5c depicts an exemplary thermal resistive series familiar to electrical engineering.

FIG. 5d depicts an exemplary thermal diode abstraction familiar to electrical engineering. This function can be realized by a heat pump, for example a thermoelectric cooler 2. Heat Gathering and Transport at the Chip Level The invention provides for and can use one or more of a number of known and a number of new and novel practical ways for heat gathering and transport at the chip level. Several of these are presented in this section. Other variations, adaptations, and additional approaches are provided throughout the rest of the document.

2.1 Traditional Passive Thermal Handling for Integrated Circuits

Figure 6A:
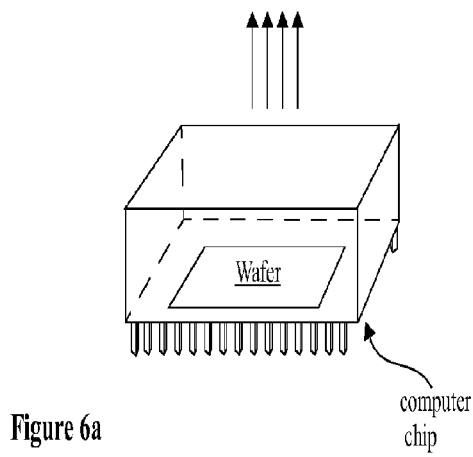
FIG. 6a shows heat generated from a wafer within an exemplary computer chip package directed through a thermal interface provided on top of the chip. Heat is transferred into a heat sink where the heat can be dissipated using a circulating cooling fluid.

FIG. 6a shows heat generated from a wafer within an exemplary computer chip package directed through a thermal interface provided on top of the chip. Heat is transferred into a heat sink where the heat can be dissipated using a circulating cooling fluid.

Figure 6B:
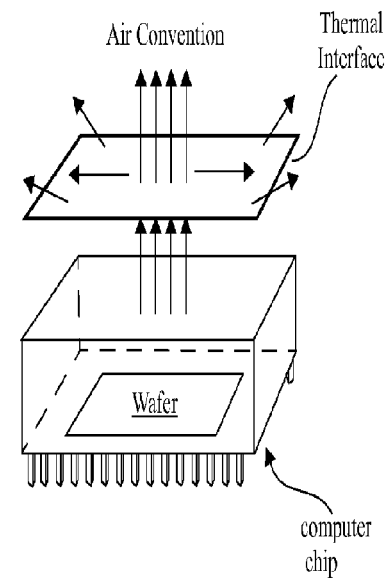
FIG. 6b depicts an alternative situation where the heat generated from a wafer within the computer chip is directed through a thermal interface provided on the top of the chip. Although not explicitly shown, such a thermal interface can be incorporated into the chip packaging by the chip manufacturer.

FIG. 6b depicts an alternative situation where the heat generated from a wafer within the computer chip is directed through a thermal interface provided on the top of the chip. Although not explicitly shown, such a thermal interface can be incorporated into the chip packaging by the chip manufacturer.

Figure 6C:
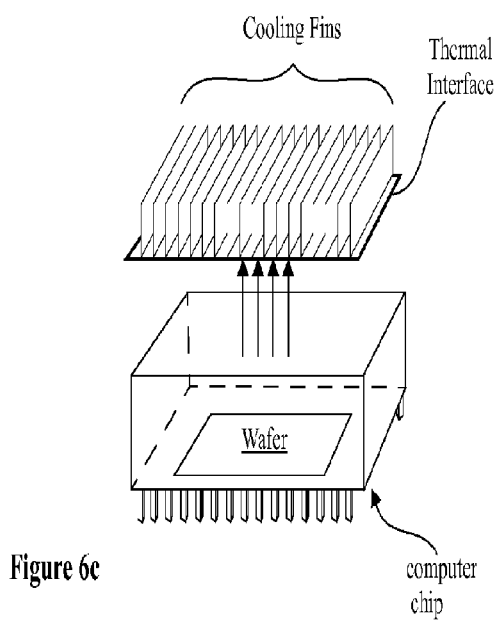
FIG. 6c depicts an exemplary arrangement wherein a computer chip is provided with a thermal interface comprising cooling fins. Although not explicitly shown, such a thermal interface can be incorporated into the chip packaging by the chip manufacturer.

FIG. 6c depicts an exemplary arrangement wherein a computer chip is provided with a thermal interface comprising cooling fins. Heat pulled from the computer chip can be transported and dispersed by an associated cooling fan via air convection. Although not explicitly shown, such a thermal interface can be incorporated into the chip packaging by the chip manufacturer.

Figure 6D:
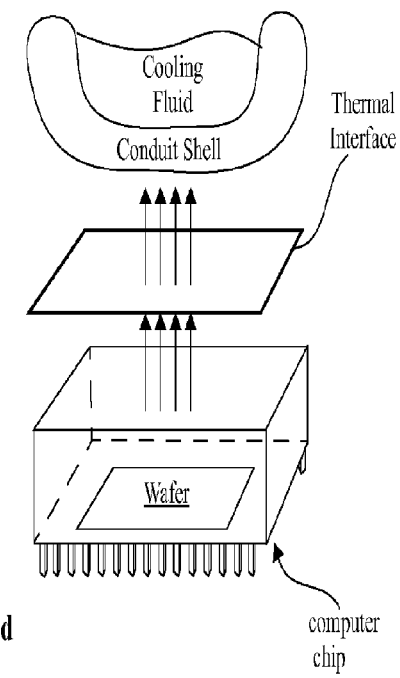
FIG. 6d depicts an exemplary fluidic cooling conduit in thermal contact with a thermal interface. Although not explicitly shown, such a thermal interface can be incorporated into the chip packaging by the chip manufacturer.

FIG. 6d depicts an exemplary fluidic cooling conduit in thermal contact with a thermal interface. Although not explicitly shown, such a thermal interface can be incorporated into the chip packaging by the chip manufacturer.

2.2 Thermoelectric Devices for Cooling and Heat-to-Electricity Conversion

Thermoelectric devices employ many effects, most of which have a long history. The table below, adapted from [17] lays out the four prominent thermoelectric effects and their dates of established recognition.

| Summary Schedule of the Thermo-Electricity (1916) | | |
|---|---|---|
| | Homogenous (1 substance) | Heterogenous (2 substances) |
| Heat Current causes Electric Current . . . | Benedicks (1916) | Seebeck (1821) |
| Electric Current causes Heat Current . . . | Thompson (1856) | Peltier (1834) |

Figure 7A:
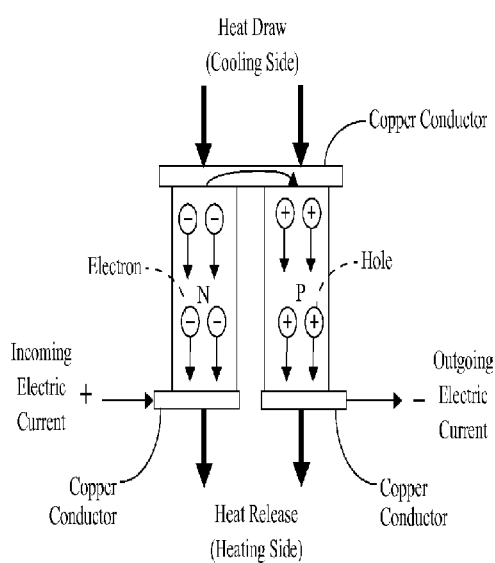
FIG. 7a provides an example depiction of the Peltier effect wherein an electric current is used to create a temperature gradient in an arrangement involving dissimilar materials. In this figure the arrangement is depicted in terms of N-type and P-type semiconductor materials, but the Peltier effect also pertains to (and was originally discovered in the form of) junctions of dissimilar metals.

FIG. 7a provides an example depiction of the Peltier effect wherein an electric current is used to create a temperature gradient in an arrangement involving dissimilar materials. In this figure the arrangement is depicted in terms of N-type and P-type semiconductor materials, but the Peltier effect also pertains to (and was originally discovered in the form of) junctions of dissimilar metals. French physicist Jean Peltier (1785-1845) discovered this effect eight years after German physicist Thomas Seebeck published research findings and analysis on thermoelectric current generation known now as the Seebeck effect (to be discussed shortly). Peltier studied electrical current flowing through pairs of junctions of dissimilar metals and discovered that heat could be transferred in a direction depending upon the direction of electrical current passed through them. Also of note is that heat generated via Joule (a.k.a. ohmic) heating loss (proportional to the product of the square of the magnitude of the electrical current and the electrical resistance of the metal and junction arrangement) from an electrical current was absorbed if the current was reversed. The Peltier heat transfer effect is proportional to the magnitude of the electrical current.

Preceding Peltier's work, German physicist Thomas Johann Seebeck (1770-1831) observed that an electrical current is created through the junction of two dissimilar metals when the junctions of the two metals are at different temperatures, and that the effect increases as the difference between the temperature increases. Seebeck researched this effect over combinations of a selection of elemental metal materials available in the 1820's (such as antimony, bismuth, cadmium, cobalt, copper, gold, iron, lead, manganese, mercury, nickel, palladium, platinum, silver, tellurium, tin, and zinc) and arranged their presence in an ordered series. The series is structured so that thermally-induced electromotive force ("emf") generated increases as the difference between the positions of the metals in the series increases. The direction of current flow at the hotter of the two junctions is from a metal occurring earlier in the series to the metal occurring later in the series. The ordering of the series turns out to be dependent upon the temperature and impurities.

Figure 7B:
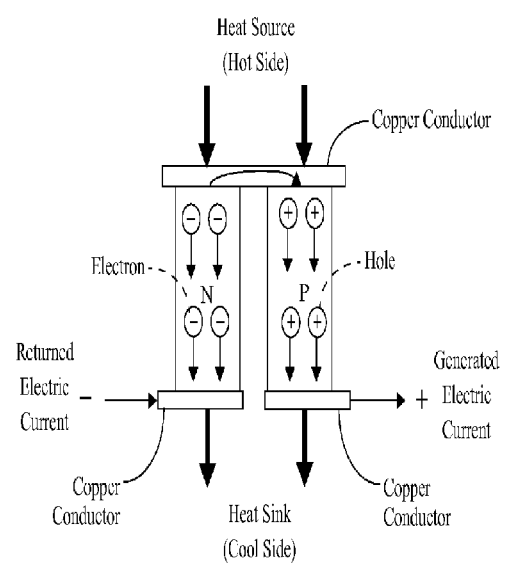
FIG. 7b provides an example depiction of the Seebeck effect wherein a temperature gradient is used to create an electric current in an arrangement involving dissimilar materials. In this figure the arrangement is depicted in terms of N-type and P-type semiconductor materials, but the Seebeck effect also pertains to (and was originally discovered in the form of) junctions of dissimilar metals.

FIG. 7b provides an example depiction of the Seebeck effect wherein a temperature gradient is used to create an electric current in an arrangement involving dissimilar materials. In this figure the arrangement is depicted in terms of N-type and P-type semiconductor materials, but the Seebeck effect also pertains to (and was originally discovered in the form of) junctions of dissimilar metals.

FIG. 7c depicts an electrical symbol that will be used for an electrical instance of an arrangement involving an individual junction of dissimilar materials, the arrangement configured to provide one or more thermoelectric functions employing phenomenon such as the Peltier effect, Seebeck effect, or other adapted, related, or alternative thermoelectric effects. An instance of such an arrangement will be termed a "thermoelectric device." The junction-side thermal interface is denoted with the thick bar, and the electrical terminals and associated thermal interface are denoted by the thinner pair of lines. Thermal conduction occurs through the long open-rectangle bars. A voltage appears or is applied across the electrical terminals (the terminals denoted as in this diagram by the circle-symbols labeled "A" and "B"). A current will flow between the electrical terminals if an electrical load is connected to the electrical terminals.

FIG. 7d depicts an electrical series connection of a plurality of thermoelectric devices. A voltage appears or is applied across the electrical terminals (the terminals denoted as in this diagram by the circle-symbols labeled "A" and "B"). A current flows between the electrical terminals if an electrical load is connected to the electrical terminals. (In the literature such an electrical arrangement combined with an associated thermal arrangement is called a "thermopile.")

FIG. 7e depicts a plurality of electrical series connections of a plurality of thermoelectric devices. The invention provides for individual thermoelectric devices to be physically arranged in a wide range of ways including in a linear side-by-side array, a side-by-side matrix array, a stacked "sandwich" array, a 3D array, etc.

FIG. 7f depicts an exemplary physical array of thermoelectric cells such as the example provided in FIGS. 7c-7e. The invention provides for each cell to comprise any of an individual thermoelectric device, a linear side-by-side array of thermoelectric devices, a side-by-side sub-matrix array of thermoelectric devices, a stacked "sandwich" array of thermoelectric devices, a 3D array of thermoelectric devices, etc.

The cells in the exemplary physical array of thermoelectric cells such as the example provided in FIGS. 7c-7e can in turn be electrically connected to separate circuits, electrically connected in series, electrically connected in parallel, or electrically connected in other topological arrangements. As described later, the invention provides for thermoelectric cells to be connected with one or more switching transistors.

Such electrical, electrical interconnection, and matrix-layout arrangements of individual thermoelectric devices such as those depicted in FIGS. 7c-7f have been used in various commercial thermoelectric device products.

FIG. 8a depicts an example accounting of various material-based and junction-based electrical resistance aspects inherent in a thermoelectric device.

FIG. 8b depicts a series-resistance aggregation of these various material-based and junction-based electrical resistance aspects inherent in a thermoelectric device into a composite equivalent electrical resistance.

FIG. 8c depicts an abstract electronics representation of the equivalent electrical resistance of a thermoelectric device or thermoelectric cell operating in Peltier mode.

FIG. 8d depicts an abstract electronics representation of voltage electromotive force "emf" generated by Seebeck effect in a thermoelectric device or cell and the associated (Thevenin-equivalent) series resistance of the thermoelectric device or thermoelectric cell, the resulting arrangement connected to a load resistance resulting in a current I flowing around the resulting electrical loop.

2.3 Optimizing Performance of Traditional Thermoelectric Devices

Many books have been written relating to optimizing performance of traditional thermoelectric devices, for example [6], [13]-[18].

Figure 9A:
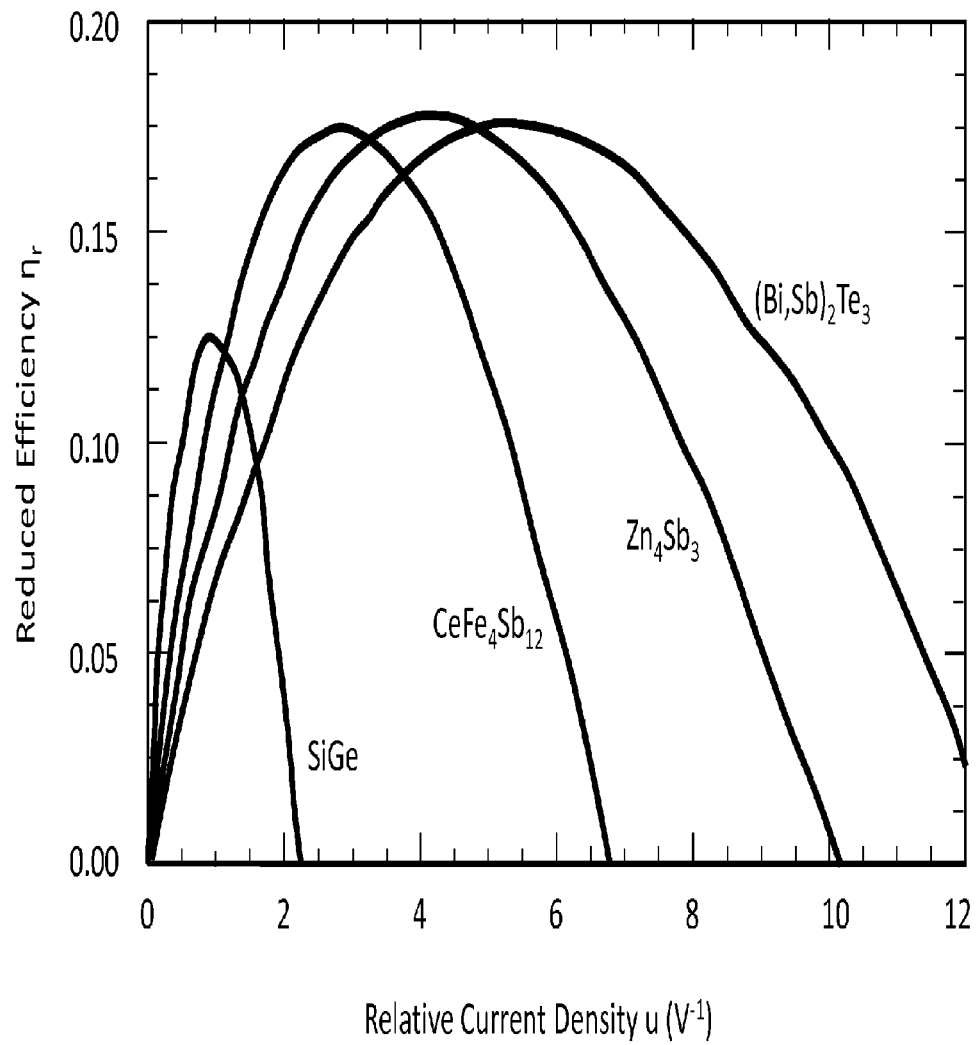
FIG. 9a (adapted from http://knol.google.com/k/andreszykier/thermo-electric-energy/3sqds0076vqoz/2#) depicts a graphical representation of the relationship between reduced current efficiency and relative current density for several example materials applicable for use as one of the dissimilar materials in a thermoelectric device.

FIG. 9a, adapted from http://knol.google.com/k/andre-szykier/thermo-electric-energy/3sqds0076vqoz/2#, depicts a graphical representation of the relationship between reduced current efficiency and relative current density for several example materials applicable for use as one of the dissimilar materials in a thermoelectric device.

Current-Voltage-Power characteristics of a thermoelectric process can be viewed in terms of a voltage drop varying linearly with respect to electrical current due to the internal resistance of the thermoelectric material discussed in conjunction with FIGS. 8a-8d. FIG. 9b, adapted from http://knol.google.com/k/andre-szykier/thermo-electric-energy/3sqds0076vqoz/2#, depicts a constant-temperature linear current-versus-voltage ("Ohms Law") and quadratic power-versus-current ("Joule's Law") curves for an exemplary Bi2Te3 thermopile. At zero current through the thermoelectric device (no load on the terminals), the produced voltage is maximized as there is no ohmic loss. However, since power is the multiplicative product of current and voltage, no power is produced in a zero current situation. At high current values, the voltage drops to zero or below and the power produced again is zero (and in fact can be negative, signifying the consuming of power rather than producing power). For some value of current between these extremes, the produced power will be maximized.

Attention is now returned to further details of the Peltier effect. The heat transfer process though the materials configured to produce the Peltier effect (proportional to the current squared) always works in opposition to Joule heating (proportional to the current squared) caused by the electrical resistance of the arrangement of configured materials. This causes reduced efficiency.

To understand reduced efficiency further, it is noted that the Peltier effect is a surface effect occurring at the junction between two materials. The electrical resistance, which is the source of the heat generation, involves several processes: these include a volume-related component (involving the electrical conductivity, cross-sectional surface area, and length of an article of material through which current flows), a surface-area component and inter-materials component involving the junction of the dissimilar materials, etc. A design approach involves the relative current density u defined as the ratio of the electric current density to the heat flux from thermal conduction.

Returning attention now to the Seebeck effect, one method to improve efficiency involves segmented together materials. These techniques leverage the fact that thermoelectric properties (Seebeck coefficient, electrical resistivity, thermal conductivity, etc.) of materials vary with temperature. From that viewpoint, it is undesirable (and in some situations not possible) to employ a single material spanning a large temperature gradient. In principle, segments of "thermoelectrically compatible" but somewhat different materials can be joined so that a material performing with high-efficiency at high temperatures is segmented with a material performing with high-efficiency at low temperatures, and aligning the segmented material to match the high-temperature and low-temperature regions of the applied temperature difference. In this way optimal materials are matched to places in the temperature gradient through the thermoelectric device so that each material operates in its optimally-performing temperature range. A key attribute of thermoelectric compatibility stems from the fact that the heat and electric charge must flow through the connected materials. A metric of thermoelectric compatibility is the so-called "compatibility factor, often denoted s. If the compatibility factors differ by a factor of two or more, a given value of the relative current density u cannot be suitable for both materials and segmentation will not be efficient.

Figure 9C:
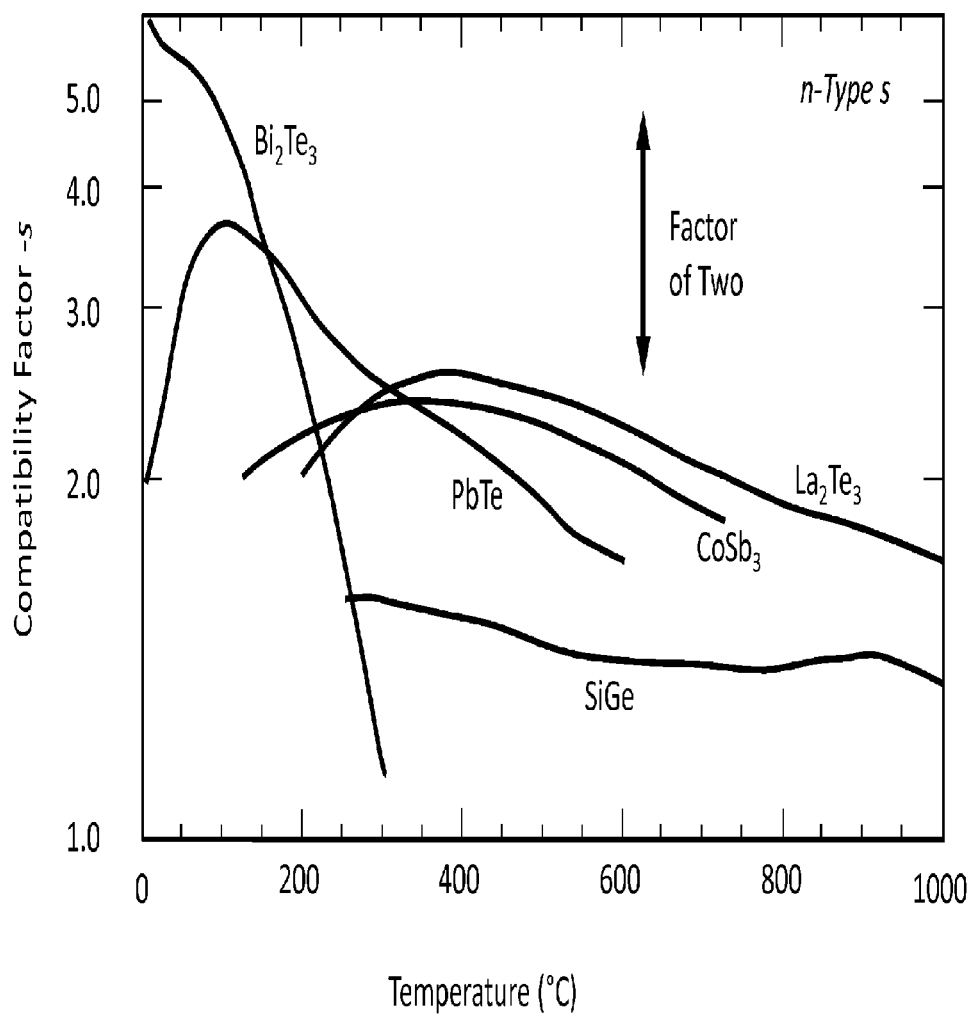
FIG. 9c (adapted from http://knol.google.com/k/andre-szykier/thermo-electric-energy/3sqds0076vqoz/2#) depicts compatibility factors versus temperature for several example n-type semiconducting materials applicable for use as one of the dissimilar thermoelectric materials in a thermoelectric device. Similarly, FIG. 9d (adapted from http://knol.google.com/k/andre-szykier/thermo-electric-energy/3sqds0076vqoz/2#) depicts compatibility factors versus temperature for several example p-type semiconducting materials applicable for use as one of the dissimilar thermoelectric materials in a thermoelectric device.
Figure 9D:
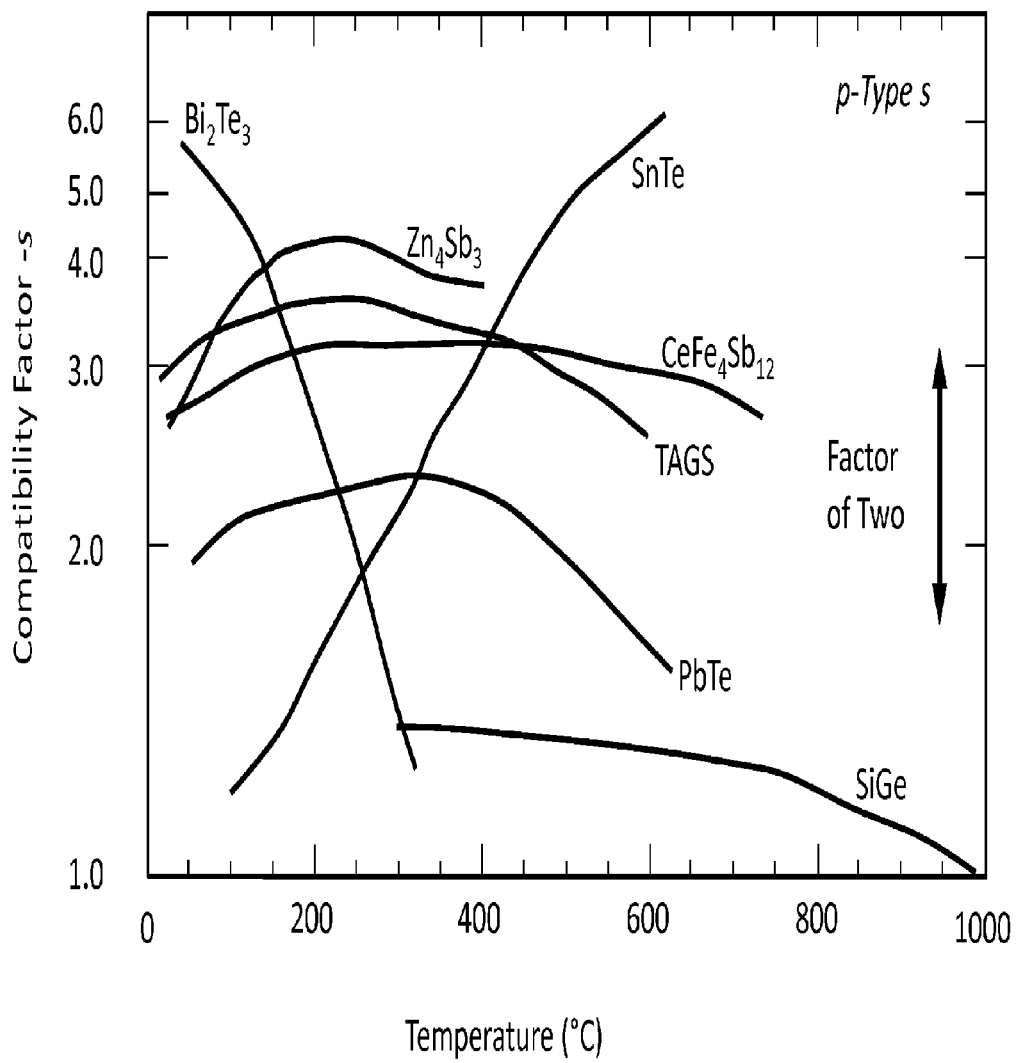
FIG. 9b (adapted from http://knol.google.com/k/andre-szykier/thermo-electric-energy/3sqds0076vqoz/2#) depicts a constant-temperature linear current-versus-voltage ("Ohms Law") and quadratic power-versus-current ("Joule's Law") curves for an exemplary Bi2Te3 thermopile.

FIG. 9c, adapted from http://knol.google.com/k/andre-szykier/thermo-electric-energy/3sqds0076vqoz/2#, depicts compatibility factors versus temperature for several example n-type semiconducting materials applicable for use as one of the dissimilar thermoelectric materials in a thermoelectric device. Similarly, FIG. 9d, adapted from http://knol.google.com/k/andre-szykier/thermo-electric-energy/3sqds0076vqoz/2#, depicts compatibility factors versus temperature for several example p-type semiconducting materials applicable for use as one of the dissimilar thermoelectric materials in a thermoelectric device.

Alternatively, compatibility and segmented design can be avoided by instead thermally cascading a plurality of thermoelectric generators. In such a thermally cascaded approach, each thermoelectric generator produces an independent electrical current, which in turn allows independent values of relative current density u, in each stage so as to optimize the u for the thermal role of each stage. This, along with a number of electrical and thermal complexities, crop up in such cascades. For example, high temperature thermoelectric generator stages should not be directly connected to an electrical load (due to Wiedeman Franz law and Joule loss considerations). Various circuit and thermal topologies can be designed to optimize performance of a cascade against these concerns.

2.4 High Performance Quantum-Process Material Thermoelectric Devices

A large number and wide variety of approaches are currently under research, development, and deployment of materials with high-performance thermoelectric properties. Two examples of these are quantum-well and Avto metals. A brief treatment of techniques and properties of quantum-well thermoelectric devices can be found in [6] and the references therein. Treatment of techniques and properties of Avto metal thermoelectric devices can be found in [7]-[10] and the references therein.

A major problem with Peltier effect thermoelectric devices, among others, is that while electrons transport heat in one direction, the material itself provides a reverse heat flow (through simple heat conduction) that returns much of the transported heat.

Figure 10A:
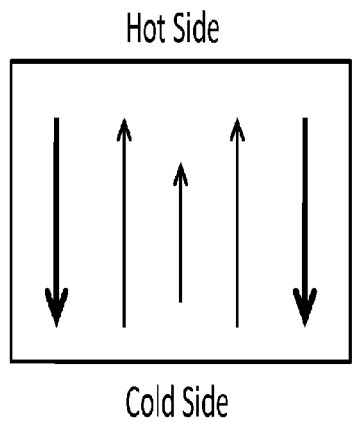
FIG. 10a (adapted from [7]) depicts how in traditional Peltier effect thermoelectric devices simple heat conduction heat flow (thicker vertical arrows) returns heat that has been transported in the opposite direction by electron flow (thinner vertical arrows).

FIG. 10a, adapted from [7], depicts how in traditional Peltier effect thermoelectric devices simple heat conduction heat flow (thicker vertical arrows) returns heat that has been transported in the opposite direction by electron flow (thinner vertical arrows). These processes make even the most optimized Peltier effect thermoelectric devices made with traditional thermoelectric materials have heat-transfer efficiencies of 5%-8% of the theoretical Carnot heat-transfer efficiency upper limit. This compares unfavorably with compressor-based cooling approaches which typically have heat-transfer efficiencies of 45%.

A related situation affects the efficiency of Seebeck effect thermoelectric devices. Once again, as electrons transport energy the material itself provides a heat flow path (through simple heat conduction) through the material. Efficiency is greatly reduced because most of the heat is transported through the materials within the thermoelectric device, leaving far less heat to actually drive the migration of electrons to create a Seebeck effect electric current.

Figure 10B:
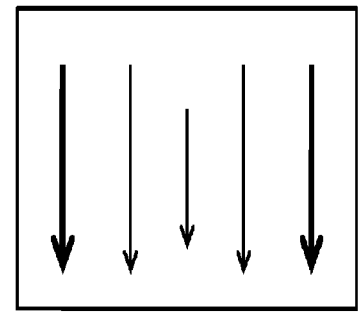
FIG. 10b (adapted from [7]) illustrates the phenomenon in traditional Seebeck effect thermoelectric devices wherein simple heat conduction heat flow (thicker vertical arrows) provides a dominant path for heat flow, leaving far less heat to actually drive the electron flow (thinner vertical arrows) that creates a Seebeck effect electric current.

FIG. 10b, adapted from [7], illustrates this issue in traditional Seebeck effect thermoelectric devices wherein simple heat conduction heat flow (thicker vertical arrows) provides a dominant path for heat flow, leaving far less heat to actually drive the electron flow (thinner vertical arrows) that creates a Seebeck effect electric current.

Typical Seebeck effect thermoelectric devices convert approximately 10 percent of thermal energy to electricity. Even with this low energy conversion ratio, available Seebeck effect thermoelectric devices can produce useful ranges of voltages and currents. For example, commercial devices available in development kits from Custom Thermoelectric, Inc., 11941 Industrial Park Road, STE 5, Bishopville, Md. 21813, 443-926-9135 (http://www.customthermoelectric-.com/index.htm) provide voltages, currents, and power quantities of value in powering computer technology in acceptable physical sizes and formats:

improvements made to thermoelectric process using additional techniques, including physical separation gaps and nanofabricated structure that induce quantum effects.

Figure 10C:
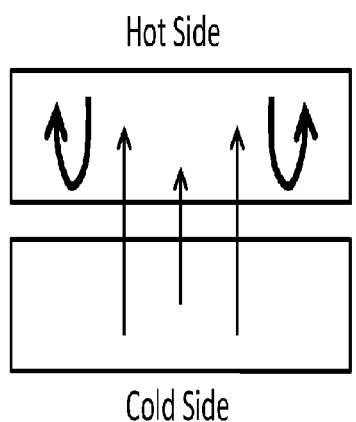
FIG. 10c depicts how thermoelectric process electron transfer across a thermally-isolating physical gap prevents efficiency-reducing heat-transfer in a thermoelectric device operating in Peltier (heat transfer) mode.
Figure 10D:
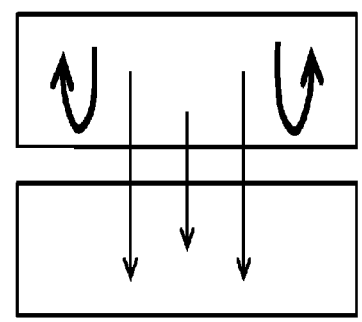
FIG. 10d depicts how thermoelectric process electron transfer across a thermally-isolating physical gap prevents efficiency-reducing heat-transfer in a thermoelectric device operating in Seebeck (heat-to-power conversion) mode.

In fact there is at least one practical and commercially viable approach of this sort employing so called "Avto metals" which change electronic properties of a material by etching surface patterns using available nanotechnology methods. Peltier processes employing Avto metals appear to be able to reach heat-transfer efficiencies of greater than 50% of the theoretical Carnot heat-transfer efficiency upper limit, and Seebeck processes employing such materials and techniques appear to be able to reach conversion rates of 20%-23%. These technologies are described in U.S. Pat. Nos. 7,658,772; 7,642,467; 7,589,348; 7,566,897; 7,427,786; 7,419,022; 7,351,996; 7,323,709; 7,253,549; 7,220,984; 7,208,021; 7,169,006; 7,166,786; 7,140,102; 7,124,583; 7,074,498; 7,005,381; 6,971,165; 6,876,123; 6,869,855; 6,774,003; 6,720,704; 6,651,760; 6,531,703; 6,495,843; 6,417,060; 6,281,514; 6,281,139; 6,239,356; 6,229,083; 6,214,651; 6,117,344; 6,089,311; 5,994,638; 5,981,866; 5,981,071; 5,810,980; 5,722,242; 5,699,668; 5,675,972 and the TRN article "Chips turn more heat into Power" available at http://www.tmmag.com/Stories/2001/121901/ Chips_turn_more_heat_to_power 1 21901.html (visited Feb. 15, 2011). FIG. 10c depicts how thermoelectric process electron transfer across a thermally-isolating physical gap prevents efficiency-reducing heat-transfer in a thermoelectric device operating in Peltier (heat transfer) mode. Similarly, FIG. 10d depicts how thermoelectric process electron transfer across a thermally-isolating physical gap prevents efficiency-reducing heat-transfer in a thermoelectric device operating in Seebeck (heat-to-power conversion) mode.

2.5 Structured Physical Arrangements for Pluralities of Thermoelectric Devices

FIG. 11a depicts a mechanical symbol that will be used for a physical instance.

FIG. 11b depicts an exemplary physical arrangement of thermoelectric devices in a linear side-by-side array.

FIG. 11c depicts an exemplary physical arrangement of thermoelectric devices in a side-by-side matrix array.

| Custom Thermoelectric, Inc. Part Number | 150° C. hot/50° C. cold | | | 300° C. hot/30° C. cold | | | Max ° C. | Dimensions (mm) | | |
|---|---|---|---|---|---|---|---|---|---|---|
| | P (Watts) | I (Amps) | V (Volts) | P (Watts) | I (Amps) | V (Volts) | | L | W | H |
| 1261G-7L31-04CQ | 1.0 | 0.6 | 1.7 | 5.1 | 1.3 | 3.9 | 300 | 1.6 | 1.6 | 1.3 |
| 1261G-7L31-05CQ | 1.2 | 0.9 | 1.3 | 7.5 | 2.0 | 3.6 | 300 | 1.6 | 1.6 | 1.3 |
| 1261G-7L31-10CX1 | 3.2 | 1.7 | 1.9 | 15 | 3.5 | 4.2 | 300 | 56 | 56 | .17 |

Returning to the matter of efficiency, in both Peltier and Seebeck modes vastly important efficiency limitations result from heat conduction through the same material that implements the desired thermoelectric process. One way to conquer this is to somehow facilitate electron transfer while blocking heat transfer. In terms of traditional material science, this has not yet been attainable. However, the currency of thermoelectric process is electron transport. Electrons can certainly traverse physical separation gaps (between electrodes) that do not carry heat (as in electron vacuum tubes used in early-to-mid 20th century electronics). Additionally, electrons live in a world dominated by quantum effects, and a variety of quantum effects, including tunneling and standing wave resonance structures, that can be induced by nanofabrication techniques. This suggests there could be FIG. 11d depicts an exemplary physical arrangement of thermoelectric devices in a stacked "sandwich" array.

In an embodiment, a stacked "sandwich" array can be implemented in an extended-length format which can be used as an active version of a heat pipe.

FIG. 11e depicts an exemplary physical arrangement of thermoelectric devices in a 3D array.

2.6 Summary of Thermoelectric Device Technology

At this point a few important facts that can be taken away from the preceding discussion:

Thermoelectric devices can be operated in Peltier (heat transfer) mode and in Seebeck (heat-to-power conversion) mode;

In Peltier mode, traditional thermoelectric devices made with traditional thermoelectric materials have heat-transfer efficiencies of 5%-8% of the theoretical Carnot heat-transfer efficiency upper limit (comparing unfavorably with compressor-based cooling efficiencies of 45%);

In Seebeck mode, traditional thermoelectric devices made with traditional thermoelectric materials convert approximately 10 percent of thermal energy to electricity;

Early work leveraging various techniques, including physical separation gaps and nanofabricated structures inducing quantum effects on electrons, shows that Peltier mode heat transfer efficiencies can be improved by a factor as high as 10 and Seebeck mode conversions can be improved by a factor of 2 or more;

Such material and techniques will continue to favorably evolve and performance metrics will continue to be improved;

Even with 10 percent conversion rates, commercially available Seeback devices are already available providing voltages, currents, and power quantities of value in powering computer technology in acceptable physical sizes and formats.

The present invention next provides a number of novel innovations for leveraging the above into systems, methods, and evolution strategies for technologies and products that provide a flexible environment for cooling, thermal management, and heat-to-electricity energy harvesting which (in various forms with evolution paths among these forms) will be valuable for near-term and future computer devices and data centers.

To begin, various exemplary structured physical arrangements for pluralities of thermoelectric devices are first considered.

3. Multimode Thermoelectric Devices Combining Energy Harvesting and Heat Transport Functions In general, thermoelectric devices are reciprocal in that they can operate in either a thermoelectric cooler or a thermoelectric electric current generator as determined by imposed thermal conditions and electrical connections to the reciprocal thermoelectric device. Further, it is noted that when acting as a thermoelectric electric current generator, a voltage is produced, the same voltage that is used in thermocouples (a specialized thermoelectric device) for the measurement of temperature. Thus, thermoelectric devices can additionally serve as a temperature sensor.

In general, thermoelectric devices can be optimized in their design to best serve specific applications (for example, temperature measurement, thermal cooling, electric energy harvesting, etc.) Alternatively, thermoelectric devices can also be optimized in their design to best two or all three of these modalities.

In an embodiment, the invention provides for the use of reciprocal thermoelectric devices capable of operating in either a thermoelectric cooler or a thermoelectric electric current generator as determined by imposed thermal conditions and electrical connections to the reciprocal thermoelectric device.

In an embodiment, the invention provides for at least one of the thermoelectric devices can serve as a temperature sensor.

In an embodiment, the invention provides for the mode of a given thermoelectric device is switched over time. As one example, a given thermoelectric device can be a thermoelectric cooler one moment and a temperature sensor at another moment. As another example, a given thermoelectric device can be a thermoelectric electric current generator one moment and a temperature sensor at another moment. As yet another example, a given thermoelectric device can be a thermoelectric cooler one moment and a thermoelectric electric current generator at another moment. As still another example, a given thermoelectric device can be a thermoelectric cooler one moment, a temperature sensor at another moment, and a thermoelectric electric current generator at yet another moment.

In an embodiment, the invention provides for a control system that selects the mode of operation of at least one reciprocal thermoelectric device, the selection made responsive to the state of the system, time, a measurement condition, or some combination of these.

Figure 12:
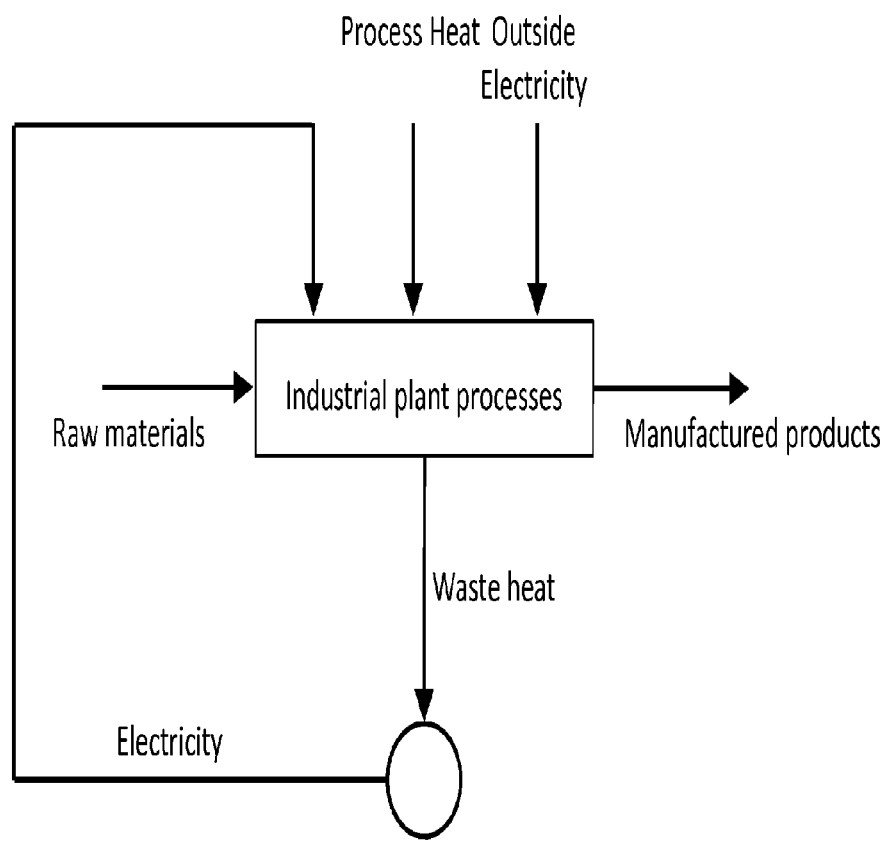
FIG. 12, adapted from example [11], depicts an example representation of the classic "Bottoming Cycle" employed in on-site manufacturing electrical energy co-generation that can be adapted to serve the electrical energy generation situation in data centers.

When used to generate electricity in an environment that also consumes electricity (such as in the computers of a data center), the resulting situation is akin the well-established industrial plant approaches to on-site electrical energy co-generation. There are various forms of this, notably so called "Topping Cycle" and "Bottoming Cycle" approaches (see for example [11]). Of these, the "Bottoming Cycle" depicted in FIG. 12, adapted from example [11], can be adapted to serve the electrical energy generation situation in data centers. Here, the "raw material" in and "manufactured products" out comprise abstractions such as data, services, and interactive session transactions. Such a model provides a framework for both control system design and for the overall evaluation of the efficiency, effectiveness, and value of various design options of the present invention.

Figure 13:
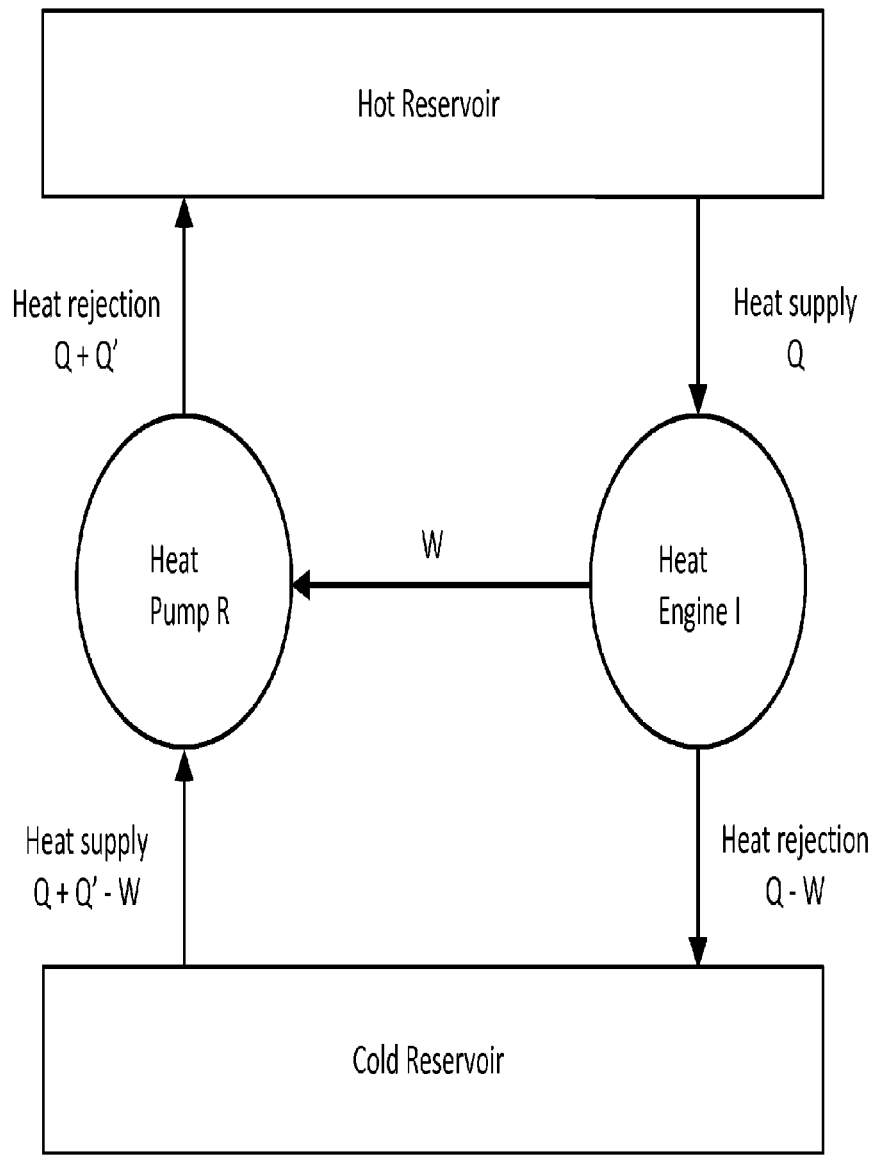
FIG. 13, adapted from [12] depicts an example representation of the total energy-flow budget relevant for actual and economically-ascribed value of embodiments of the invention as a green technology.

Further as to this, the non-idealness, relative efficiencies, material costs, operating energies, etc. all contribute to figures of merit such as lifetime total cost of ownership, environmental offset contributions, and other aspects important to the actual and economically-ascribed value of embodiments of the invention as a green technology. For example, reduction for the need of vast-volume air handlers reduces energy consumption but Joule heating, control processor power consumption, and performance limitations of thermoelectric devices reduce contributions of the technology. FIG. 13, adapted from [12] depicts an example representation of the total energy-flow budget relevant for actual and economically-ascribed value of embodiments of the invention as a green technology.

3.1 Electrical Arrangements for Pluralities of Thermoelectric Devices

Figure 14A:
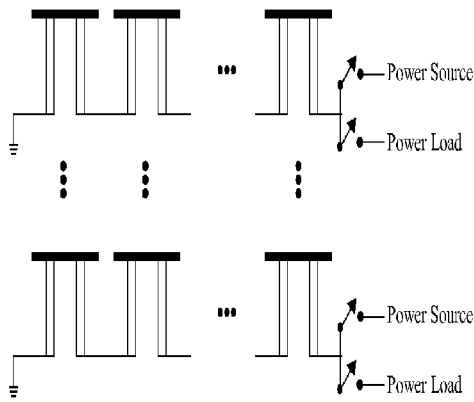
FIG. 14a depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least two switching transistors, the first switching transistor connecting to a power source and the second switching transistor connecting to a load, or load interface circuit, to which the thermoelectric cell provides power.

FIG. 14a depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least two switching transistors, the first switching transistor connecting to a power source and the second switching transistor connecting to a load, or load interface circuit, to which the thermoelectric cell provides power.

Figure 14B:
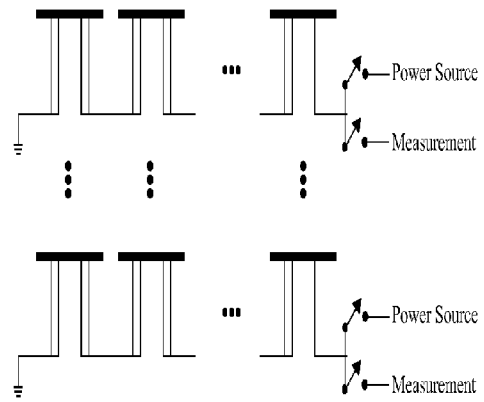
FIG. 14b depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least two switching transistors, the first switching transistor connecting to a power source and the second switching transistor connecting to a measurement circuit.

FIG. 14b depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least two switching transistors, the first switching transistor connecting to a power source and the second switching transistor connecting to a measurement circuit.

Figure 14C:
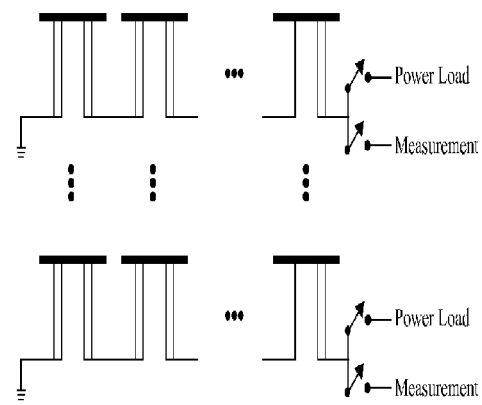
FIG. 14c depicts a plurality of thermoelectric cells, such as those examples depicted in FIGS. 7c-7f, as can be physically arranged in various ways, such as those examples depicted in FIGS. 11b-11e, to be arranged so that each cell is electrically connected to at least two switching transistors, the first switching transistor connecting to a load, or load interface circuit, to which the thermoelectric cell provides power, and the second switching transistor connecting to a measurement circuit.

FIG. 14c depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least two switching transistors, the first switching transistor connecting to a load, or load interface circuit, to which the thermoelectric cell provides power, and the second switching transistor connecting to a measurement circuit.

Figure 14D:
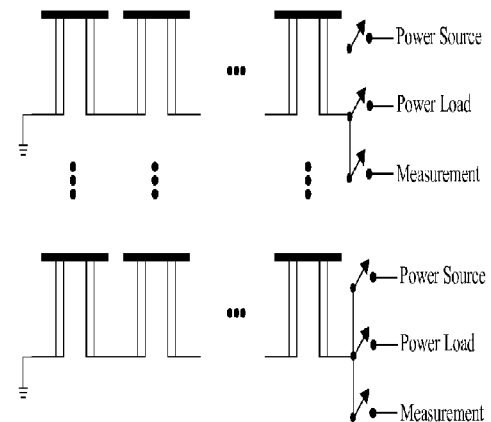
FIG. 14d depicts a plurality of thermoelectric cells, such as those examples depicted in FIGS. 7c-7f, as can be physically arranged in various ways, such as those examples depicted in FIGS. 11b-11e, to be arranged so that each cell is electrically connected to at least three switching transistors, the first switching transistor connecting to a power source, the second switching transistor connecting to a load, or load interface circuit, to which the thermoelectric cell provides power, and the third switching transistor connecting to a measurement circuit.
Figure 15A:
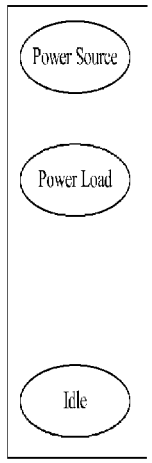
FIGS. 15a-15j depict a collection of switch mode states which can be periodically attained in a mutually exclusive fashion according, for example, to a periodic state transition map with periodic behavior determined by parameters such as at least one of frequency, duty cycle, period, or duration in each state.
Figure 15B:
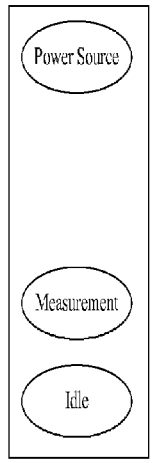
Figure 15C:
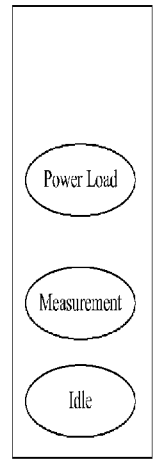
Figure 15D:
Figure 15E:
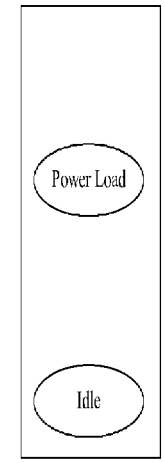
Figure 15F:
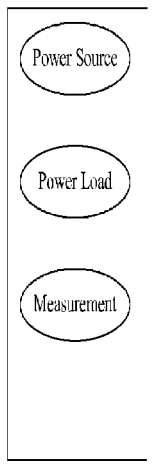
Figure 15G:
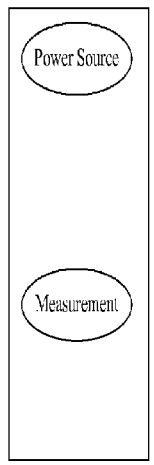
Figure 15H:
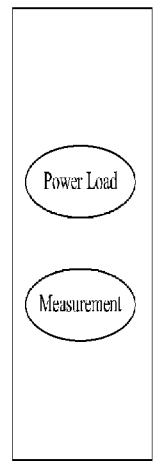
Figure 15I:
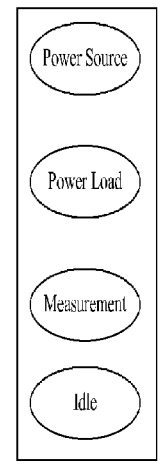
Figure 15J:

FIG. 14d depicts a plurality of thermoelectric cells, such as those examples depicted in FIGS. 7c-7f, as can be physically arranged in various ways, such as those examples depicted in FIGS. 11 b-11e, to be arranged so that each cell is electrically connected to at least three switching transistors, the first switching transistor connecting to a power source, the second switching transistor connecting to a load, or load interface circuit, to which the thermoelectric cell provides power, and the third switching transistor connecting to a measurement circuit.

Each of FIGS. 15a-15j depicts a collection of switching-transistor configuration mode states that can be periodically attained in a mutually exclusive fashion according, for example, to a periodic state transition map with periodic behavior determined by parameters such as at least one of frequency, duty cycle, period, or duration in each state.

Note that idle and measurement modes provide a 'safe' intermediate state (for "break before make" action) between the power source mode and the power load mode.

3.2 Control Systems for Multimode Thermoelectric Devices

The afore-described arrangements can be operated by a control system. The control system can be configured to create a wide range of operational capabilities for the adaptive optimized reactions to needs for heat removal, opportunities for energy harvesting, prevention of condensation (endemic to Peltier devices), prevention of thermal runaway, backup safety provisions, and many additional other functions. In some instances or implementations, individual control systems can be provided to arrays of multimode thermoelectric devices. In other instances or implementations, a plurality of arrays of multimode thermoelectric devices can be controlled by a single control system.

In an embodiment, as facilitated further in subsequent sections, a control system can be integrated together with switching transistors and an array of multimode thermoelectric devices to form a physically self-contained system.

In an embodiment, the control system can switch among any two or more of:
  Any of the ten periodical mode state configurations depicted in FIGS. 15a-15j;
  Any of the four individual modes such as idle, power source, power load, and measurement.

In an embodiment, the invention provides pulse-width modulation and other duty-cycle control interleave modes of operation.

In an embodiment, the invention provides pulse-width modulation and other duty-cycle control to prevent Peltier cooling induced condensation.

Figure 16A:
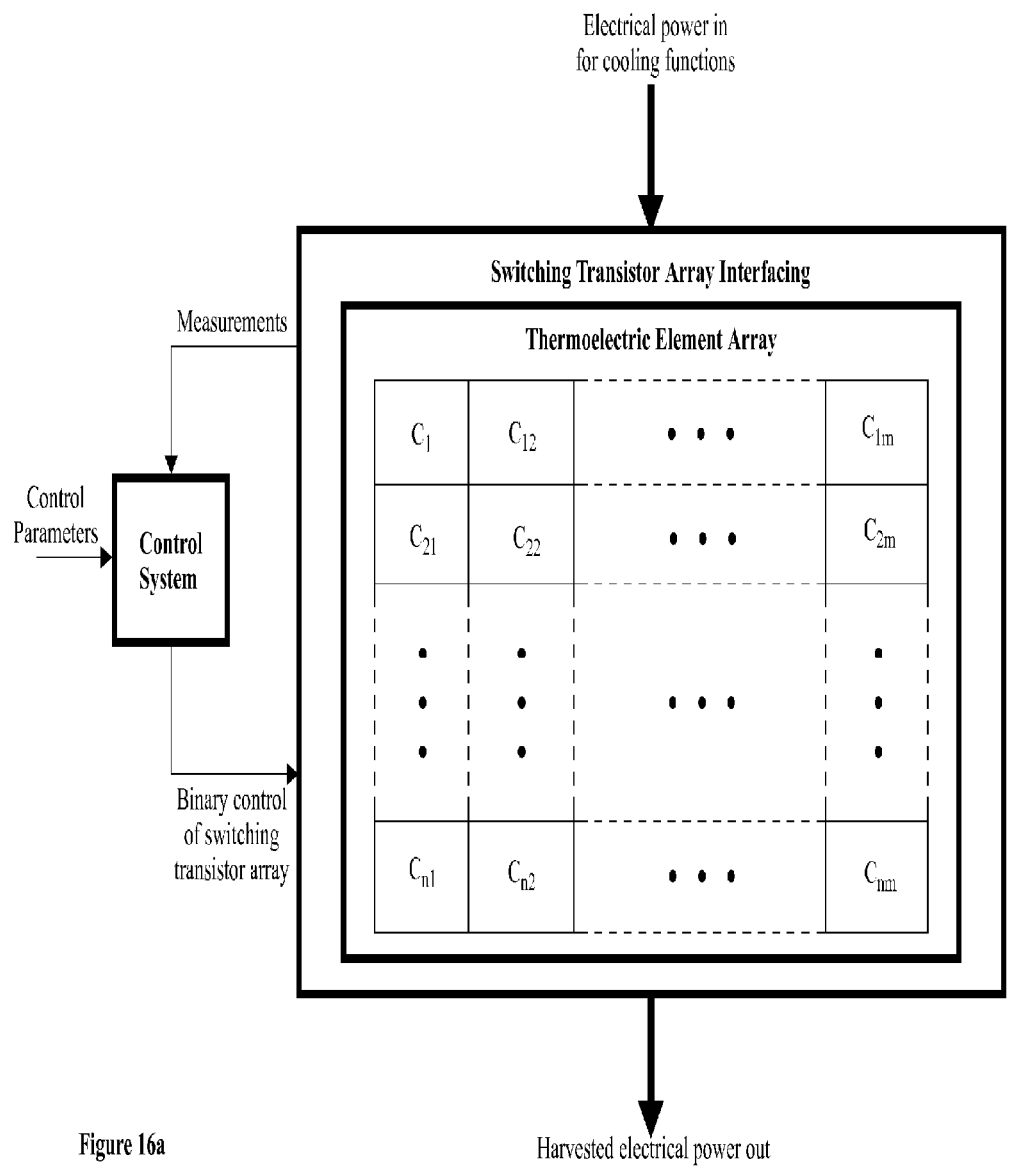
FIG. 16a depicts an example arrangement wherein an array of thermoelectric cells, physically arranged for example in ways such as the examples depicted in FIGS. 11b-11e, are interfaced with arrangements of switching transistors, for example in ways such as the examples depicted in FIGS. 14a-14d, such that each arrangement of switching transistors selects modes of operation for at least one thermoelectric cell, the modes including at least measurement, heat transfer, and heat-to-electricity energy harvesting. The switching transistors can be controlled by a control system.

FIG. 16a depicts an example arrangement wherein an array of thermoelectric cells, physically arranged for example in ways such as the examples depicted in FIGS. 11b-11e, are interfaced with arrangements of switching transistors, for example in ways such as the examples depicted in FIGS. 14a-14d, such that each arrangement of switching transistors selects modes of operation for at least one thermoelectric cell, the modes including at least measurement, heat transfer, and heat-to-electricity energy harvesting. The switching transistors can be controlled by a control system. The control system can be provided measurement information and externally provided control parameters or commands. Such an arrangement can be configured to select the mode of each cell thermoelectric independently or collectively, for example with a control system comprising one or more of logic circuit, clock-driven binary counters, a computer bus interface, algorithmic microprocessor control, field-programmable logic array (FPLA) control, analog circuitry, and driving transistors.

Figure 1A:
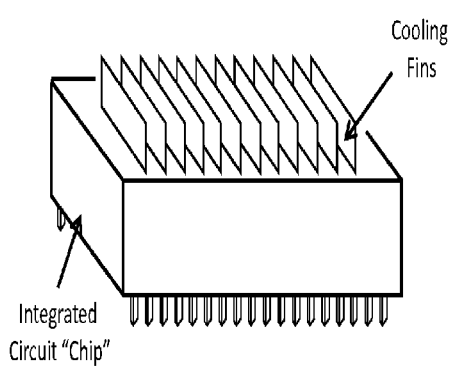
FIG. 1a depicts an exemplary computer processor chip fitted with a traditional air-cooled finned heat sink.
Figure 1B:
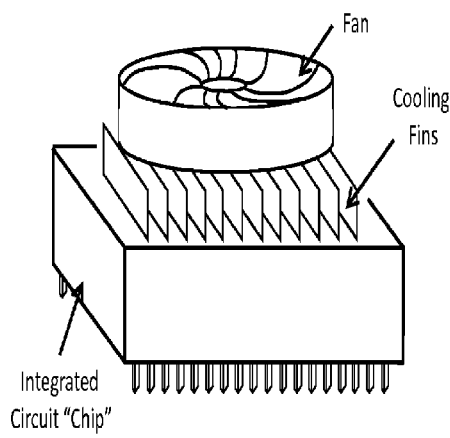
FIG. 1b shows an arrangement like that of FIG. 1a but fitted with a dedicated fan to increase the air flow through an individual heat sink.
Figure 1C:
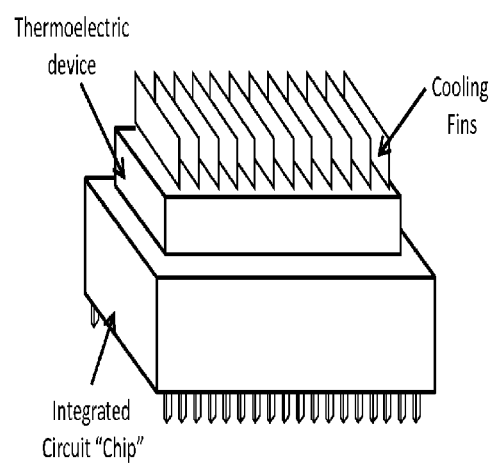
FIG. 1c depicts an exemplary heat pipe system employed in a laptop computer.
Figure 1D:
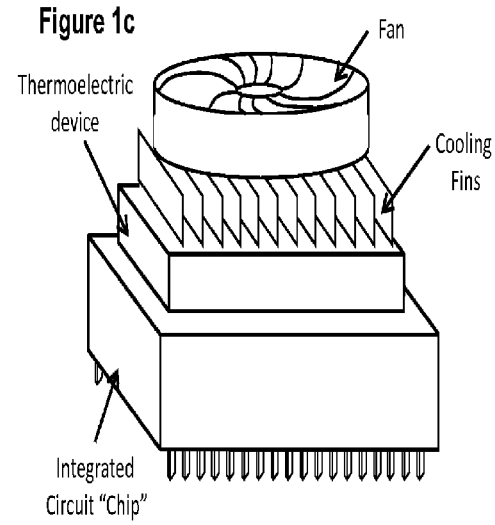
FIG. 1d depicts an exemplary heat pipe system wherein the heat pipe connects transferred heat produced at the chip to a fan-cooled heat-sink.
Figure 1E:
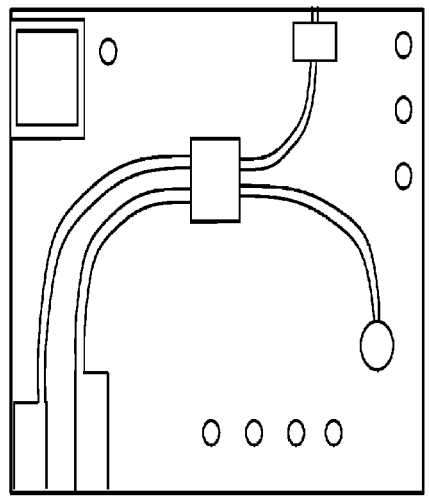
FIG. 1e depicts an exemplary arrangement heat pipe system wherein a principal heat sink is connected via heat pipes with expansion heat sinks.
Figure 1F:
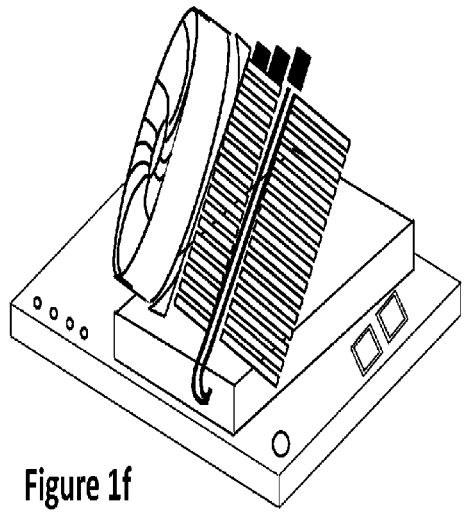
FIG. 1f depicts an exemplary heat pipe system wherein the heat pipe connects transferred heat produced at the chip to a fan-cooled heat-sink.
Figure 1G:
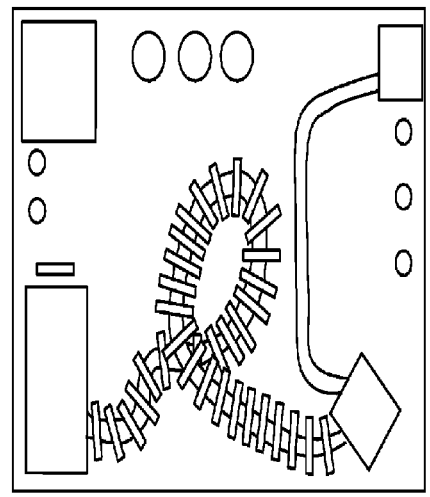
FIG. 1g depicts an exemplary arrangement heat pipe system wherein a principal heat sink is connected via heat pipes with expansion heat sinks.
Figure 16B:
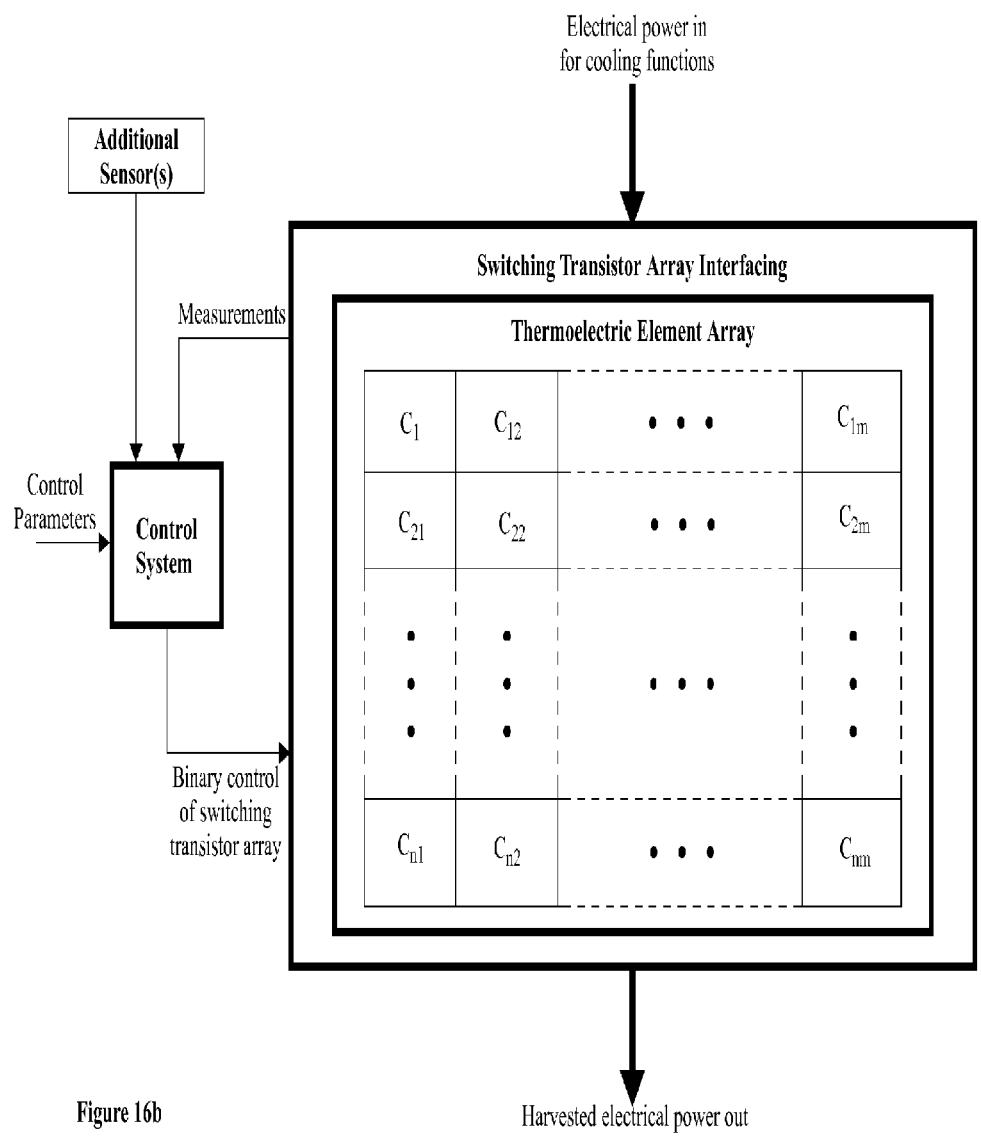
FIG. 16b depicts a variation of the example arrangement of FIG. 1a wherein the control system is provided input signals from one or more additional sensors, for example a remote temperature sensor.

FIG. 16b depicts a variation of the example arrangement of FIG. 1a wherein the control system is provided input signals from one or more additional sensors, for example a remote temperature sensor.

Figure 16C:
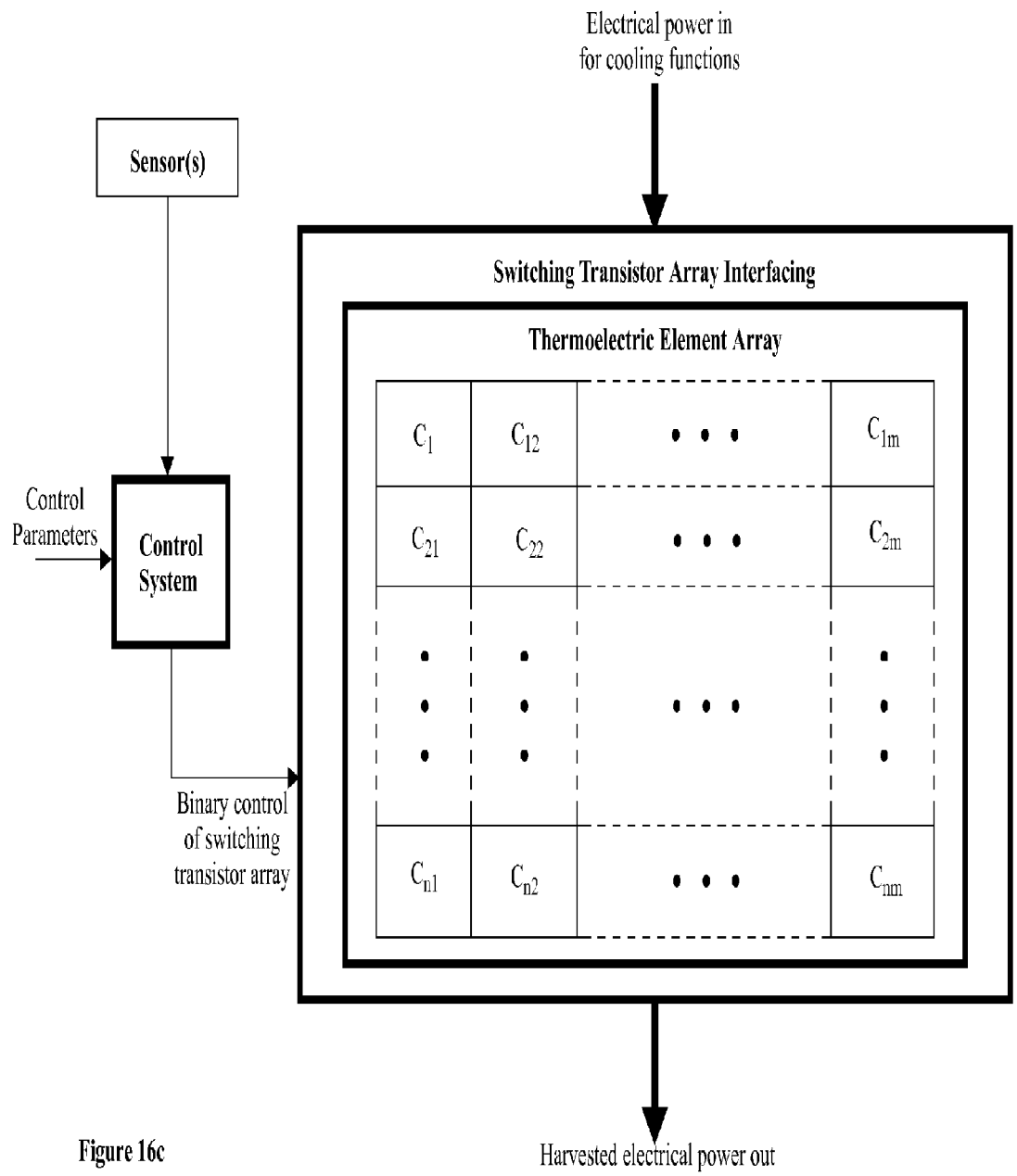
FIG. 16c depicts a variation of the example arrangement of FIG. 1a wherein there is no measurement mode and the control system is provided input signals from one or more additional sensors, for example a remote temperature sensor rather than measurement signals from the switching transistor array.

FIG. 16c depicts a variation of the example arrangement of FIG. 1a wherein there is no measurement mode and the control system is provided input signals from one or more additional sensors, for example a remote temperature sensor rather than measurement signals from the switching transistor array.

In an embodiment, control systems as described above can interact with control systems in other parts of a heat management and energy harvesting hierarchical chain.

The invention also provides for control systems as described above can interact with peer control systems of a heat management and energy harvesting arrangement.

Figure 17:
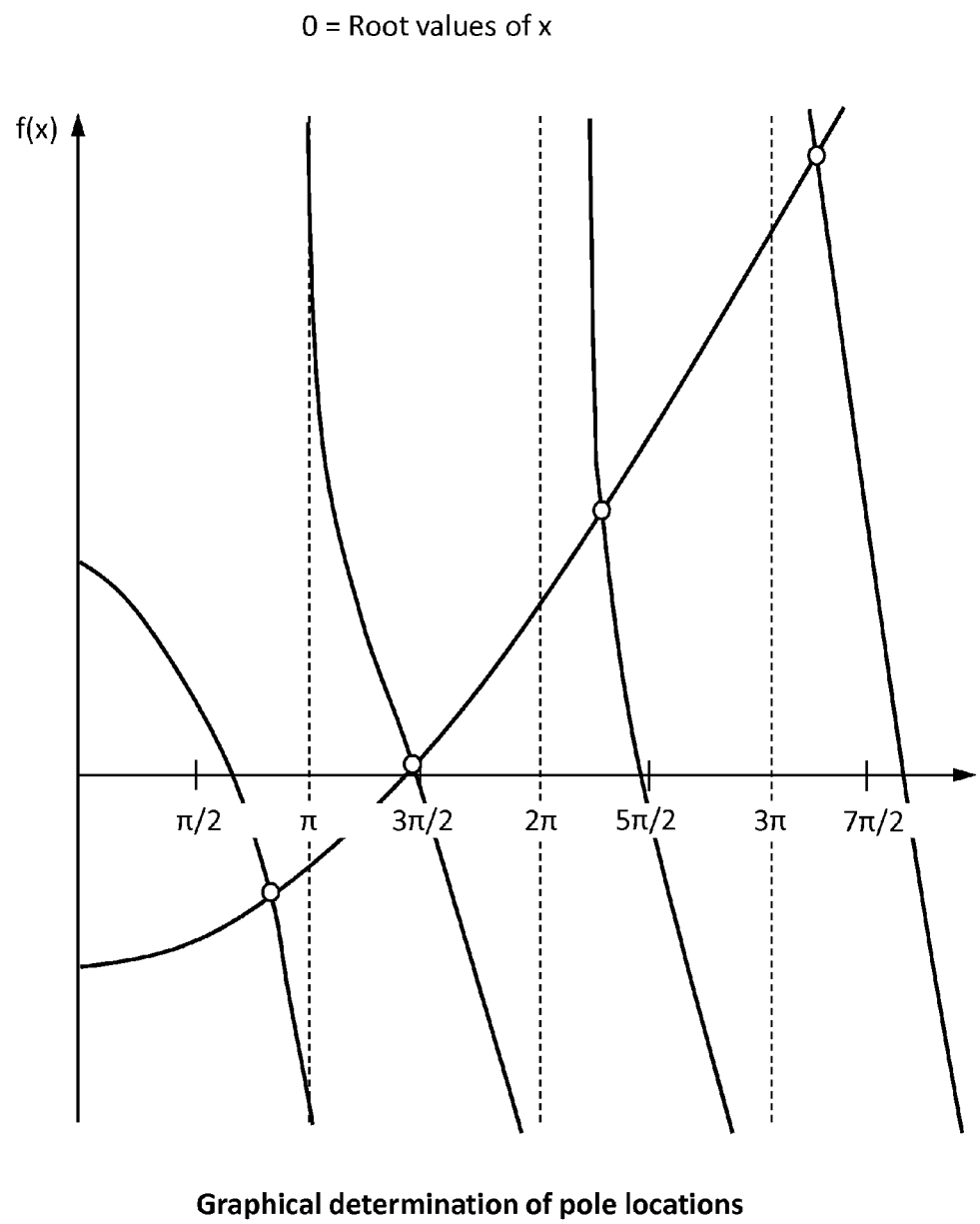
FIG. 17 (adapted from [14]) depict a representation of the graphical determination of pole locations for a representative thermoelectric device.

3.3 Consideration of and Compensation for Dynamic Behavior of Thermoelectric Devices Thermoelectric devices actually have complex dynamic behavior. For example, FIG. 17 (adapted from [14]) depicts a representation of the graphical determination of pole locations for a representative thermoelectric device.

Figure 18A:
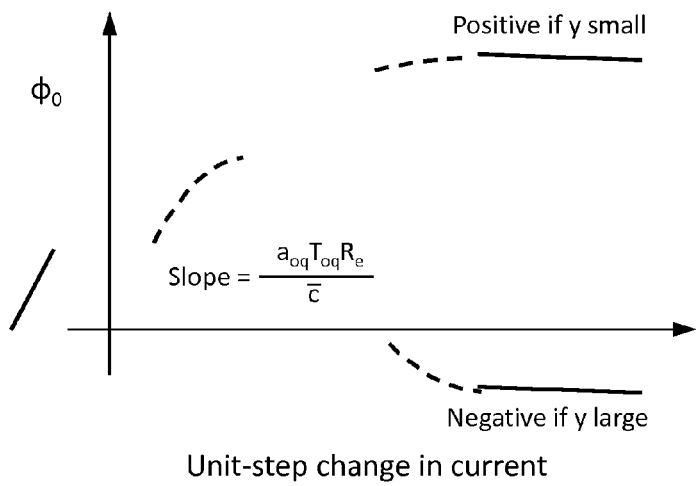
FIG. 18a (adapted from [14]) depicts a representation of the unit-step change in current for a representative thermoelectric device.

FIG. 18a (adapted from [14]) depicts a representation of the unit-step change in current for a representative thermoelectric device.

Figure 18B:
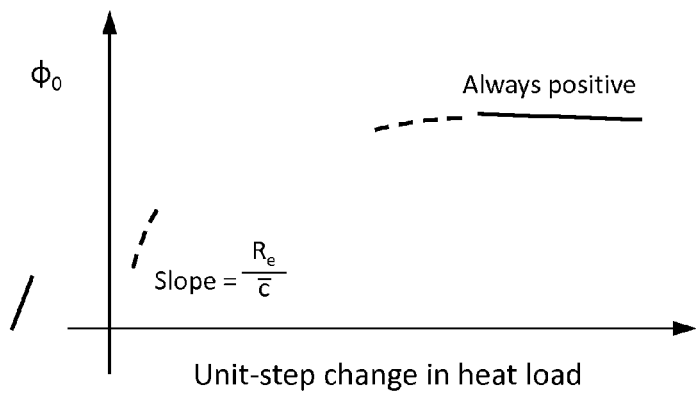
FIG. 18b (adapted from [14]) depicts a representation of the unit-step change in heat load for a representative thermoelectric device.

FIG. 18b (adapted from [14]) depicts a representation of the unit-step change in heat load for a representative thermoelectric device.

Figure 18C:
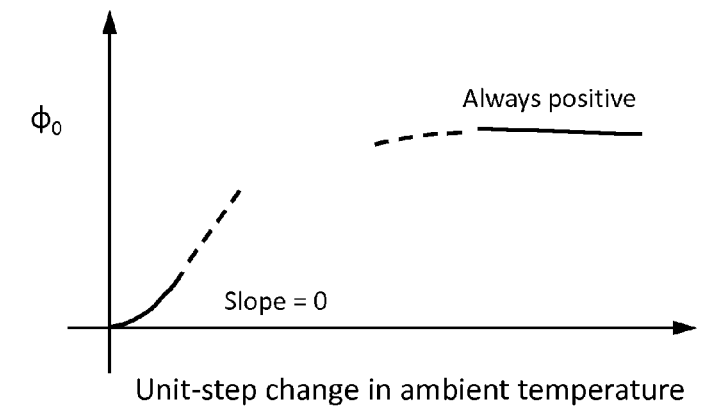
FIG. 18c (adapted from [14]) depicts a representation of the unit-step change in ambient temperature for a representative thermoelectric device.

FIG. 18c (adapted from [14]) depicts a representation of the unit-step change in ambient temperature for a representative thermoelectric device.

Figure 19A:
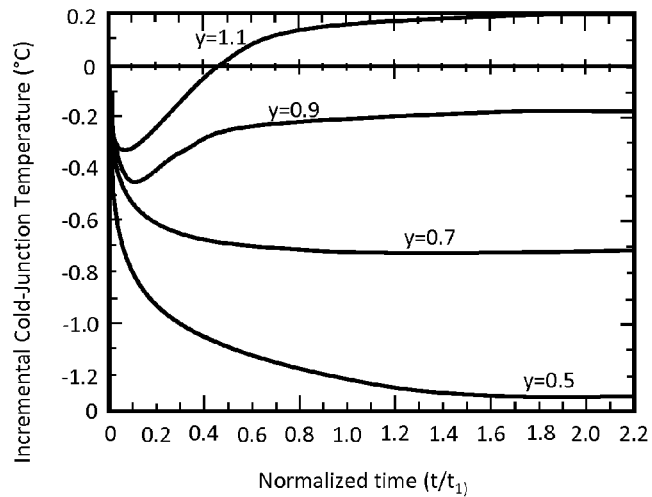
FIGS. 19a-19c (adapted from [14]) depict a representation of the normalization of time in relation to the cold junction temperature for various values of normalized quiescent electrical current.
Figure 19B:
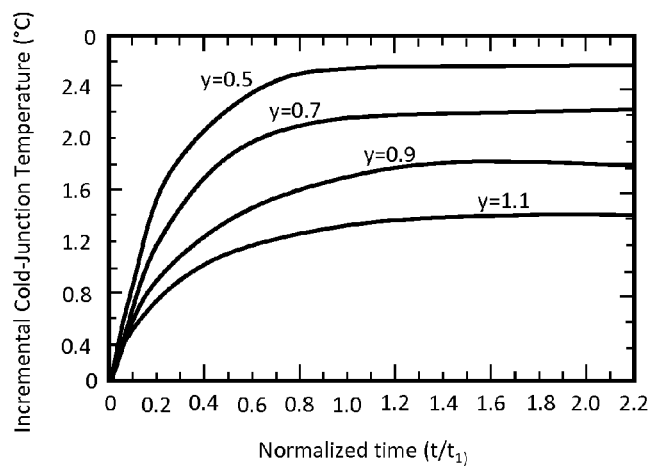
Figure 19C:
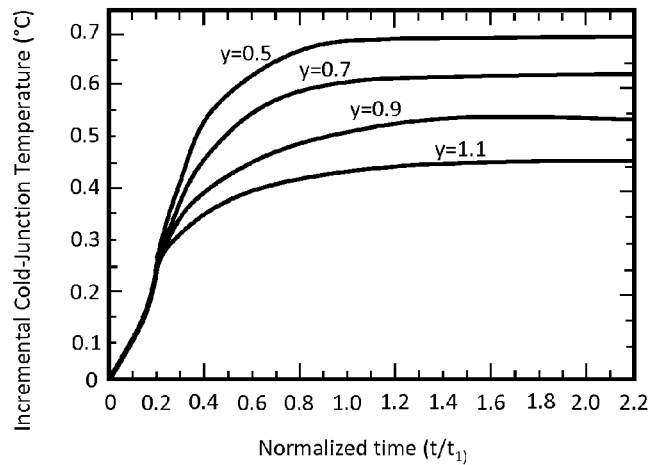

FIGS. 19a-19c (adapted from [14]) depicts a representation of the normalization of time in relation to the cold junction temperature for various values of normalized quiescent electrical current.

Figure 20A:
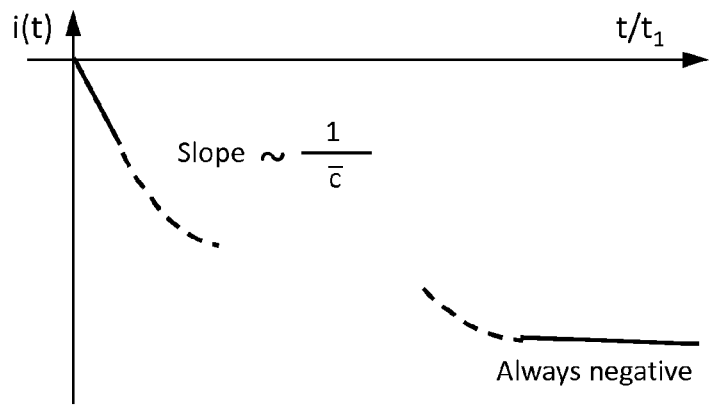
FIG. 20a (adapted from [14]) depicts a representation of the unit-step in input power for a representative thermoelectric device.

FIG. 20a (adapted from [14]) depicts a representation of the unit-step in input power for a representative thermoelectric device.

Figure 20B:
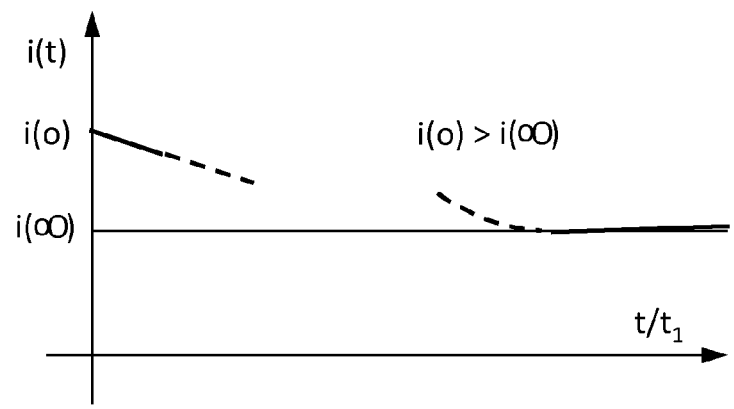
FIG. 20b (adapted from [14]) depicts a representation of the unit-step in ambient temperature for a representative thermoelectric device.

FIG. 20b (adapted from [14]) depicts a representation of the unit-step in ambient temperature for a representative thermoelectric device.

Figure 21A:
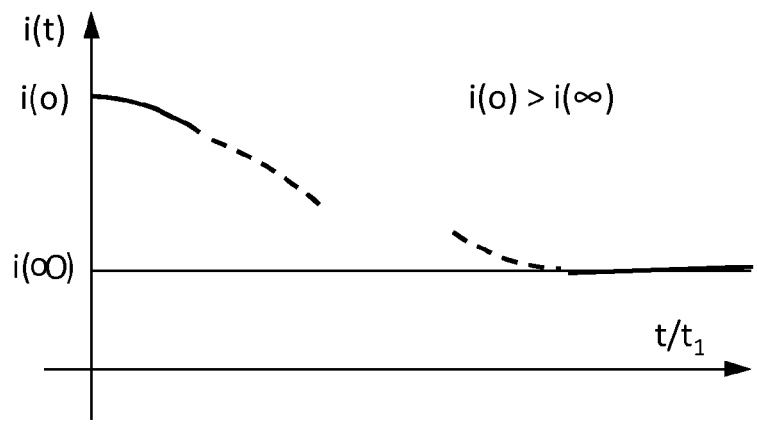
FIG. 21a (adapted from [14]) depicts a representation of the unit-step in load resistance for a representative thermoelectric device.

FIG. 21a (adapted from [14]) depicts a representation of the unit-step in load resistance for a representative thermoelectric device.

Figure 21B:
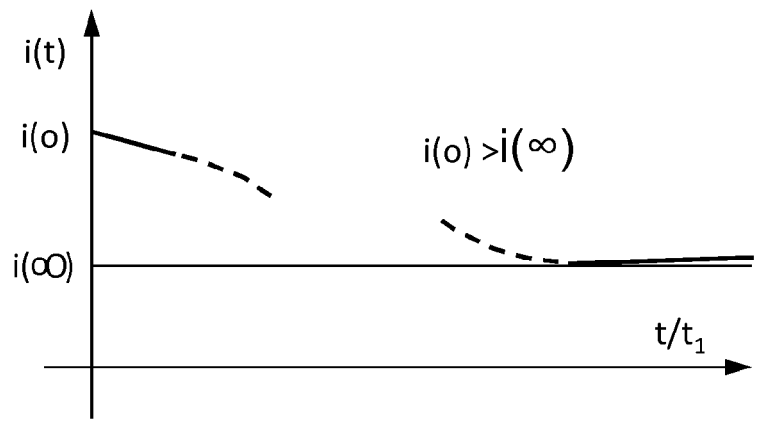
FIG. 21b (adapted from [14]) depicts a representation of the unit step in load back-emf for a representative thermoelectric device.

FIG. 21b (adapted from [14]) depicts a representation of the unit step in load back-emf for a representative thermoelectric device.

In an embodiment, the invention provides for a control system to include consideration of the dynamic behavior of at least one type of thermoelectric device.

In an embodiment, the invention provides for a control system to include compensation for the dynamic behavior of at least one type of thermoelectric device.

In an embodiment, the invention provides for a control system that selects the mode of operation of at least one reciprocal thermoelectric device to include consideration of and/or compensation for the dynamic behavior of the reciprocal thermoelectric device.

3.4 Interfacing Multimode Thermoelectric Devices with Chip Packaging

Figure 22A:
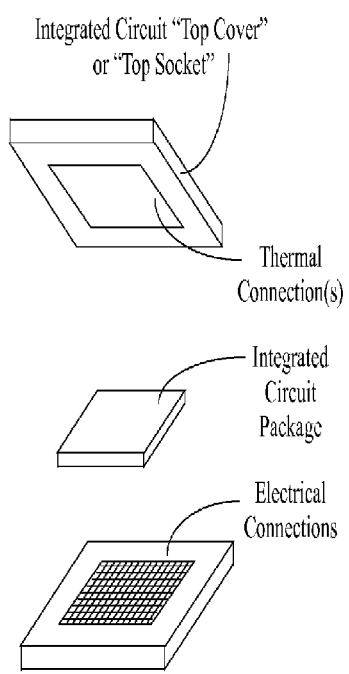
FIG. 22a depicts an example "top cover" or "top socket" arrangement for making thermal connections to an integrated circuit package. The example "top cover" or "top socket" arrangement can be made to be mechanically compatible with a traditional electrical socket for the integrated circuit package, or can be designed together with an associated form of electrical socket for the integrated circuit package.

FIG. 22a depicts an example "top cover" or "top socket" arrangement for making thermal connections to an integrated circuit package. The example "top cover" or "top socket" arrangement can be made to be mechanically compatible with a traditional electrical socket for the integrated circuit package, or can be designed together with an associated form of electrical socket for the integrated circuit package.

Figure 22B:
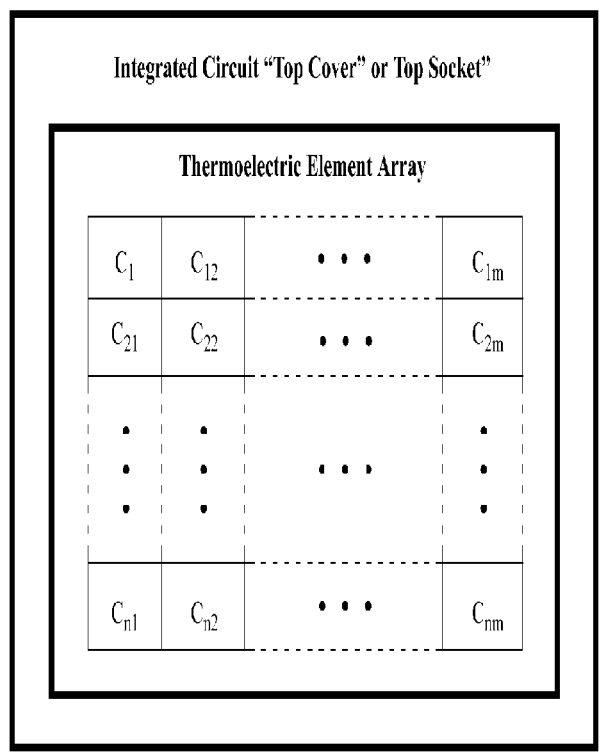
FIG. 22b depicts an example arrangement wherein the example "top cover" or "top socket" of FIG. 22a comprises a thermoelectric array. The "top cover" or "top socket" arrangement can include switching transistors and one or more of a control system and additional sensors.

FIG. 22b depicts an example arrangement wherein the example "top cover" or "top socket" of FIG. 22a comprises a thermoelectric array. The "top cover" or "top socket" arrangement can include switching transistors and one or more of a control system and additional sensors.

In an embodiment, the invention exploits reciprocity properties of thermoelectric materials in contact with a chip package.

Figure 23A:
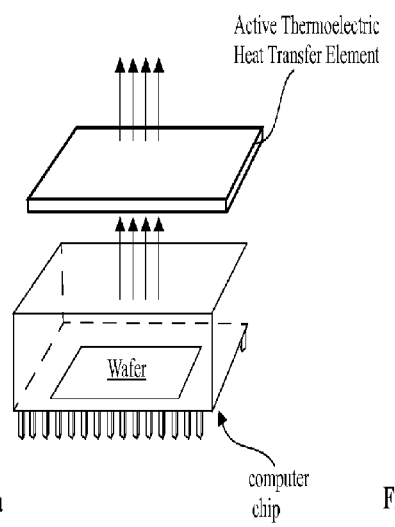
FIG. 23a depicts an example arrangement wherein a first side of an active thermoelectric device is attached atop an integrated circuit package and in thermal-transfer contact with one or more of the integrated circuit wafer and heat conducting elements of the integrated circuit package. The active thermoelectric device can include switching transistors and one or more of a control system and additional sensors.

FIG. 23a depicts an example arrangement wherein a first side of an active thermoelectric device is attached atop an integrated circuit package and in thermal-transfer contact with one or more of the integrated circuit wafer and heat conducting elements of the integrated circuit package. The active thermoelectric device can include switching transistors and one or more of a control system and additional sensors.

Figure 23B:
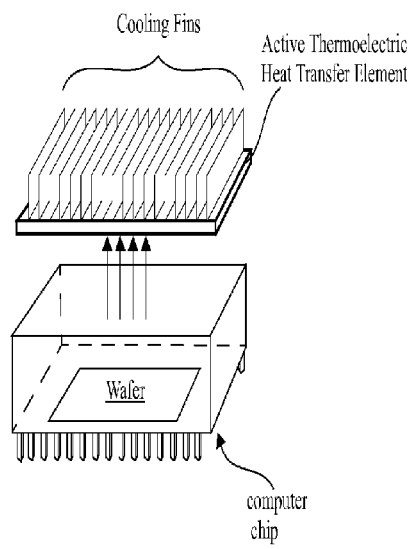
FIG. 23b depicts the example arrangement of FIG. 23a wherein the second side of the active thermoelectric device is attached and in thermal-transfer contact with a thermal interface to a cooling fin arrangement.

FIG. 23b depicts the example arrangement of FIG. 23a wherein the second side of the active thermoelectric device is attached and in thermal-transfer contact with a thermal interface to a cooling fin arrangement.

Figure 23C:
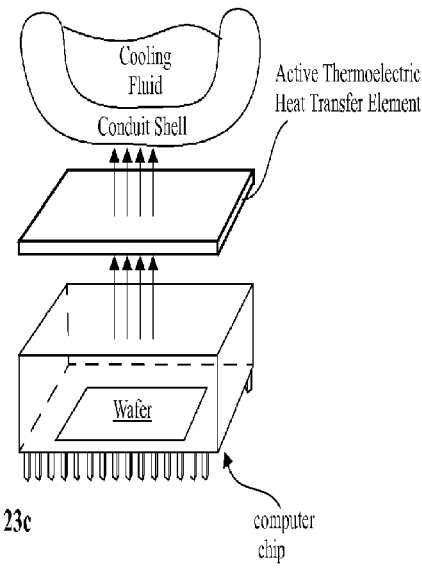
FIG. 23c depicts the example arrangement of FIG. 23a wherein the second side of the active thermoelectric device is attached and in thermal-transfer contact with a thermal interface which is in turn in thermal-transfer contact with a fluidic cooling arrangement.

FIG. 23c depicts the example arrangement of FIG. 23a wherein the second side of the active thermoelectric device is attached and in thermal-transfer contact with a thermal interface which is in turn in thermal-transfer contact with a fluidic cooling arrangement.

In an embodiment, the invention provides for at least one thermal interface to be in thermal contact with a circulating cooling fluid, for example possessing a high heat-carrying capacity. In an embodiment, the invention provides for thermal interfaces with a circulating cooling fluid to be designed to easily connect to integrated circuit packaging.

Figure 23D:
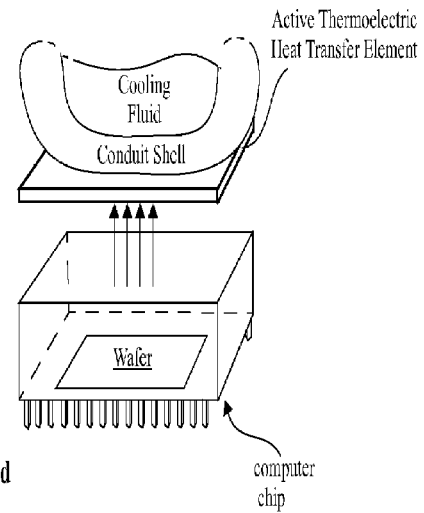
FIG. 23d depicts the example arrangement of FIG. 23a wherein the second side of the active thermoelectric device is attached and in thermal-transfer contact with a thermal interface to a fluidic cooling arrangement.

FIG. 23d depicts the example arrangement of FIG. 23a wherein the second side of the active thermoelectric device is attached and in thermal-transfer contact with a thermal interface to a fluidic cooling arrangement.

Figure 24A:
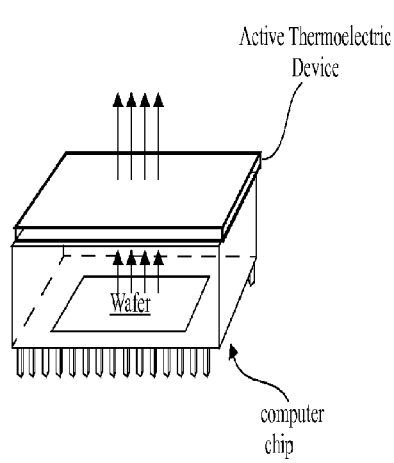
FIG. 24a depicts a thermal interface provided by an article of integrated circuit packaging wherein the thermal interface is located on the top of the integrated circuit packaging.

FIG. 24a depicts a thermal interface provided by an article of integrated circuit packaging wherein the thermal interface is located on the top of the integrated circuit packaging.

Figure 24B:
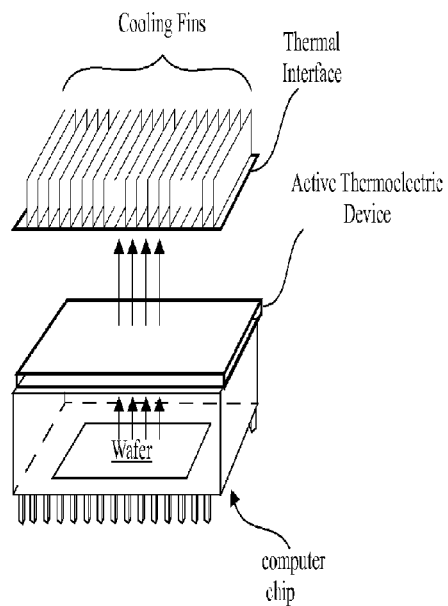
FIG. 24b depicts an alternative or supplemental thermal interface provided by an article of integrated circuit packaging wherein the thermal interface is located on the bottom of the integrated circuit packaging.

FIG. 24b depicts an alternative or supplemental thermal interface provided by an article of integrated circuit packaging wherein the thermal interface is located on the bottom of the integrated circuit packaging.

Figure 24C:
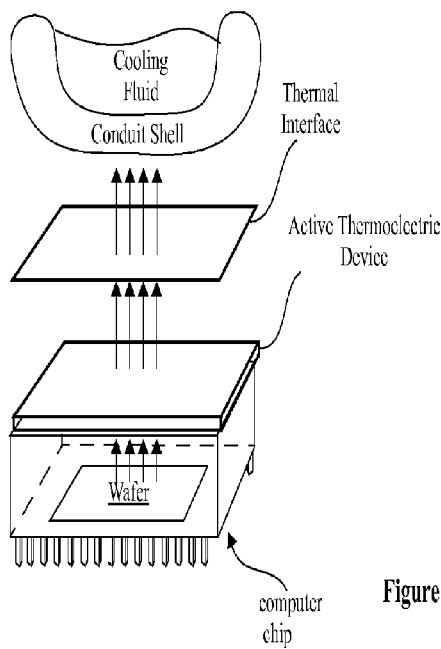
FIG. 24c depicts an alternative or supplemental thermal interface provided by an article of integrated circuit packaging wherein the thermal interface is located on one or more sides of the integrated circuit packaging.

FIG. 24c depicts an alternative or supplemental thermal interface provided by an article of integrated circuit packaging wherein the thermal interface is located on one or more sides of the integrated circuit packaging.

Figure 24D:
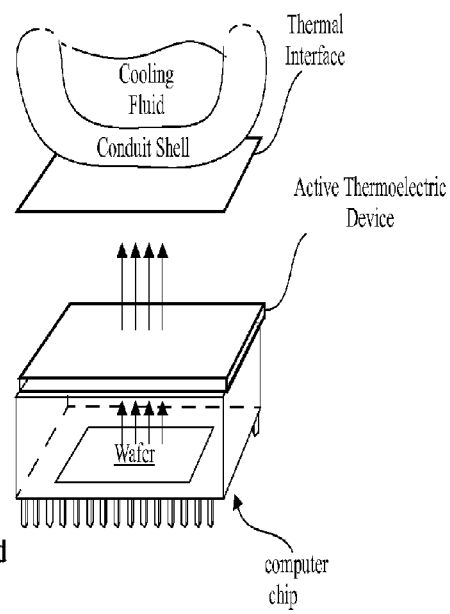
FIG. 24d depicts an alternative or supplemental thermal interface provided by an article of integrated circuit packaging wherein the thermal interface is located within the integrated circuit packaging.

FIG. 24d depicts an alternative or supplemental thermal interface provided by an article of integrated circuit packaging wherein the thermal interface is located within the integrated circuit packaging. In some arrangements, the internal thermal interface can be accessed via one or more openings in the integrated circuit packaging. The one or more openings can be in the form of a window, a fastener (for example a threaded hole, a mating thermal connector, etc.).

In an embodiment, the invention provides for the placement of thermoelectric material inside, on top of, on the bottom of or around a chip package in order to retrofit existing computer chips in lieu of using chip packages adapted with internal features provided for by the invention.

Figure 25A:
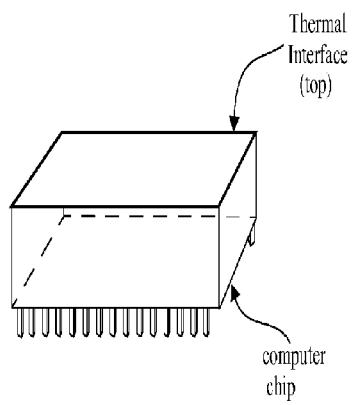
FIG. 25a represents a thermal interface that is built upon the top of a computer chip.

FIG. 25a represents a thermal interface that is built upon the top of a computer chip.

Figure 25B:
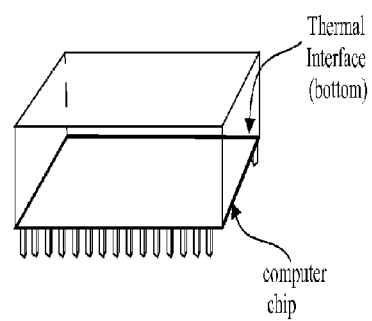
FIG. 25b shows a thermal interface that is built on the bottom of a computer chip.

FIG. 25b shows a thermal interface that is built on the bottom of a computer chip.

Figure 25C:
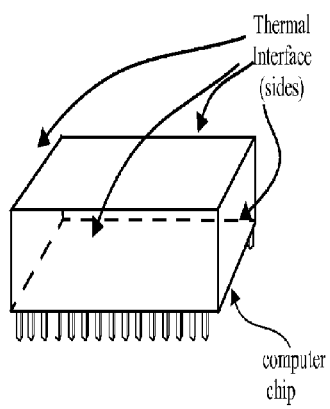
FIG. 25c illustrates a thermal interface that is placed inside a computer chip packaging and makes an appearance at the edge of the chip packaging.

FIG. 25c illustrates a thermal interface that is placed inside a computer chip packaging and makes an appearance at the edge of the chip packaging.

Figure 25D:
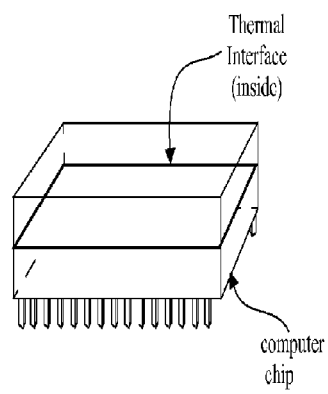
FIG. 25d depicts a thermal interface that is built around a computer chip (i.e. the computer chip package is largely contained within the thermal interface).

FIG. 25d depicts a thermal interface that is built around a computer chip (i.e. the computer chip package is largely contained within the thermal interface).

4. Micro-Droplet (a.k.a. "Digital") Microfluidic IC Chip Cooling and Heat Transport Micro-droplet microfluidic cooling is also currently under research and development, some employing some minor interworking with thermoelectric devices. Treatment of such approaches employing planar (two-dimensional) micro-droplet transport can be found in [1] and the references therein, and approaches employing three-dimensional and multiple-layer micro-droplet transport are taught in U.S. Patent Application 61/599,643.

Figure 26A:
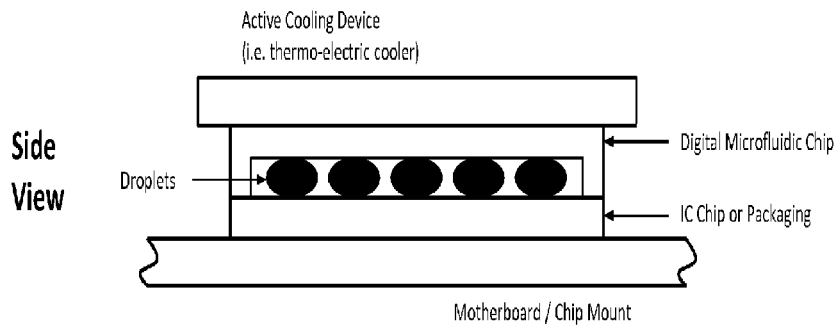
FIG. 26a (adapted from *Adaptive Cooling of Integrated Circuits Using Digital Microfludics* by P. Paik, K. Chakrabarty, and V. Pamula, 2007, ISBN 13: 978-1-59693-138-1) depicts a side view representation of a microfluidic electrowetting micro-droplet transport "chip" implementation fitted over an integrated circuit package and in turn in thermal contact with an active cooling element such as a thermoelectric cooler.
Figure 26B:
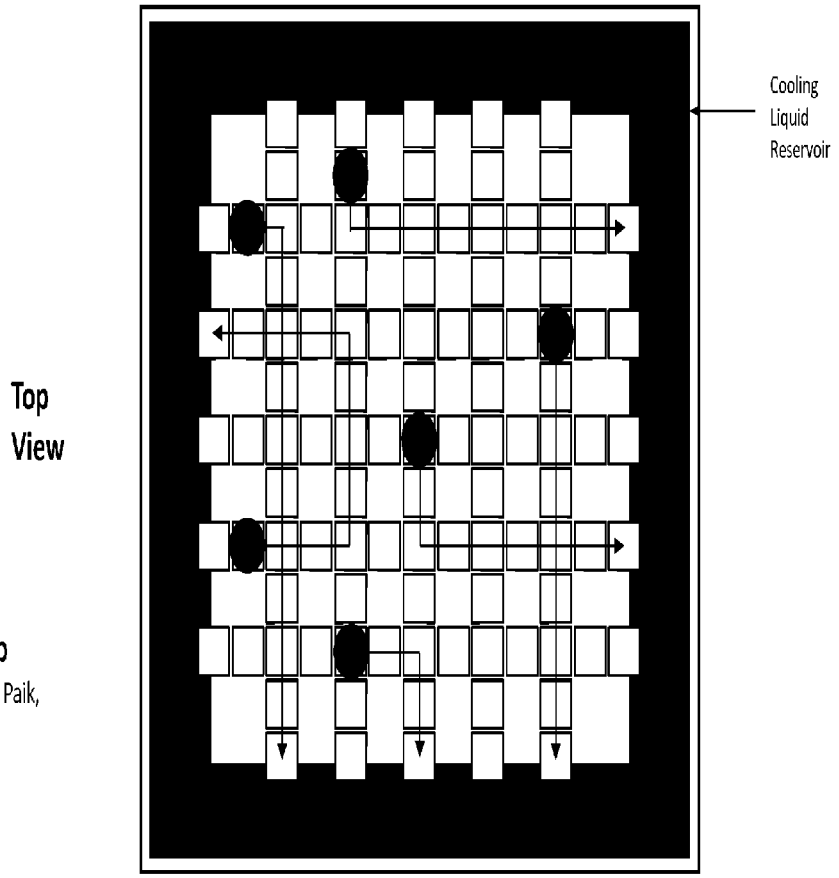
FIG. 26b (adapted from *Adaptive Cooling of Integrated Circuits Using Digital Microfludics* by P. Paik, K. Chakrabarty, and V. Pamula, 2007, ISBN 13: 978-1-59693-138-1) depicts a top view representation of a number of micro-droplets being transported (via electrowetted transport) through various straight and right-angle-turn paths over a planar array of microelectrodes comprised by such a microfluidic electrowetting micro-droplet "chip."

In [1] the authors describe first other approaches and general aspects of controlled electrowetting micro-droplet transport via microfluidic device structures. For example, FIG. 26a, adapted from the afore-cited text, depicts a side view representation of a microfluidic electrowetting micro-droplet transport "chip" implementation fitted over an integrated circuit package and in turn in thermal contact with an active cooling element such as a thermoelectric cooler. Additionally, FIG. 26b, adapted from the afore-cited text, depicts a top view representation of a number of micro-droplets being transported (via electrowetted transport) through various straight and right-angle-turn paths over a planar array of microelectrodes comprised by such a microfluidic electrowetting micro-droplet "chip." The micro-droplets are transported over the planar array of microelectrodes in tightly-controlled fashion by temporally sequencing the electric potential applied to individual microelectrodes. The micro-droplets are moved into areas of thermal contact with portions of a heat-producing integrated circuit dye, housing, packaging, heat-sink, etc., where they absorb heat and then are moved to other areas, volumes, or reservoirs where the absorbed heat can be discharged, for example by means of an active cooling element such as a thermoelectric cooler. In addition to the transport of micro-droplets, those authors describe various means of controlling the surface-area and temporal duration of micro-droplets exposure to heat sources, droplet routing strategies, and other innovations. Also useful experimental data resulting from prototypes are reported, including the fact that larger droplets with longer exposure times to heat sources perform cooling functions better than smaller droplets with shorter exposure times to heat sources.

Figure 26C:
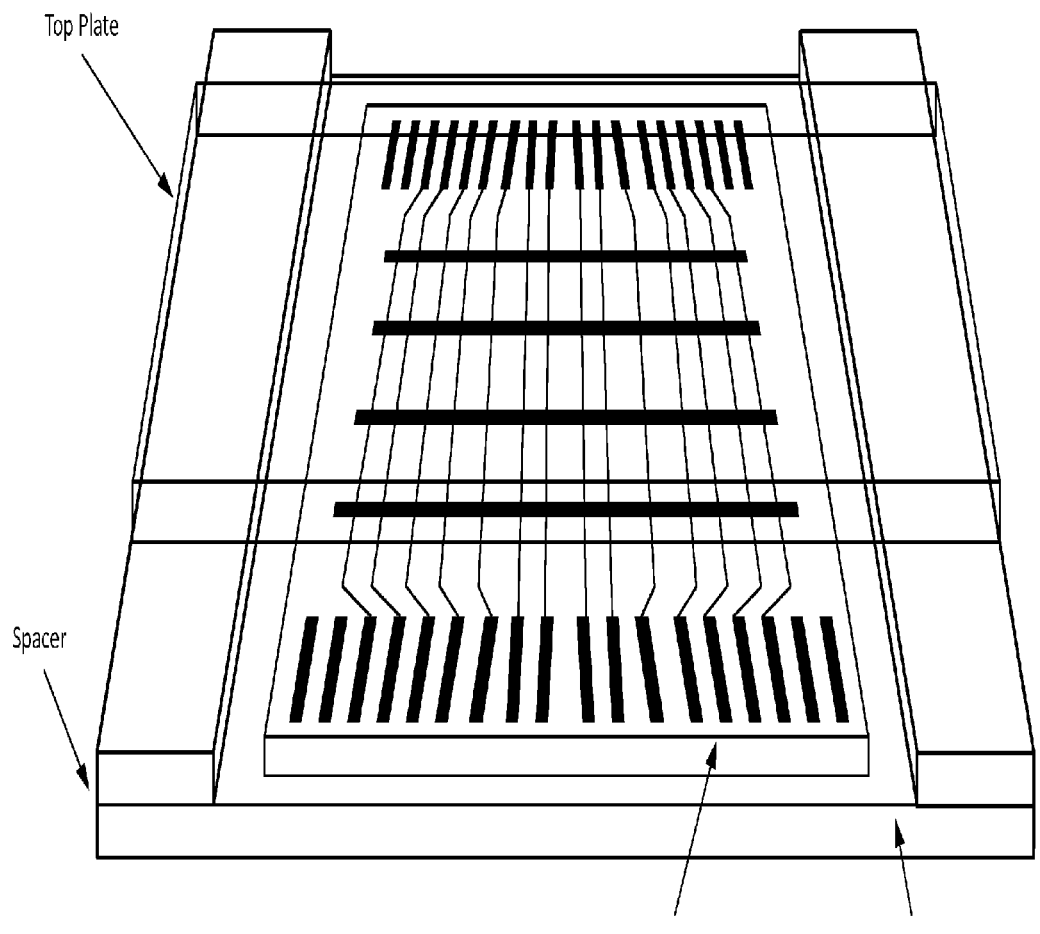
FIG. 26c (adapted from [1]) depicts a general planar microfluidic micro-droplet transport arrangement.

FIG. 26c (adapted from [1]) depicts a general planar microfluidic micro-droplet transport arrangement.

Figure 26D:
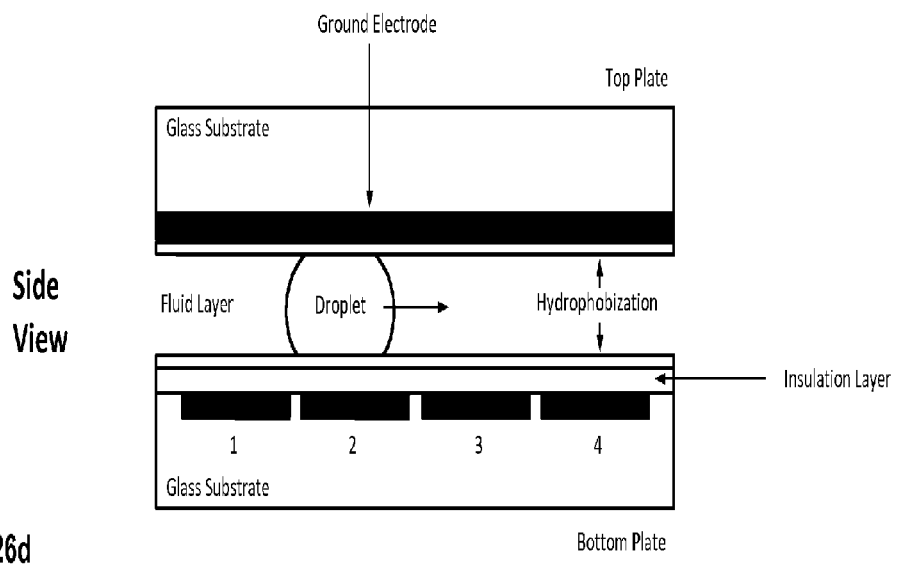
FIG. 26d (adapted from [1]) depicts a "side view" of electrowetting transport of a micro-droplet through the microfluidic transport arrangement via sequencing of potential applied to microelectrodes 1, 2, 3, and 4.

FIG. 26d (adapted from [1]) depicts a "side view" of electrowetting transport of a micro-droplet through the microfluidic transport arrangement via sequencing of potential applied to microelectrodes 1, 2, 3, and 4.

Figure 26E:
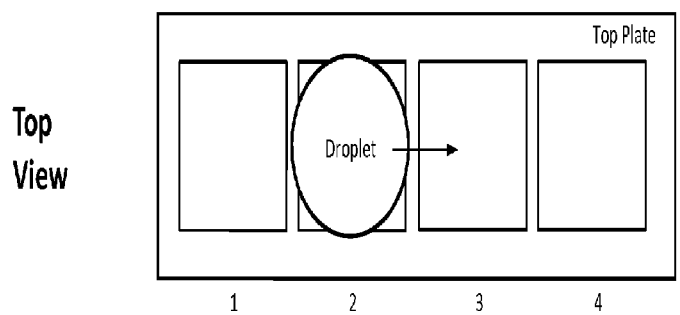
FIG. 26e (adapted from [1]) depicts a "top view" motion of the micro-droplet via electrowetting transport through the microfluidic transport arrangement of FIG. 26d.

FIG. 26e (adapted from [1]) depicts a "top view" motion of the micro-droplet via electrowetting transport through the microfluidic transport arrangement of FIG. 26d.

Figure 27A:
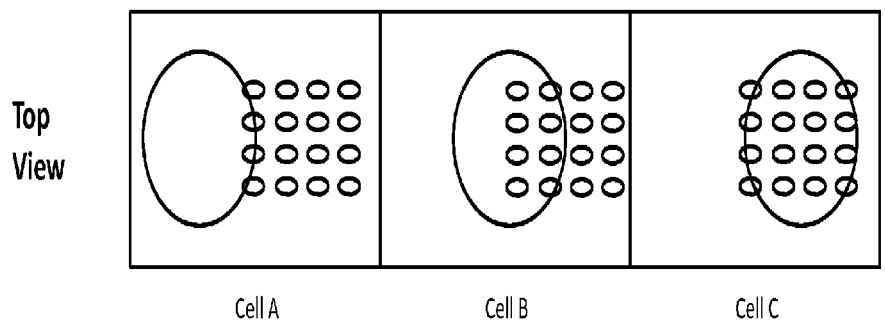
FIG. 27a and FIG. 27b (adapted from [1]) depict "top" and "side" views of a first heat transfer contact (graded) modulation scheme explained in [1].
Figure 27B:
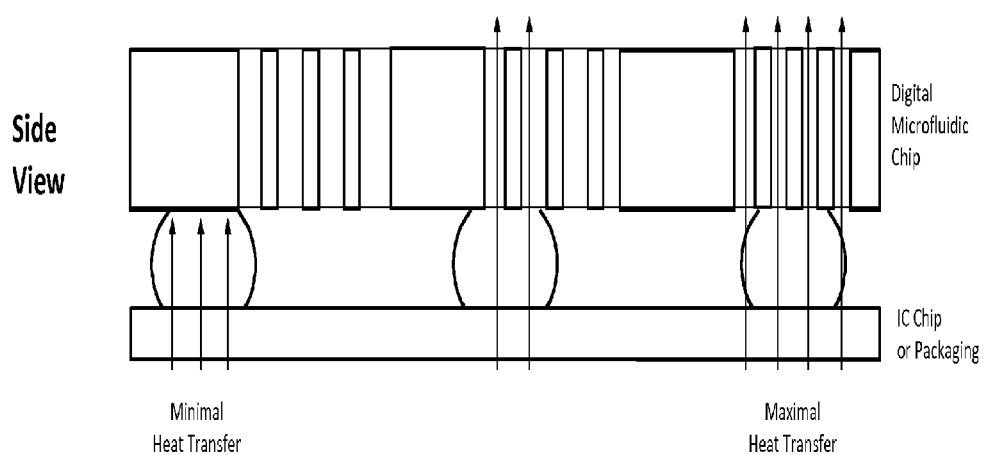

FIG. 27a and FIG. 27b (adapted from [1]) depict "top" and "side" views of a first heat transfer contact (graded) modulation scheme explained in [1].

Figure 27C:
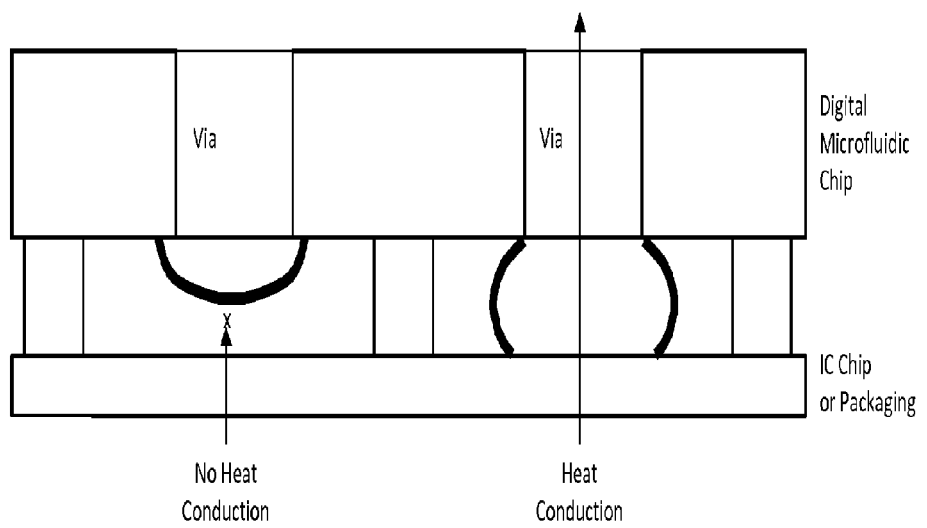
FIG. 27c (adapted from [1]) depicts a second heat transfer contact (on-off) modulation scheme explained in [1].

FIG. 27c (adapted from [1]) depicts a second heat transfer contact (on-off) modulation scheme explained in [1].

The arrangements described above can also be applied to printed circuit boards as taught, for example, in [1] Chapter 6. Extensions and improvements of these techniques are also possible, for example as taught in U.S. Patent Application 61/599,643.

Figure 29A:
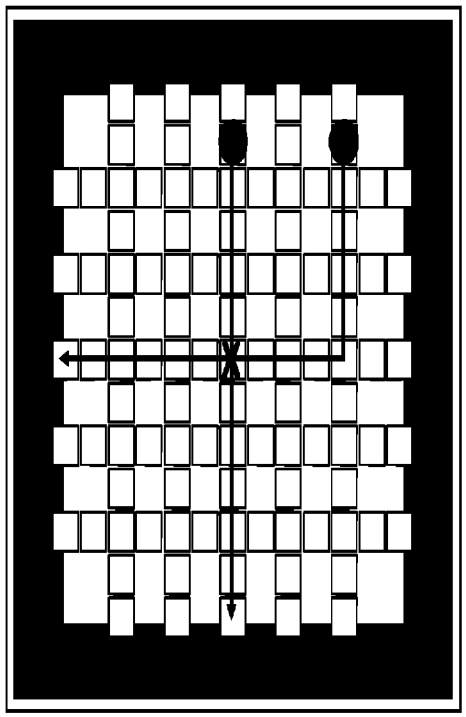
FIGS. 29a and 29b (each adapted from [1]) depict example routing paths of micro-droplets over the planar microelectrode array.
Figure 29B:
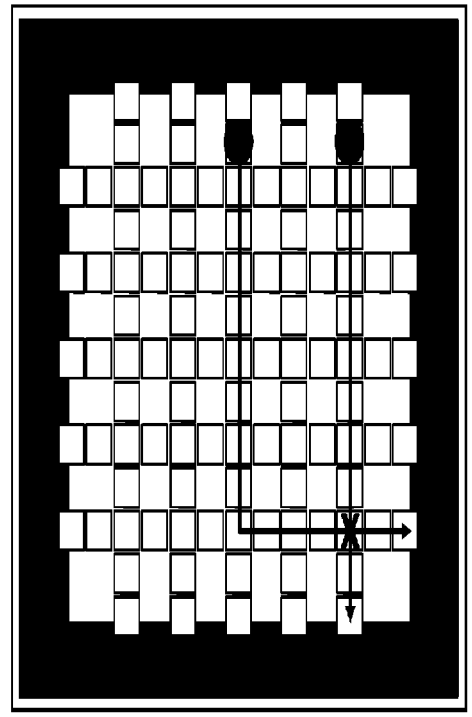

In [1] Chapter 6 the authors describe adapting microfluidic electrowetting micro-droplet planar microelectrode array and micro-droplet transport to implementations using Printed Circuit Boards ("PCBs"). Two approaches are considered in some detail, these being the "confined system" represented in FIG. 28b and the "open system" represented in FIG. 28b. In each of these systems, micro-droplets are moved into areas of thermal contact with portions of a heat-producing integrated circuit dye, housing, packaging, heat-sink, etc., where they absorb heat and then are moved (via sequencing the electric potential applied to the microelectrodes) to other areas, volumes, or reservoirs where the absorbed heat can be discharged. FIGS. 29a and 29b (each adapted from [1]) depict example routing paths of micro-droplets over the planar microelectrode array.

Figure 30:
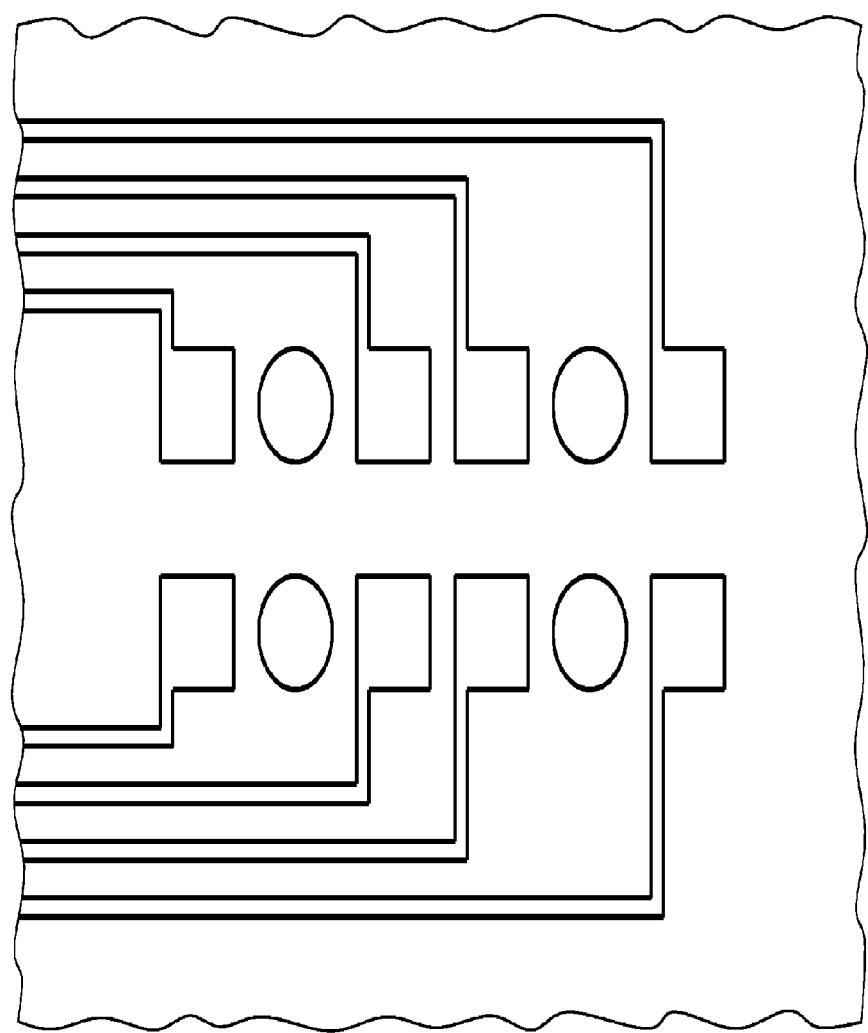

FIG. 30 depicts an representation of the "top" or "bottom" view an example array of microelectrodes, each microelectrode rendered as conductor area on a Printed Circuit Board (PCB) and provided with an associated electrically-conducting "trace" for electrically connecting the microelectrode to voltage potential control circuitry, and interspersed between some pairs of electrodes a physical open hole suitable for a micro-droplet to travel through. (The subsequent remaining Figures in this section, namely FIGS. 31-38, depict a side-view representation incorporating a side-view of the arrangement in FIG. 30.)

Figure 31:
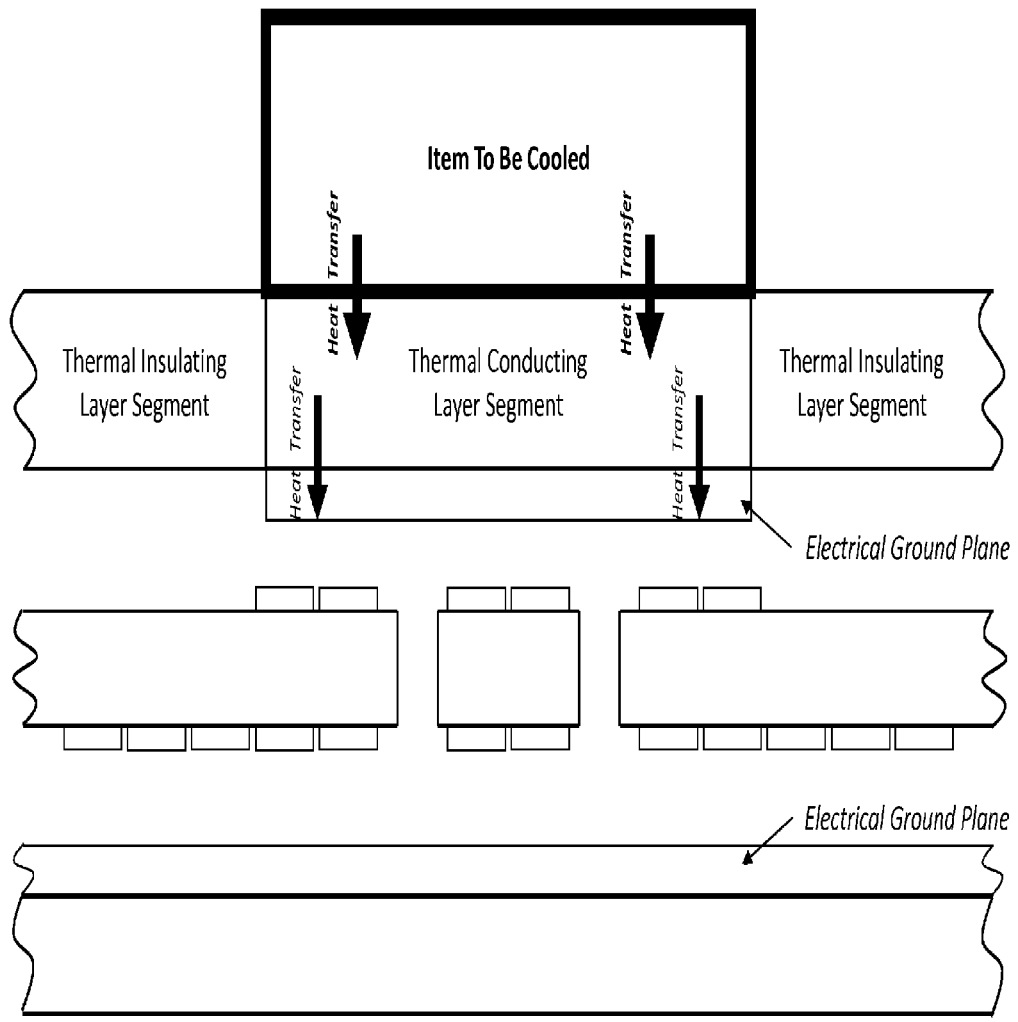
FIG. 31 depicts a side-view representation of an example two-layer micro-droplet transport arrangement with conduits linking the two micro-droplet transport region. This Figure incorporates a side-view of the arrangement like that depicted in FIG. 30. The view shown in FIG. 30 would herein lie in the center facing downwards and comprises additional microelectrodes; two of the physical open holes suitable for a micro-droplet to travel through depicted in FIG. 30 appear (in side-view) in FIG. 31 as the conduits linking the two micro-droplet transport region. In the depiction of FIG. 31, above the upper micro-droplet transport region is a solid layer of PCB material punctuated with thermally-conducting segments that conduct heat from the item to be cooled into the upper micro-droplet transport region.

FIG. 31 depicts a side-view representation of an example two-layer micro-droplet transport arrangement with conduits linking the two micro-droplet transport region. This Figure incorporates a side-view of the arrangement like that depicted in FIG. 30. The view shown in FIG. 30 would herein lie in the center facing downwards and comprises additional microelectrodes; two of the physical open holes suitable for a micro-droplet to travel through depicted in FIG. 5 appear (in side-view) in FIG. 31 as the conduits linking the two micro-droplet transport region. In the depiction of FIG. 31, above the upper micro-droplet transport region is a solid layer of PCB material punctuated with thermally-conducting segments that conduct heat from the item to be cooled into the upper micro-droplet transport region. In this example embodiment, the punctuating thermally-conducting segments are also electrical conductors configured to serve as an electrical ground plane that provides both electrical shielding and serves as the ground plane for forming electric fields for micro-droplet transport via electrowetting. Also in the depiction of FIG. 31, below the lower micro-droplet transport region is a solid layer of material (for example, PCB material) whose upper area comprises an electrical conductor layer configured to serve as an electrical ground plane that provides both electrical shielding and serves as the ground plane for forming electric fields for micro-droplet transport via electrowetting.

The arrangements for at least Printed Circuit Boards described above have many shortcomings, and many of these are addressed (along with additional advantages) by the three-dimensional micro-droplet routing arrangements taught in U.S. Patent Application 61/599,643.

However, in the afore-cited text, those authors limit themselves to planar microelectrode arrays and accordingly planar micro-droplet transport paths. For a micro-droplet exposed to heat in central areas of a microelectrode array and which must then be transported to the edges of the microelectrode array to dispense the absorbed heat, the micro-droplets can unfortunate radiate heat back into other portions of the heat-producing integrated circuits. Those authors allude to methods for minimizing the time over which unintended heat-radiation can occur by heated micro-droplets.

Further, the afore-cited text does not provide consideration to avoiding undesired electromagnetic field and electrical field effects that can interfere with adjacent high-performance electronic circuitry.

In addition to these issues and problems, the afore-cited text only considers the cooling of heat-producing integrated circuits. Energy harvesting is not considered.

Accordingly, the reciprocal properties of heat transfer and energy harvesting (via classical Peltier and Seebeck processes) are not considered, nor therefore arrangements to implement adaptive selection between cooling and energy harvesting modalities.

Additionally, the afore-cited text only considers traditional semiconductor thermoelectric elements and does not cite nor anticipate the far higher-efficiency quantum-based thermoelectric materials such as quantum well and Atvo metals. These transform classical Peltier and Seebeck processes to vastly different effects with not only radically improved performance crossing (for the first time) important application-feasibility thresholds but also, in many areas, entirely different engineering and economic tradeoffs.

The present invention addresses each of these, namely:
  Implementation of 3D micro-droplet transit structures suitable for thermal cooling and/or energy harvesting applications, and further doing so in a manner suitable for implementation in inexpensive multilayer Printed Circuit Boards ("PCBs");
  Incorporating electrical-field shielding in the above 3D micro-droplet transit structures and PCB implementations to avoid undesired electromagnetic field and electrical field effects that can interfere with adjacent high-performance electronic circuitry;
  Using the above 3D micro-droplet transit structures and PCB implementations to avoid undesired heat radiation by heated micro-droplets as they are transported in areas with thermal contact to the electronic component or other heat-producing element;
  Using the above 3D micro-droplet transit structures to facilitate arrangements to implement adaptive selection between cooling and energy harvesting modalities.
  Employing higher-efficiency quantum-based thermoelectric materials, such as quantum well and Atvo metals, so as to radically improved performance beyond important application-feasibility thresholds and access entirely different engineering and economic tradeoffs.

The material below is adapted from U.S. Patent Application 61/599,643.

Figure 32:
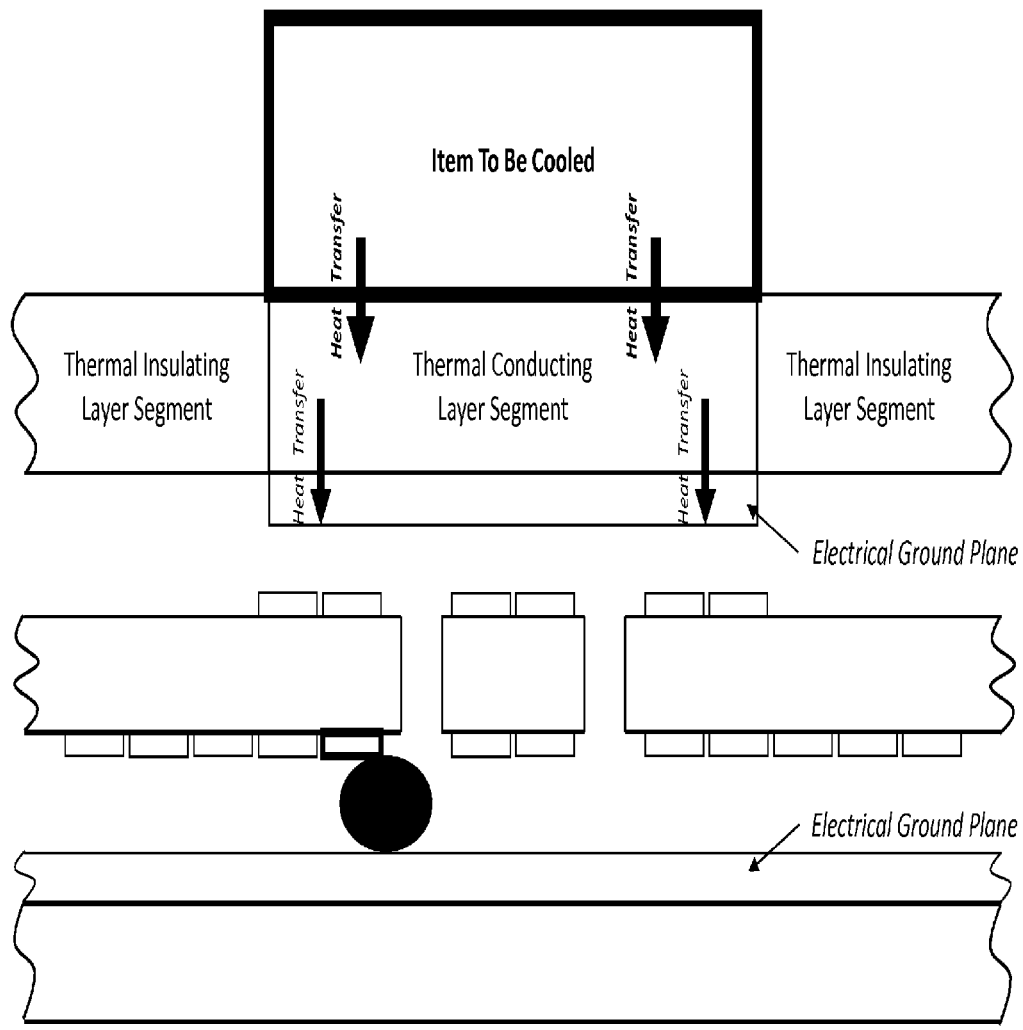
FIG. 32 (adapted from U.S. Patent Application 61/599, 643) depicts an example situation where wherein the momentum of the micro-droplet is not suppressed (i.e., the micro-droplet is not locked into position under the activated microelectrode for an interval of time) and the micro-droplet continues moving a bit beyond the immediate region crowned by the activated microelectrode. Here the micro-droplet moves towards the opening of the conduit joining the lower micro-droplet transport region and the upper micro-droplet transport region.

FIG. 32 depicts an example a situation where wherein the momentum of the micro-droplet is not suppressed (i.e., the micro-droplet is not locked into position under the activated microelectrode for an interval of time) and the micro-droplet continues moving a bit beyond the immediate region crowned by the activated microelectrode. Here the micro-droplet moves towards the opening of the conduit joining the lower micro-droplet transport region and the upper micro-droplet transport region.

Figure 33:
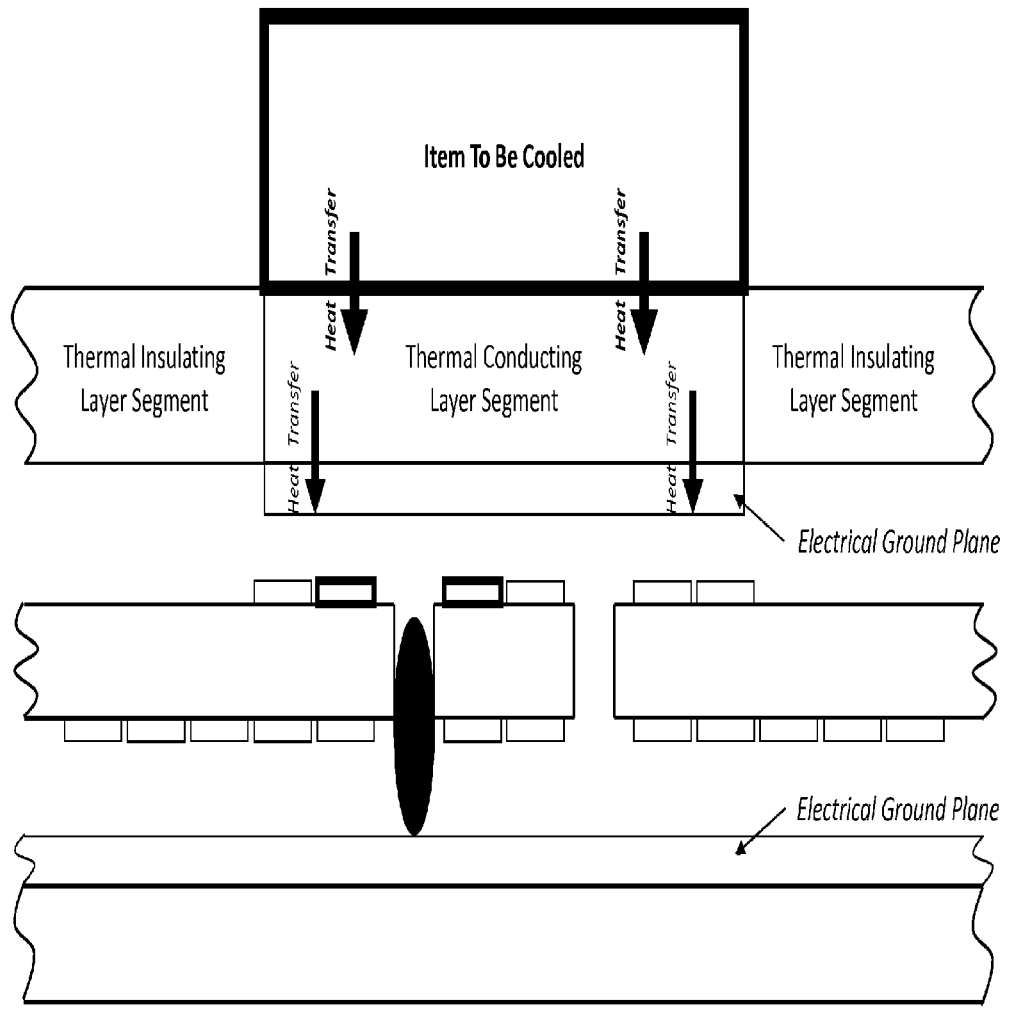
FIG. 33 (adapted from U.S. Patent Application 61/599, 643) depicts transmission through a first conduit joining two droplet-transport layers from a non-heat-gathering-layer to a heat-gathering-layer wherein the transmission through the conduits employs a component of capillary forces and electric fields from distant microelectrodes.

FIG. 33 (adapted from U.S. Patent Application 61/599,643) depicts transmission through a first conduit joining two droplet-transport layers from a non-heat-gathering-layer to a heat-gathering-layer wherein the transmission through the conduits employs a component of capillary forces and electric fields from distant microelectrodes.

Figure 34:
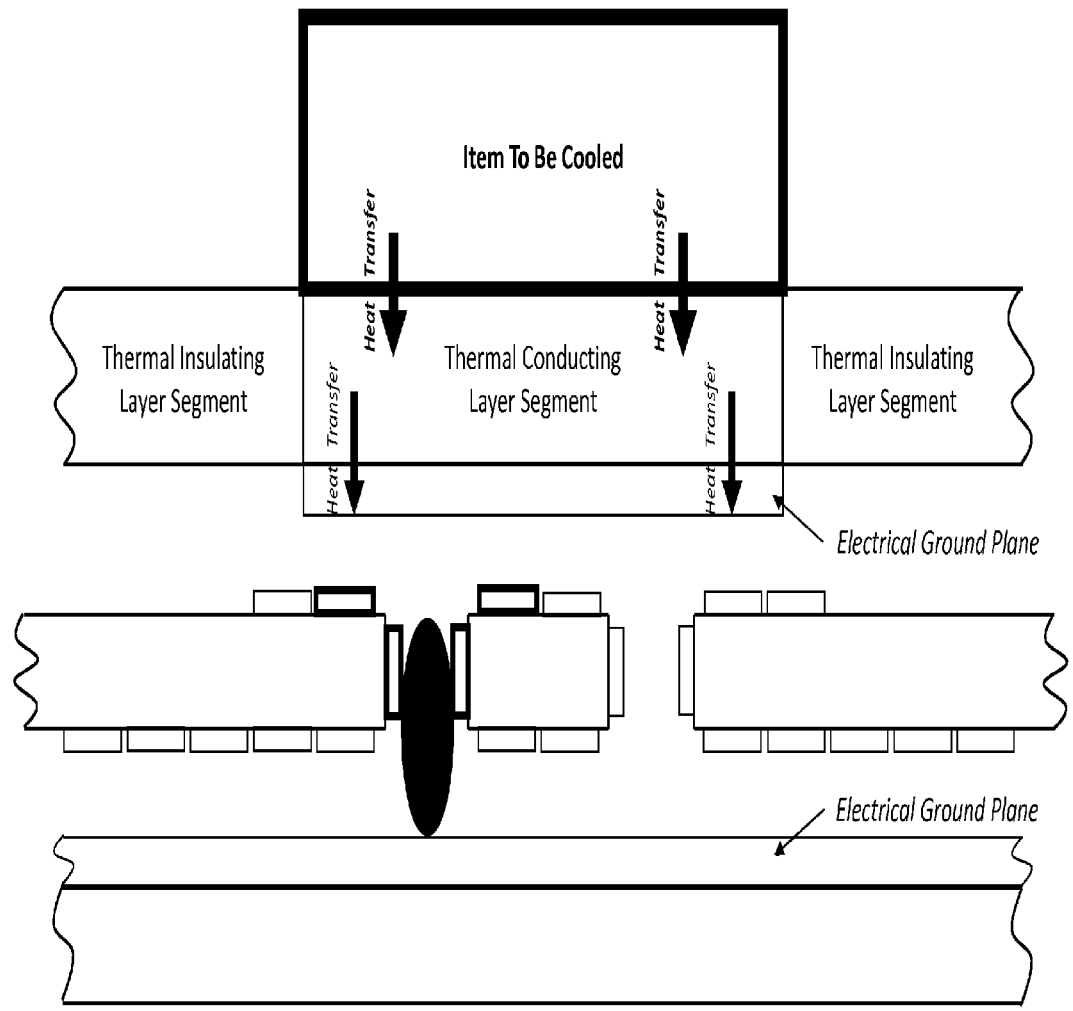
FIG. 34 (adapted from U.S. Patent Application 61/599, 643) depicts depict transmission through the first conduit joining the two droplet-transport layers wherein the transmission through the conduits employs essentially only proximate microelectrodes.

FIG. 34 (adapted from U.S. Patent Application 61/599, 643) depicts depict transmission through the first conduit joining the two droplet-transport layers wherein the transmission through the conduits employs essentially only proximate microelectrodes.

Microelectrodes can be implemented within the conduits through a variety of ways, including insertion of prefabricated cylindrical structures within the conduits. Further, the voltage potential applied to microelectrodes within the conduit in various implementations and transport schemes take on different values over time, for example sometime the electrowetted transport voltage potential and sometimes the ground plane voltage potential. In some implementations and transport schemes, other voltage potentials can also or alternatively be used so as to manipulate the path and shape of the micro-droplet as advantageous. Other approaches differing in various ways from that depicted in this series of figures can also be used and are anticipated by the invention.

While in the upper transport region the micro-droplet absorbs heat generated by the item to be cooled through the thermal conducting layer segment and electrical ground plane, or via other arrangements in alternate implementations. The absorbed heat in the resulting heated micro-droplets can then be transported to other regions where the heat can be processed in various ways (as in the examples to be described as well as other ways applicable to various applications and/or alternate embodiments of the invention).

Figure 35:
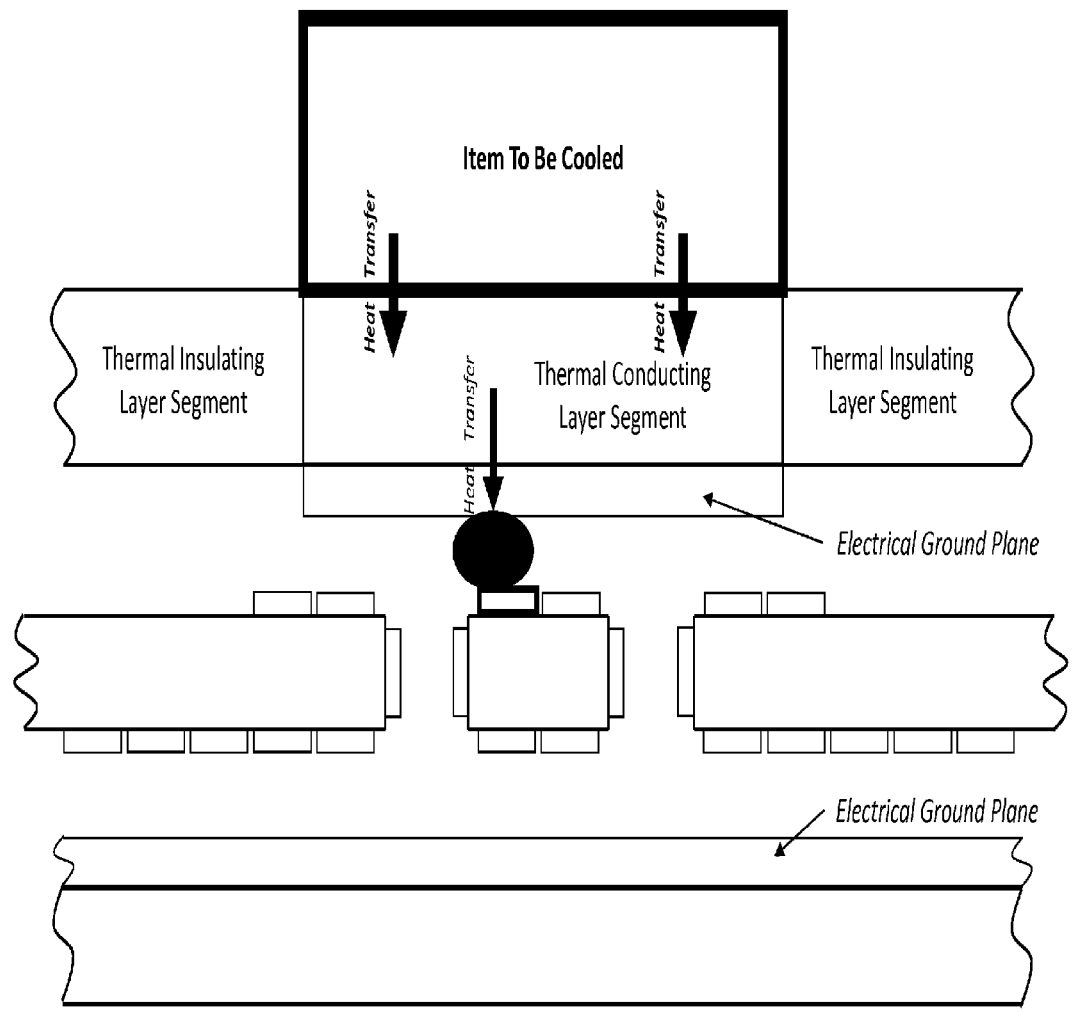
FIG. 35 (adapted from U.S. Patent Application 61/599, 643) depicts example transmission through the first conduit joining the two droplet-transport layers.

FIG. 35 (adapted from U.S. Patent Application 61/599, 643) depicts example transmission through the first conduit joining the two droplet-transport layers.

Figure 36:
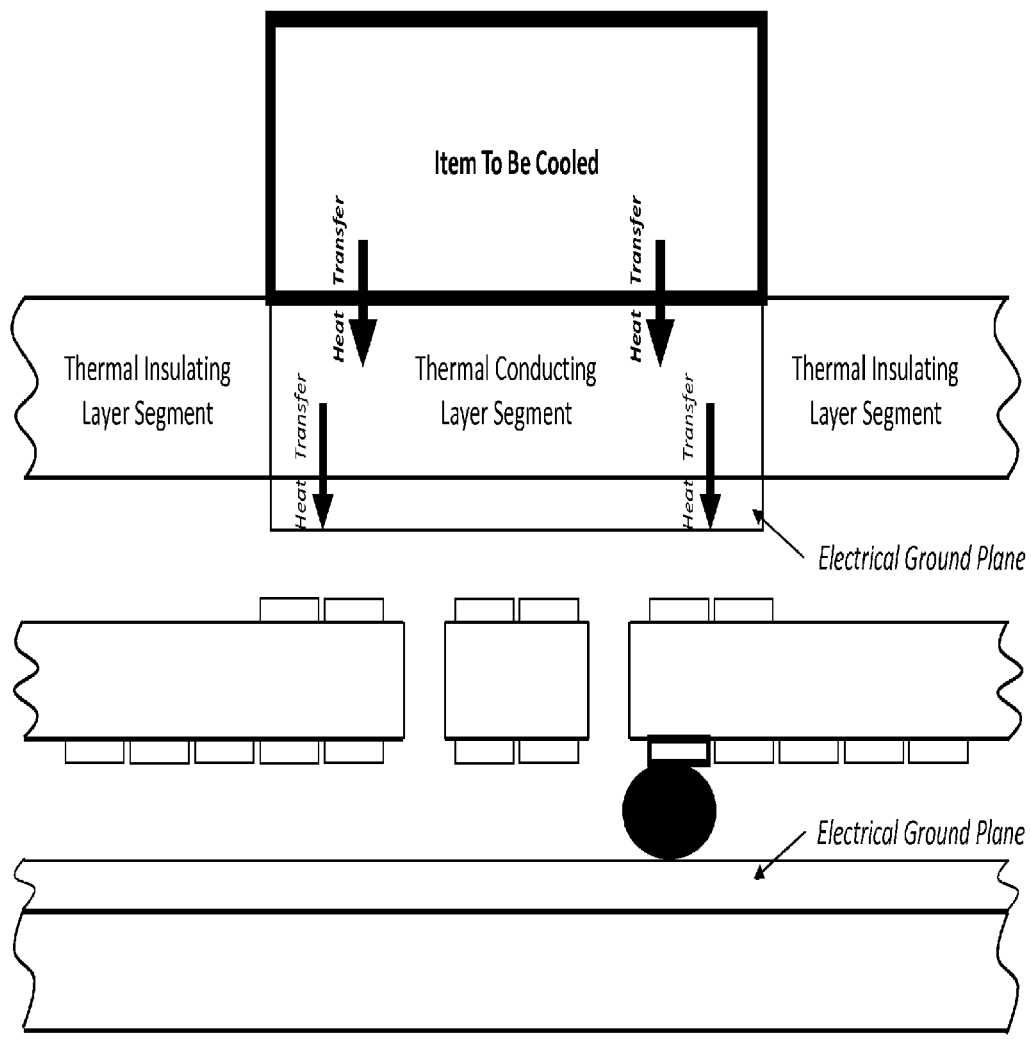
FIG. 36 (adapted from U.S. Patent Application 61/599, 643) depicts the attraction of the micro-droplet to a region immediately to the right of the second conduit joining the two droplet-transport regions via activation of the microelectrode immediately to the right of the second conduit joining the two droplet-transport regions.

FIG. 36 (adapted from U.S. Patent Application 61/599, 643) depicts the attraction of the micro-droplet to a region immediately to the right of the second conduit joining the two droplet-transport regions via activation of the microelectrode immediately to the right of the second conduit joining the two droplet-transport regions.

Figure 37:
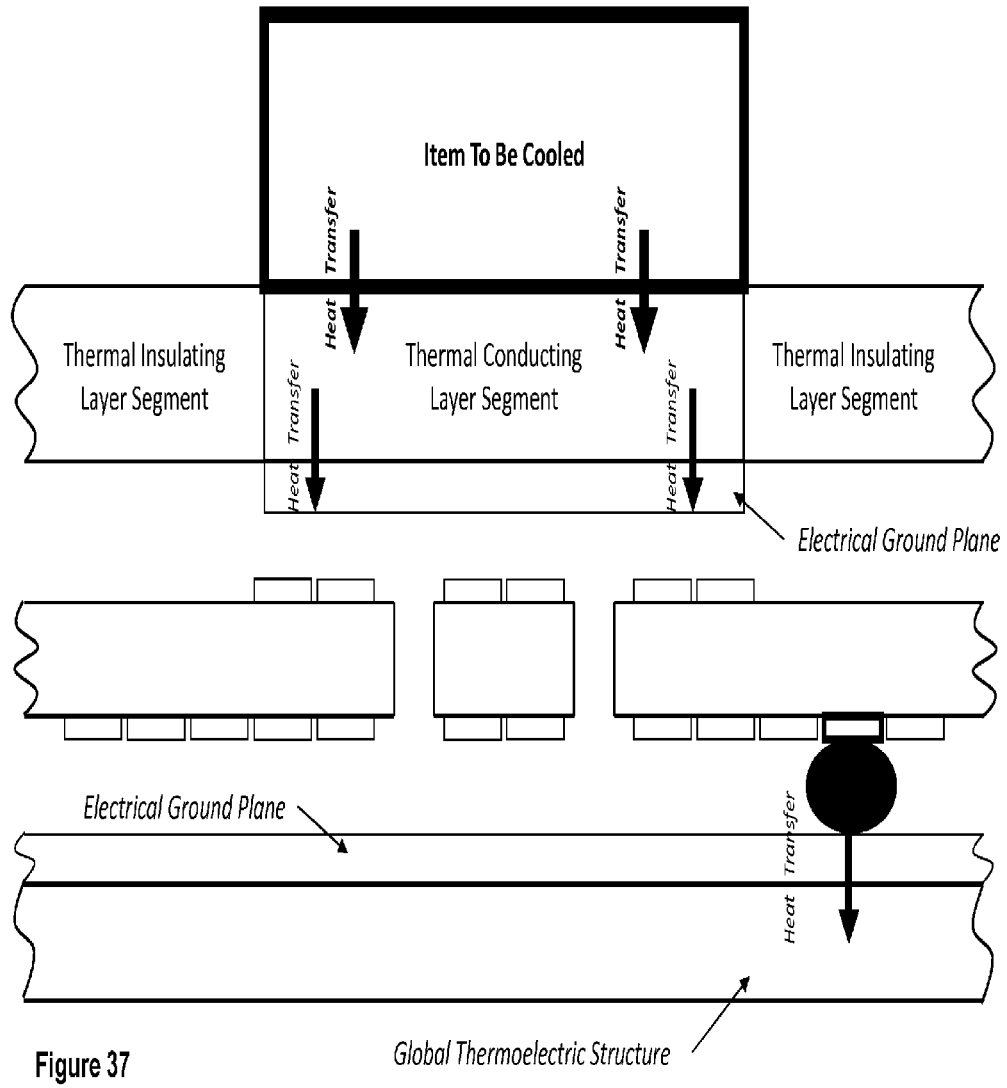
FIG. 37 (adapted from U.S. Patent Application 61/599, 643) depicts a representation of heat transfer from the previously heated micro-droplet to the electrical ground plane and further into the material joined to the electrical ground plane wherein the material joined to the electrical ground plane comprises a "global" (large area) thermoelectric structure.

FIG. 37 (adapted from U.S. Patent Application 61/599, 643) depicts a representation of heat transfer from the previously heated micro-droplet to the electrical ground plane and further into the material joined to the electrical ground plane wherein the material joined to the electrical ground plane comprises a "global" (large area) thermoelectric structure.

In various embodiments the thermoelectric structure can be a thermoelectric cooler, a thermoelectric electric current generator, or a reciprocal thermoelectric device capable of operating in either a thermoelectric cooler or a thermoelectric electric current generator as determined by imposed thermal conditions and electrical connections to the reciprocal thermoelectric device. In an embodiment, the role of electrical ground plane (used for micro-droplet transport) can be served by the electrical conditions and physical location of a portion of the thermoelectric device itself (such as electrically conducting material joining two legs of the thermoelectric device). In some embodiments, the role of electrical shielding (from electrical field and electromagnetic generation noise) can also be served by the electrical conditions and physical location of the same portion of the thermoelectric device itself. In other embodiments, the role of electrical shielding can also be served by the electrical conditions and physical location of another portion of the thermoelectric device itself. In yet other embodiments, the role of electrical shielding can also be served by another electrical shielding element.

Additionally, in some embodiments, the thermoelectric device can serve as a temperature sensor.

In some embodiments, the mode of the thermoelectric device is switched over time. As one example, the thermoelectric device can be a thermoelectric cooler one moment and a temperature sensor at another moment. As another example, the thermoelectric device can be a thermoelectric electric current generator one moment and a temperature sensor at another moment. As yet another example, the thermoelectric device can be a thermoelectric cooler one moment and a thermoelectric electric current generator at another moment. As still another example, the thermoelectric device can be a thermoelectric cooler one moment, a temperature sensor at another moment, and a thermoelectric electric current generator at yet another moment.

Figure 38:
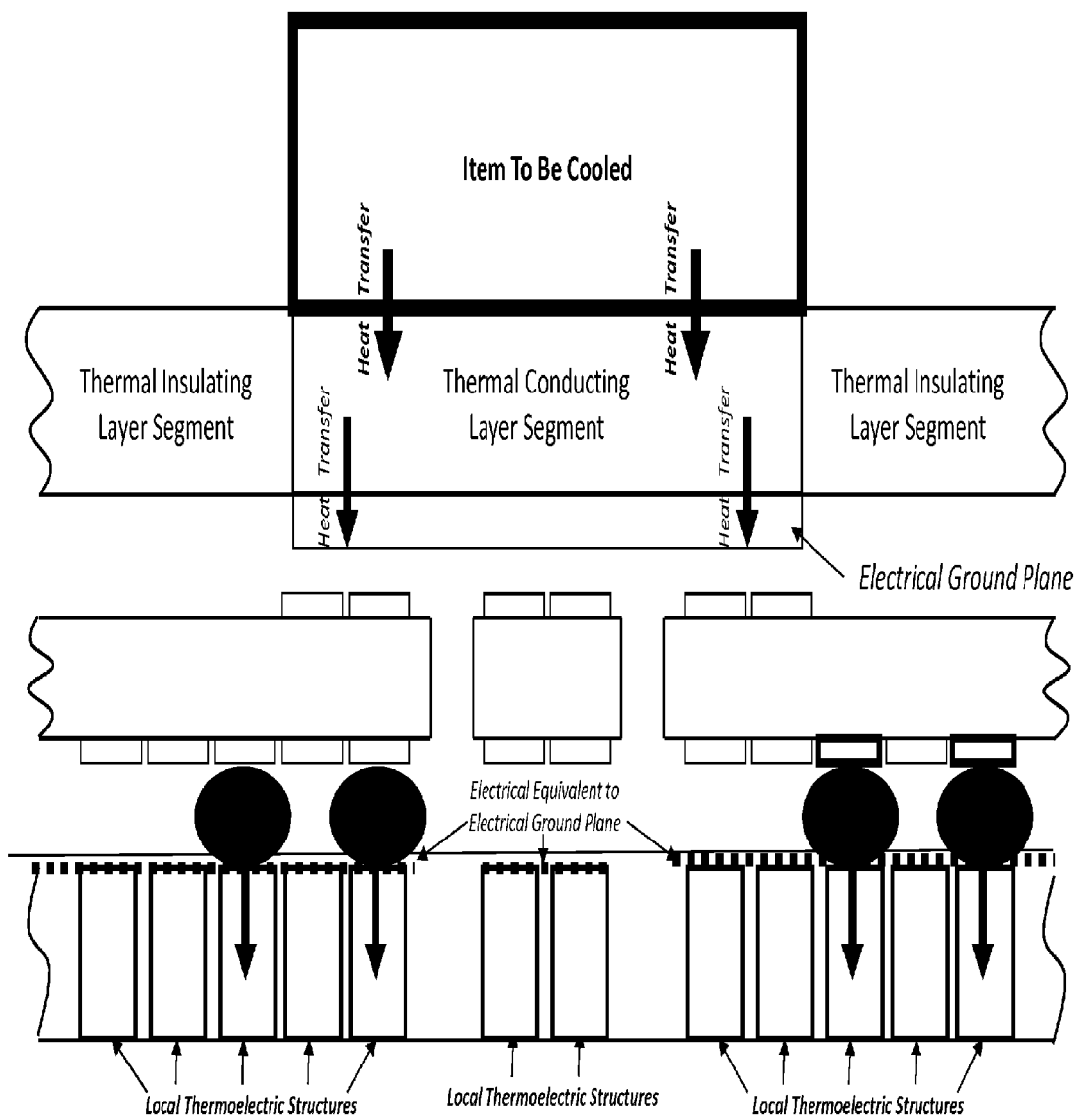
FIG. 38 (adapted from U.S. Patent Application 61/599, 643) depicts an expanding variation on the arrangement of FIG. 38 wherein the electrical ground plane depicted throughout earlier figures is replaced by an extended array of local thermoelectric structures.

FIG. 38 (adapted from U.S. Patent Application 61/599, 643) depicts an expanding variation on the arrangement of FIG. 38 wherein the electrical ground plane depicted throughout earlier figures is replaced by an extended array of local thermoelectric structures.

In an embodiment, the role of electrical ground plane can be served by the electrical conditions and physical location of a portion of the thermoelectric device itself (such as electrically conducting material joining two legs of the thermoelectric device), and the individual portion of each of the plurality of thermoelectric devices collectively serve as an electrical equivalent to an electrical ground plane used for micro-droplet transport. In some embodiments, the role of electrical shielding (from electrical field and electromagnetic generation noise) can also be served by the electrical conditions and physical location of the same portion of the thermoelectric device itself. In other embodiments, the role of electrical shielding can also be served by the electrical conditions and physical location of another portion of the thermoelectric device itself. In yet other embodiments, the role of electrical shielding can also be served by another electrical shielding element. In various embodiments, each of the local thermoelectric structures can be a thermoelectric cooler, a thermoelectric electric current generator, or a reciprocal thermoelectric device capable of operating in either a thermoelectric cooler or a thermoelectric electric current generator as determined by imposed thermal conditions and electrical connections to the reciprocal thermoelectric device.

In some embodiments, all of the local thermoelectric structures are thermoelectric coolers. In other embodiments, all of the local thermoelectric structures are thermoelectric electric current generators.

In yet other embodiments, each of the local thermoelectric structures are reciprocal thermoelectric devices capable of operating in either a thermoelectric cooler or a thermoelectric electric current generator as determined by imposed thermal conditions and electrical connections to the reciprocal thermoelectric device. In some implementations of such (i.e., all reciprocal thermoelectric device) embodiments, all local thermoelectric structures are used in the same mode at the same time. In other implementations of such (i.e., all reciprocal thermoelectric device) embodiments, a first plurality of local thermoelectric structures are used in thermoelectric cooler mode at the same time that a second non-overlapping plurality of local thermoelectric structures are used in thermoelectric electric current generator mode. In yet other implementations of such (i.e., all reciprocal thermoelectric device) embodiments, each of the local thermoelectric structures are reciprocal thermoelectric devices is configured to be independently operable in either a thermoelectric cooler or a thermoelectric electric current generator as determined by imposed thermal conditions and electrical connections to the reciprocal thermoelectric device.

Additionally, in some embodiments, at least one of the thermoelectric devices can serve as a temperature sensor.

In some embodiments, the mode of a given thermoelectric device is switched over time. As one example, a given thermoelectric device can be a thermoelectric cooler one moment and a temperature sensor at another moment. As another example, a given thermoelectric device can be a thermoelectric electric current generator one moment and a temperature sensor at another moment. As yet another example, a given thermoelectric device can be a thermoelectric cooler one moment and a thermoelectric electric current generator at another moment. As still another example, a given thermoelectric device can be a thermoelectric cooler one moment, a temperature sensor at another moment, and a thermoelectric electric current generator at yet another moment.

Arrangements such as those depicted in FIG. 38 provide a wide range of capabilities. As one example, local thermoelectric elements on the left side of the figure could remove heat from previously-heated micro-droplets and then send the cooled micro-droplets to the upper level for another cycle of heat gathering. As another example, the duration of a micro-droplets exposure to heat in the upper region can be modulated by the measured temperature of previous heated micro-droplets returning from that particular area of the item to be cooled. As yet another example, local thermoelectric elements on the left side of the figure could pre-cool micro-droplets to below-ambient temperatures and then send the extra-cool micro-droplets to the upper level for a cycle of additional heat gathering. Many other capabilities are made possible by the invention.

5. Modular Hierarchical Structure

FIG. 39 illustrates the concept that an arbitrary number of thermal interface stages can be cascaded and arranged hierarchically so as to remove heat from any number of computer chips or other heat sources, transferring the heat via an associated number of heat exchanges and subject to an arbitrary number of energy harvesting operations. Energy harvesting can occur in heat exchange and/or heat transfer steps as advantageous.

FIG. 40 illustrates the concept that heat from an arbitrary number of computer chips or other heat sources can be transferred through an arbitrary number of heat exchanges and heat transfers as proves advantageous.

FIG. 41a represents a heat-aggregating subsystem wherein heat generated by an integrated circuit chip is transferred via circulating cooling fluid or heat pipes through a plurality of levels of heat handling and aggregation. At one or more of these levels heat can be either converted to electricity, eliminated via a fan, or transferred via a heat exchange for further transfer of the heat for harvest and reuse.

FIG. 41b represents a combination of any number of subsystems to form a heat-aggregating system wherein each component subsystem is comprised as described in FIG. 41a. Such heat-aggregating systems could be formed by any number of computer cages; a heat-aggregating system could be comprised on any number of computer racks; a heat-aggregating system could be made up of any number of rack clusters; a heat-aggregating system could be formed by any number of data center floors; a heat-aggregating system could be created within a data center building; or a heat-aggregating system could be comprised of any number of data center buildings.

FIG. 41c shows multiple heat-aggregating systems wherein any number of subsystems make up each of the heat-aggregating systems and each subsystem is comprised as described in FIG. 41a. Multiple heat-aggregating systems can be formed by combining any number of computer cages, computer racks, rack clusters, data center floors, data center buildings or data center complexes.

In an embodiment, the invention provides for the adaptive collection of heat or conversion of heat to electricity from at least one integrated circuit.

In an embodiment, the invention provides for the adaptive collection of heat or conversion of heat to electricity from at least a plurality of integrated circuits forming a central computing system.

In an embodiment, the invention provides for the collection of adaptive heat or conversion of heat to electricity at the scale of a data center.

5.1 Heat-Transfer Interconnection

FIG. 42a depicts an abstract thermodynamic representation of a passive heat transfer arrangement for the transfer heat from a hotter heat transport system to a cooler heat transport system.

FIG. 42b depicts an abstract thermodynamic representation of a heat transfer arrangement transfer heat from a hotter heat transport system to a cooler heat transport system further comprising a heat engine, generating energy or work. such a system can be used for opportunistic energy harvesting, for example under the careful operation of a control system.

FIG. 42c depicts an abstract thermodynamic representation of a heat transfer arrangement comprising a heat pump, using energy or work to uni-directionally transfer heat from a hotter heat transport system to a cooler heat transport system. Such an arrangement can be used to improve the rate of heat transfer and prevent a "stall" in heat transfer should both depicted heat transport systems operate at roughly the same temperature (for example, in heavy heat situations).

Figure 43A:
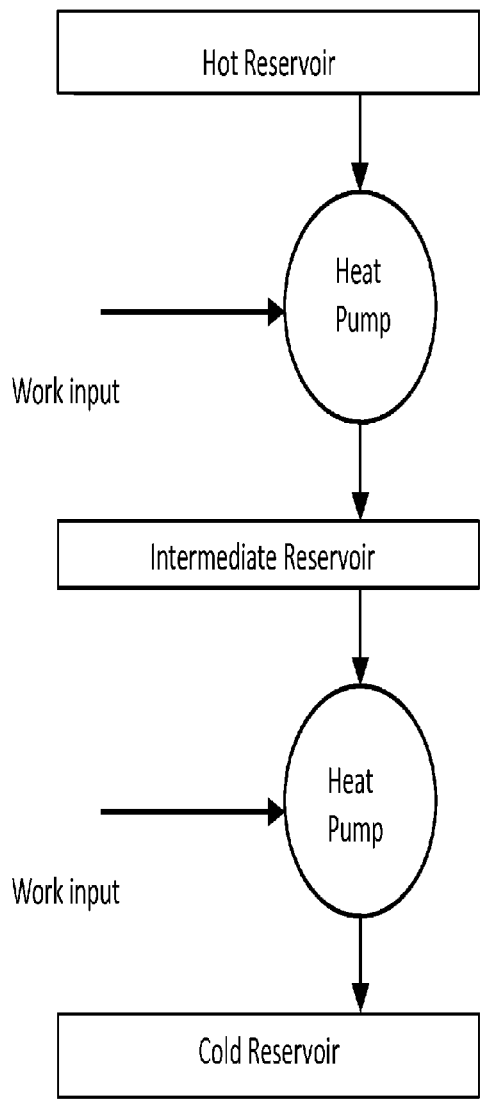
FIG. 43a and FIG. 43b depict a two-stage heat transfer arrangement that can be used to illustrate how the arrangement represented by FIG. 42b can further be used for opportunistic energy harvesting, for example under the careful operation of a control system. At times when there is extra heat buildup, one of the thermoelectric heat engines can be mode switched to act as a thermoelectric heat pump.
Figure 43B:
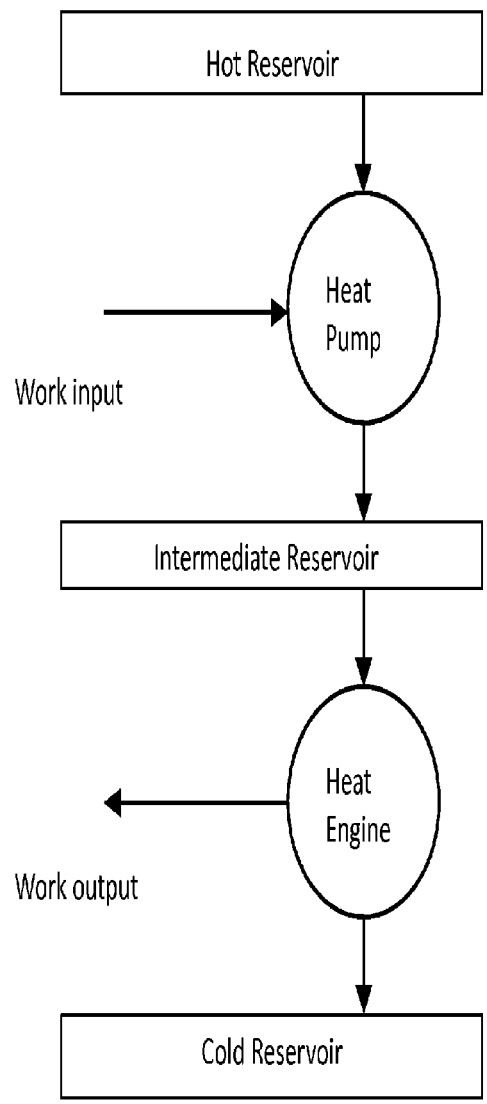

FIG. 43a and FIG. 43b depict a two-stage heat transfer arrangement that can be used to illustrate how the arrangement represented by FIG. 42b can further be used for opportunistic energy harvesting, for example under the careful operation of a control system. At times when there is extra heat buildup, one of the thermoelectric heat engines can be mode switched to act as a thermoelectric heat pump.

Figure 44A:
FIG. 44a illustrates an arbitrary system (or subsystem) being connected to another system (or subsystem) by pressure contact.
Figure 44B:
FIG. 44b illustrates an arbitrary system (or subsystem) being connected to another system (or subsystem) by fastener-facilitated contact (for example using threaded fastener arrangements).
Figure 44C:
FIG. 44c illustrates an arbitrary system (or subsystem) being connected to another system (or subsystem) by a mating arrangement (for example, spring-spread pins, friction pins, twist-lock, etc.).

FIG. 44a illustrates an example thermal interconnection arrangement by which an arbitrary system (or subsystem) can be thermally connected to another system (or subsystem) by pressure contact. FIG. 44b illustrates an example thermal interconnection arrangement by which an arbitrary system (or subsystem) can be thermally connected to another system (or subsystem) by fastener-facilitated contact (for example using threaded fastener arrangements). FIG. 44c illustrates an example thermal interconnection arrangement by which an arbitrary system (or subsystem) can be thermally connected to another system (or subsystem) by a mating arrangement (for example, spring-spread pins, friction pins, twist-lock, etc.).

In embodiments of any of these, or other, example thermal interconnection arrangements, heat can be transferred from one system/subsystem to the next via metal or heat-conducting polymers, ceramics, composites, etc.

In embodiments of any of these, or other, example thermal interconnection arrangements, the invention provides for one or both ends of the thermal interface to be constructed from thermoelectric materials.

In embodiments of any of these, or other, example thermal interconnection arrangements, the invention provides for one or both ends of the thermal interface to be constructed from arrays of thermoelectric devices. In an embodiment, the operational modes of these thermoelectric devices are controlled by a control system.

5.2 Modular Hierarchical Heat Transfer, Energy Harvesting, and Control Systems

Various arrangements for modular hierarchical heat transfer, energy harvesting, and control systems are provided for by the invention.

For example, FIG. 45 (adapted from [15]) depicts an arrangement wherein a thermoelectric device is introduced at the thermal interface between two closed loop fluid cooling systems.

Figure 46:
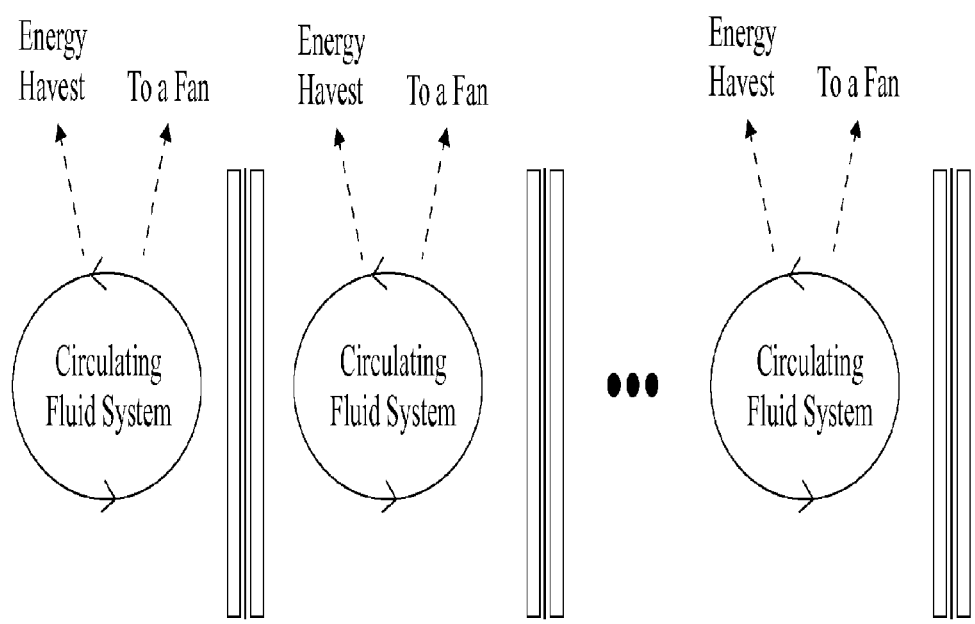
FIG. 46 depicts the component layout of a daisy-chain heat transfer arrangement employing closed systems of circulating fluids for use in a hierarchical or peer arrangement. There can be any number of circulating fluid systems from which heat can be pulled from any number of heat-generating sources for energy harvest or transfer; alternatively, any number of cooling fans can be utilized so that heat transferred from any number of heat-generating sources can be dispelled into the air.

FIG. 46 depicts the component layout of a daisy-chain heat transfer arrangement employing closed systems of circulating fluids for use in a hierarchical or peer arrangement. There can be any number of circulating fluid systems from which heat can be pulled from any number of heat-generating sources for energy harvest or transfer; alternatively, any number of cooling fans can be utilized so that heat transferred from any number of heat-generating sources can be dispelled into the air.

In an embodiment, the invention provides for the thermal interface to send the heat to a fan where air convection can be utilized to remove the heat, to feed the heat into a heat-transport interface that relies upon a circulating coolant to remove the heat, or to both.

In an embodiment, the invention provides for repeated hierarchical steps of heat transfer from thermal sources, conducted through a heat exchange or other thermal interface, and transferred to a thermal sink. In an embodiment, the hierarchy can comprise use of the heat gathered at a thermal sink at one hierarchy level to serve as the heat of the heat source in an adjacent level in the hierarchy.

In an embodiment, at any one or more places in the hierarchy, energy harvesting operations can be introduced.

In an embodiment, energy harvesting operations convert heat into electricity.

In an embodiment, electricity created by energy harvesting operations is used to provide power for current or future heat transfer operations.

In an embodiment, an energy harvesting operation improves the efficiency of the inventive cooling system.

In an embodiment, each energy harvesting operations improve the effectiveness of the inventive cooling system.

In an embodiment, the invention provides for heat that cannot be efficiently or effectively harvested for energy to be dispersed via fan(s) at one or more suitable location(s) within the system.

In an embodiment, the invention comprises one or more heat-aggregating system and/or one or more heat-aggregating subsystems.

Figures 47, 48:
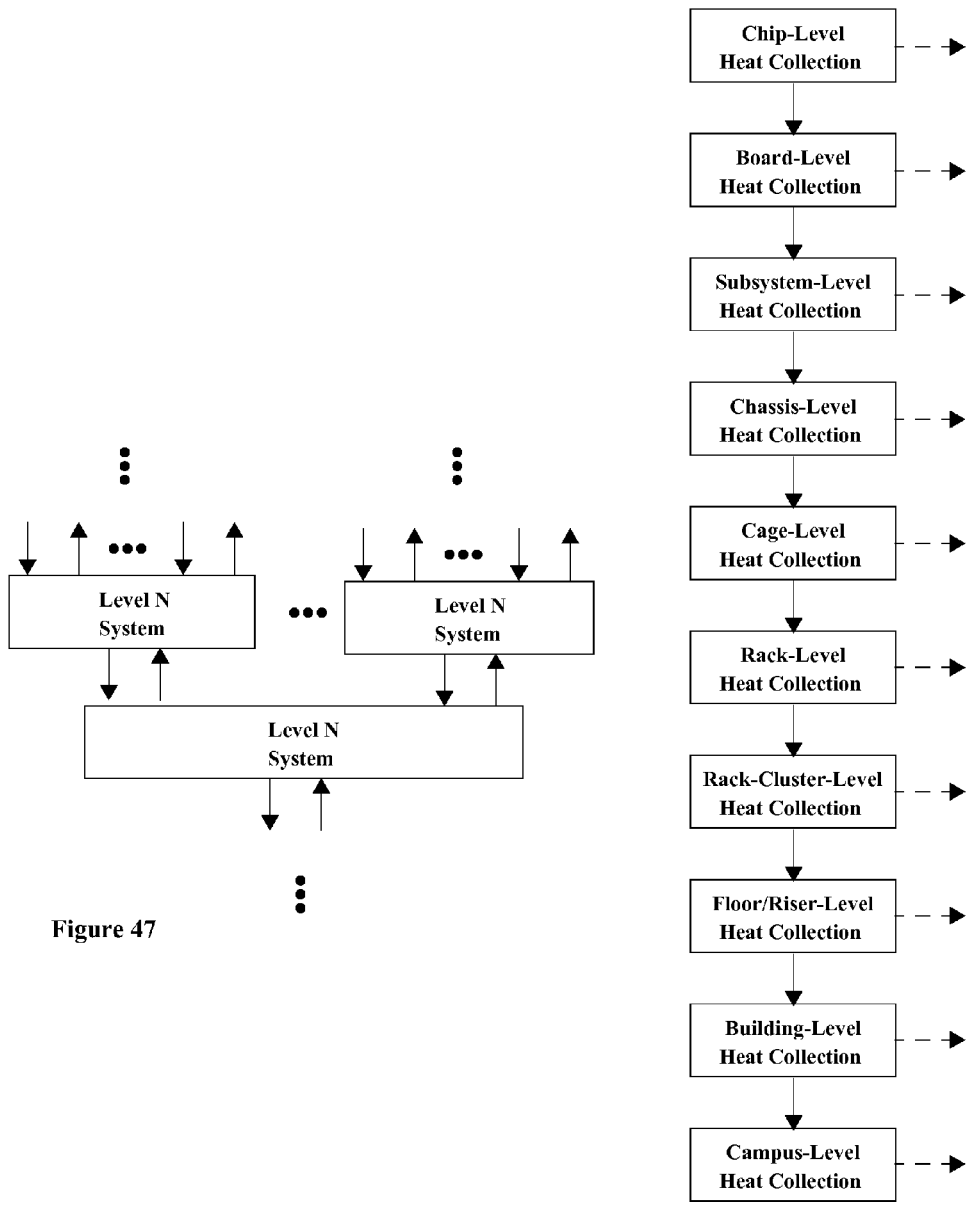
FIG. 47 illustrates two layers of a hierarchical system with a tree architecture that provides increasing degrees of hierarchical aggregation at each sequentially lower level.

FIG. 47 illustrates two layers of a hierarchical system with a tree architecture that provides increasing degrees of hierarchical aggregation at each sequentially lower level. External control and reporting signal flows are not shown in this figure but are provided for by the invention.

In an embodiment, the invention provides for one portion of the chip-generated heat to be spatially transferred and another portion of the heat to be energy harvested. The greater the amount of energy that can be harvested at the heat exchange level, the better the resultant overall cooling effect and the greater the overall efficiency of the composite system.

FIG. 48 illustrates a hierarchical system for heat gathering compatible with the hierarchical arrangements depicted in FIGS. 2a-2j. At any level aggregated heat can be extracted for various purposes (such as heat-to-electricity conversions, dissipation by fans, etc.) as suggested by the dashed lines.

Figure 2A:
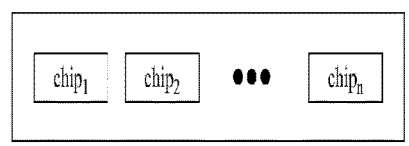
FIG. 2a shows a group of computer chips, for example, on a common printed circuit board.
Figure 2B:
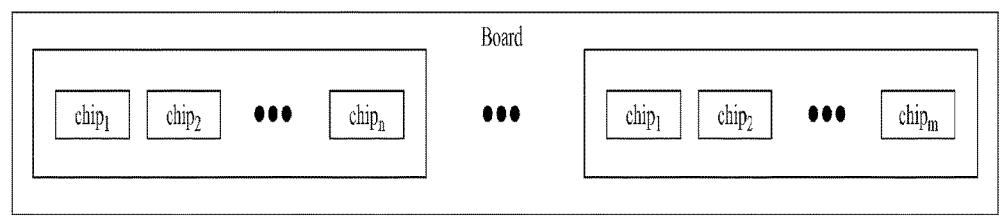
FIG. 2b depicts the two or more such groups, for example, sharing a common printed circuit board.
Figure 2C:
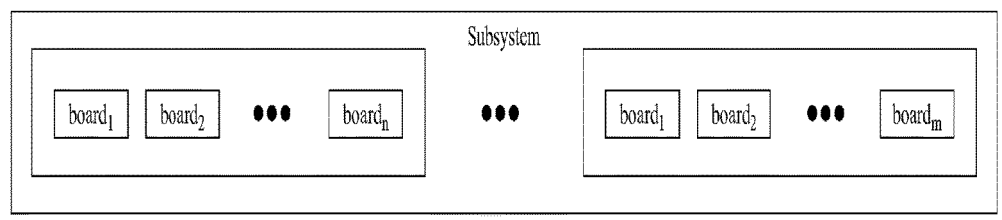
FIG. 2c illustrates two or more printed circuit boards, either as in FIG. 2a or FIG. 2b, which together are comprised by a common subsystem.
Figure 2D:
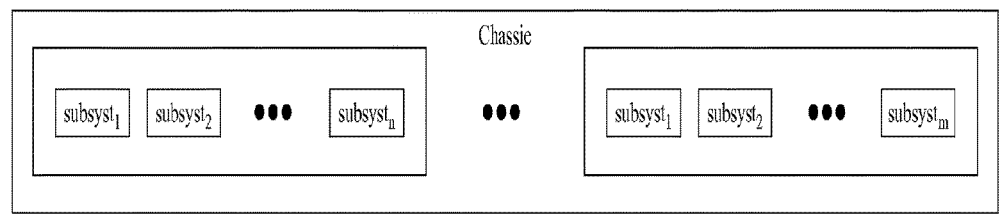
FIG. 2d illustrates two or more subsystems, such as depicted in FIG. 2a or otherwise, which together are comprised in a common chassis.
Figure 3:
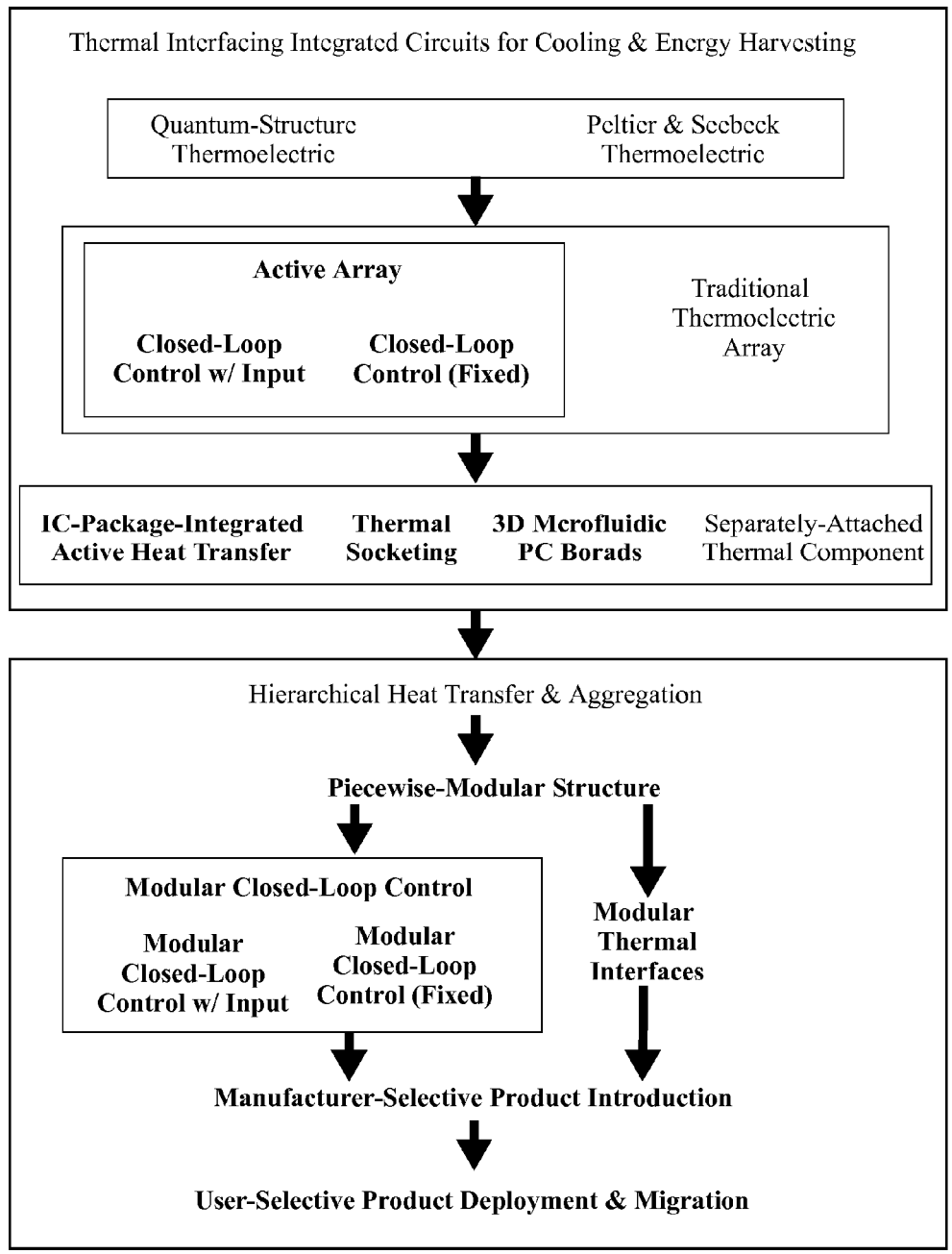
FIG. 3 depicts an exemplary non-limiting, non-characterizing view of various aspects of the invention.
Figure 49:
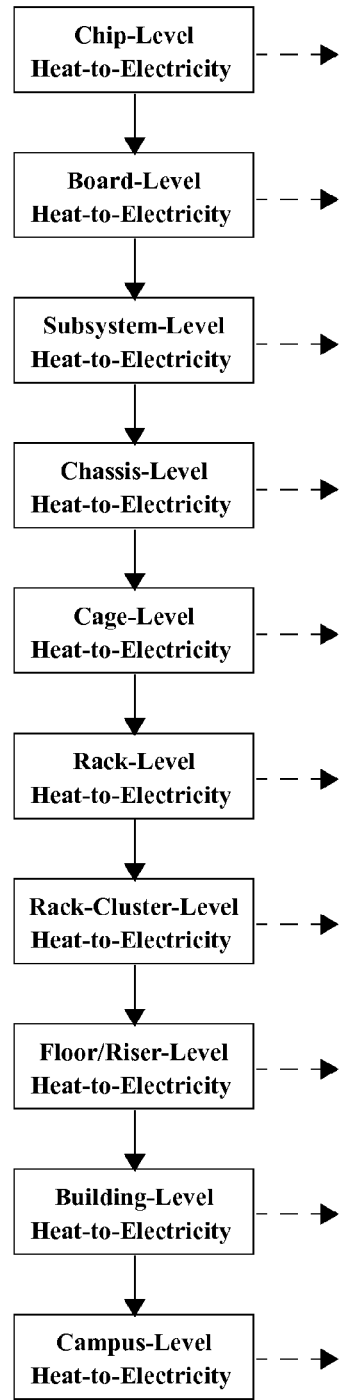

FIG. 49 illustrates a hierarchical system for heat-to-electricity conversion compatible with the hierarchical arrangements depicted in FIGS. 2a2j. At any level generated electricity can be extracted for various useful purposes (such as charging backup batteries, operating cooling fans, supplementing local power to one or more associated integrated circuits, circuits, subsystems, boards, etc.) as suggested by the dashed lines. In an embodiment, the invention provides for concerted effort to convert as much heat to electricity at the local chip level as possible.

Figure 50:
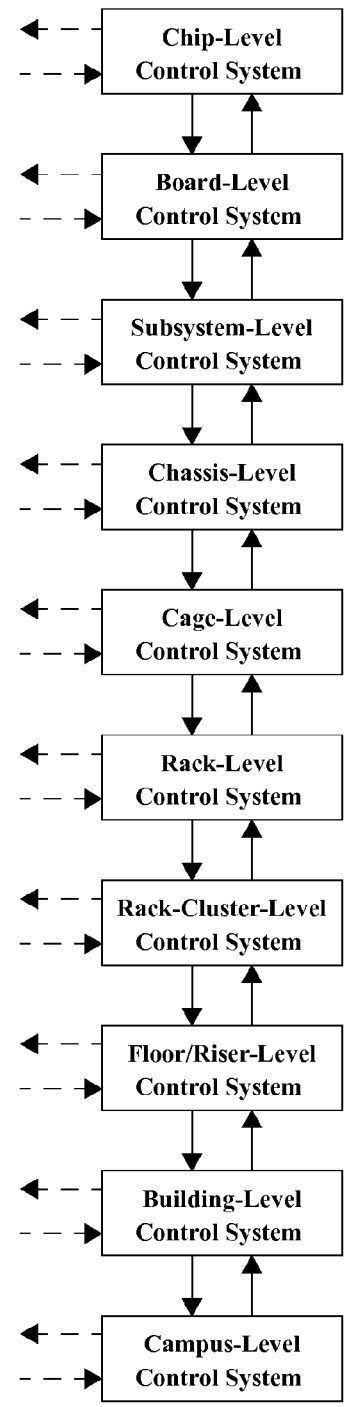

FIG. 50 illustrates a hierarchical control system compatible with the hierarchical arrangements depicted in FIGS. 2a-2j. At any level control parameters or commands can be provided to the control system as suggested by the inward dashed lines. At any level measurements, state variable, or control status can be provided from the control system as suggested by the outward dashed lines.

6. Modular Adaptive Multi-Level Control for Variable-Hierarchy-Structure Hierarchical Systems In an embodiment, the invention can comprise various types of modular adaptive multi-level control for variable-hierarchy-structure hierarchical systems. Various types of modular adaptive multi-level control for variable-hierarchy-structure hierarchical systems applicable for use in the present invention are taught in U.S. Patent Application 61/599,403. Selected material from U.S. Patent Application 61/599,403 is provided below.

In a further aspect of the invention, the hierarchical multiple-level control system comprises a plurality of subsystems, each with their own control system, that can operate in isolation, but when interconnected or networked with additional subsystems associated with other hierarchical levels, each subsystem will assume their respective role in the hierarchy with respect to (those) additional subsystems.

6.1 General Topological, Communications, and Hierarchical Framework

Figure 51:
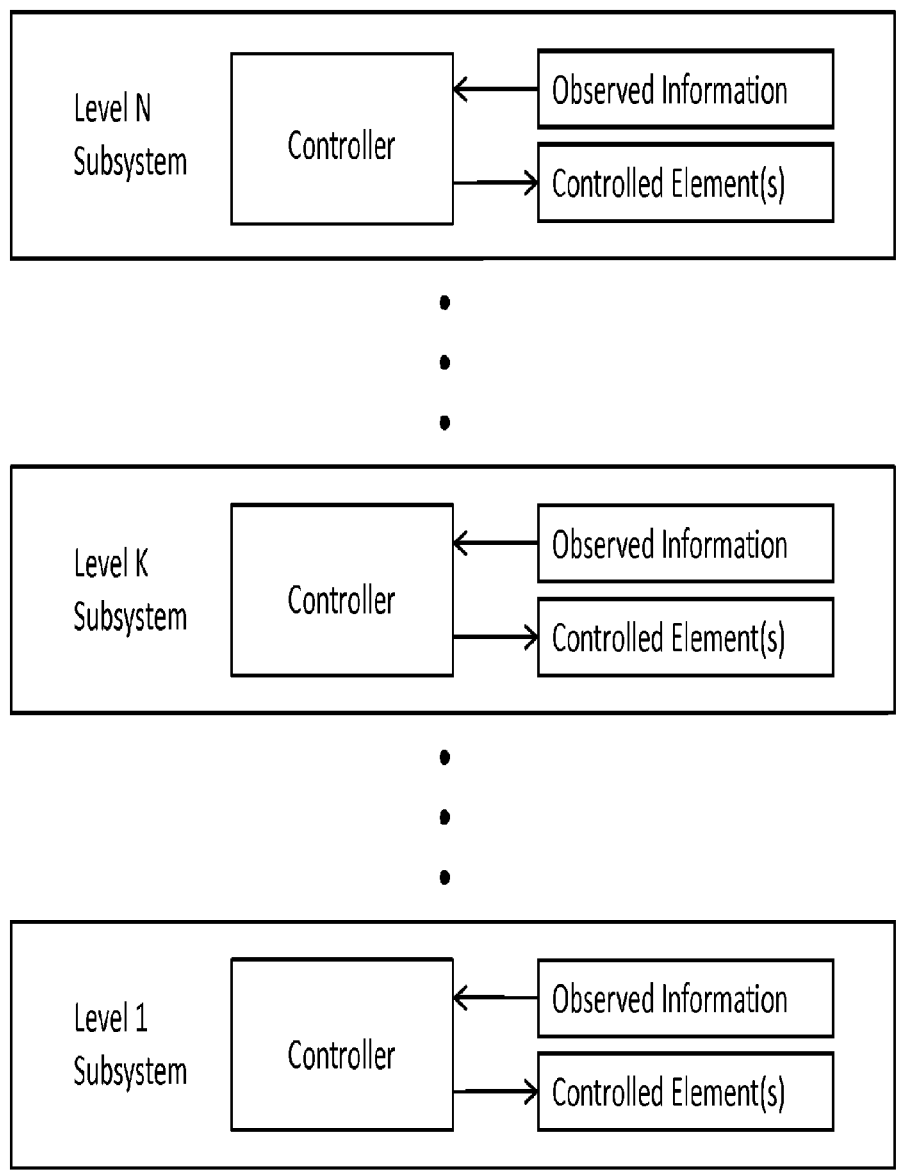

FIG. 51 depicts a representation of an example hierarchical multiple-level control system comprising N levels, each level in the hierarchy comprising a single subsystem.

Figure 52:
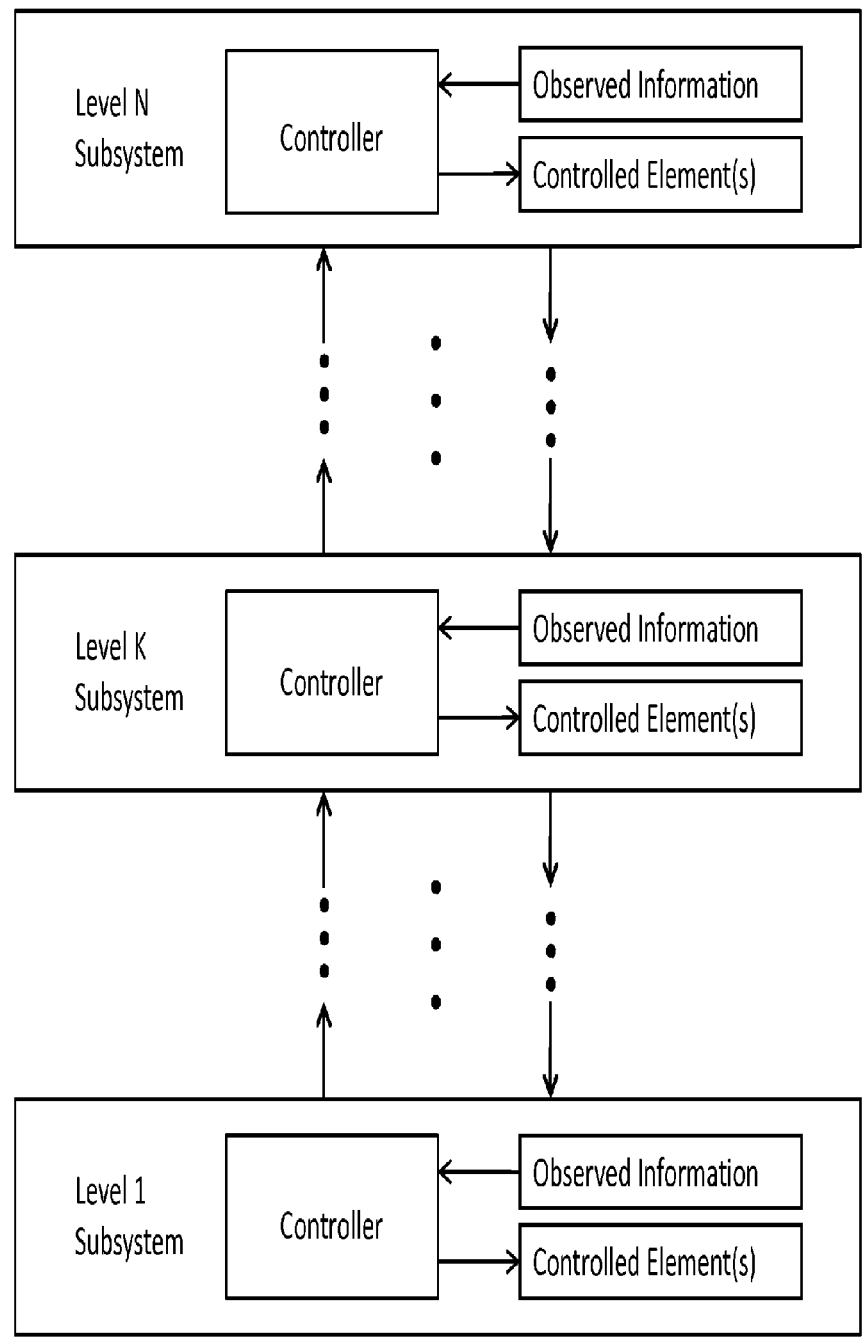

FIG. 52 depicts a representation of an example strictly-layer parent-to-child and child-to-parent communications between pairs of consecutive subsystem levels in the example hierarchy depicted in FIG. A.

Figure 53:
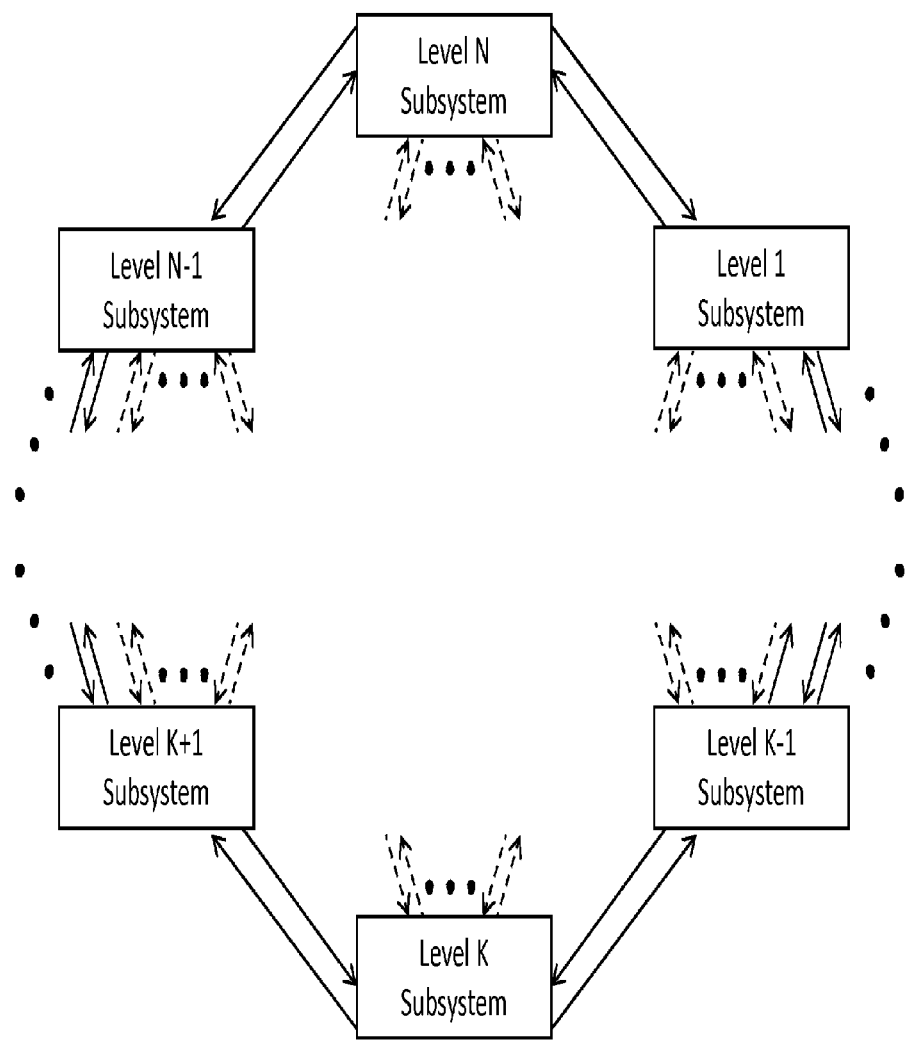

FIG. 53 depicts a representation wherein more general communications between pairs of subsystems in levels in the example hierarchy is provided for. In one extreme, all subsystems can be interconnected in a fu101mesh topology. In another The invention pertains to the area of hierarchical multiple-level control systems, and more specifically to the design of subsystems, each with their own control system, that can operate in isolation but—when interconnected or networked with additional subsystems associated with other hierarchical levels—will assume their respective role in the hierarchy with respect to those other additional subsystems.

Figure 54:
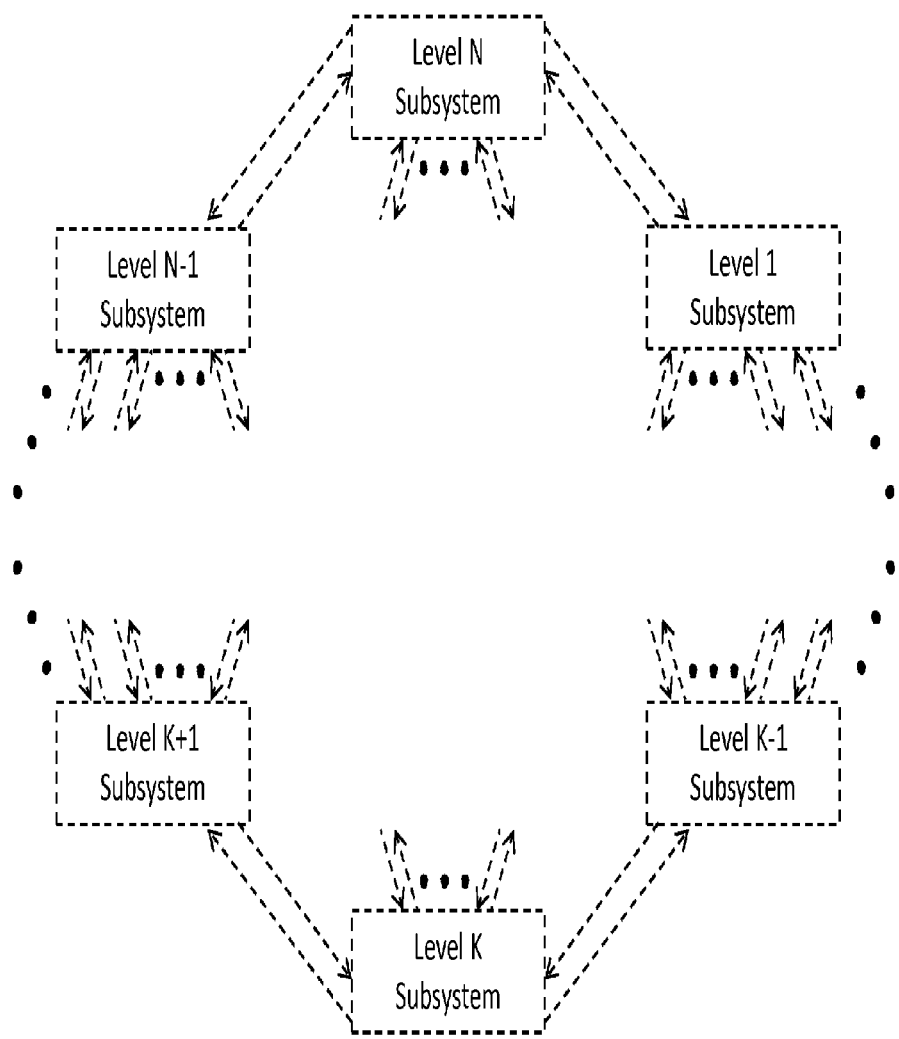

FIG. 54 depicts a variation on the representation of FIG. 53 wherein additionally only some of the subsystems associated with some of levels in the example hierarchy are present.

Figure 55:
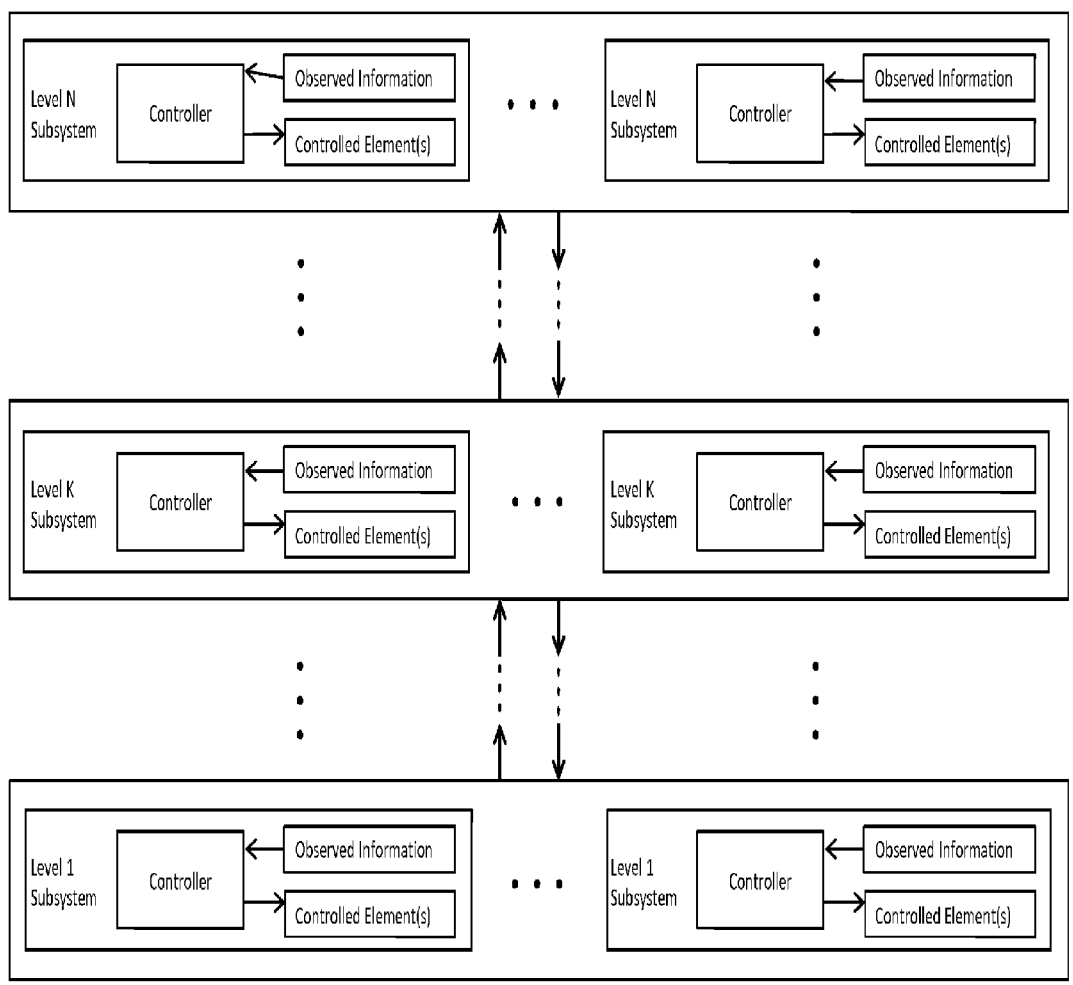

FIG. 55 depicts a variation on the representation of FIG. 52 wherein there are a plurality of subsystems associated with each level in the example hierarchy. Here strictly-layer parent-to-child and child-to-parent communications between pairs of consecutive subsystem levels in the example hierarchy is shown. However, the invention also provides for more general communications between pairs of subsystems in levels in the example hierarchy, for example such as in the arrangements provided in FIG. 53 and FIG. 54.

Figure 56:
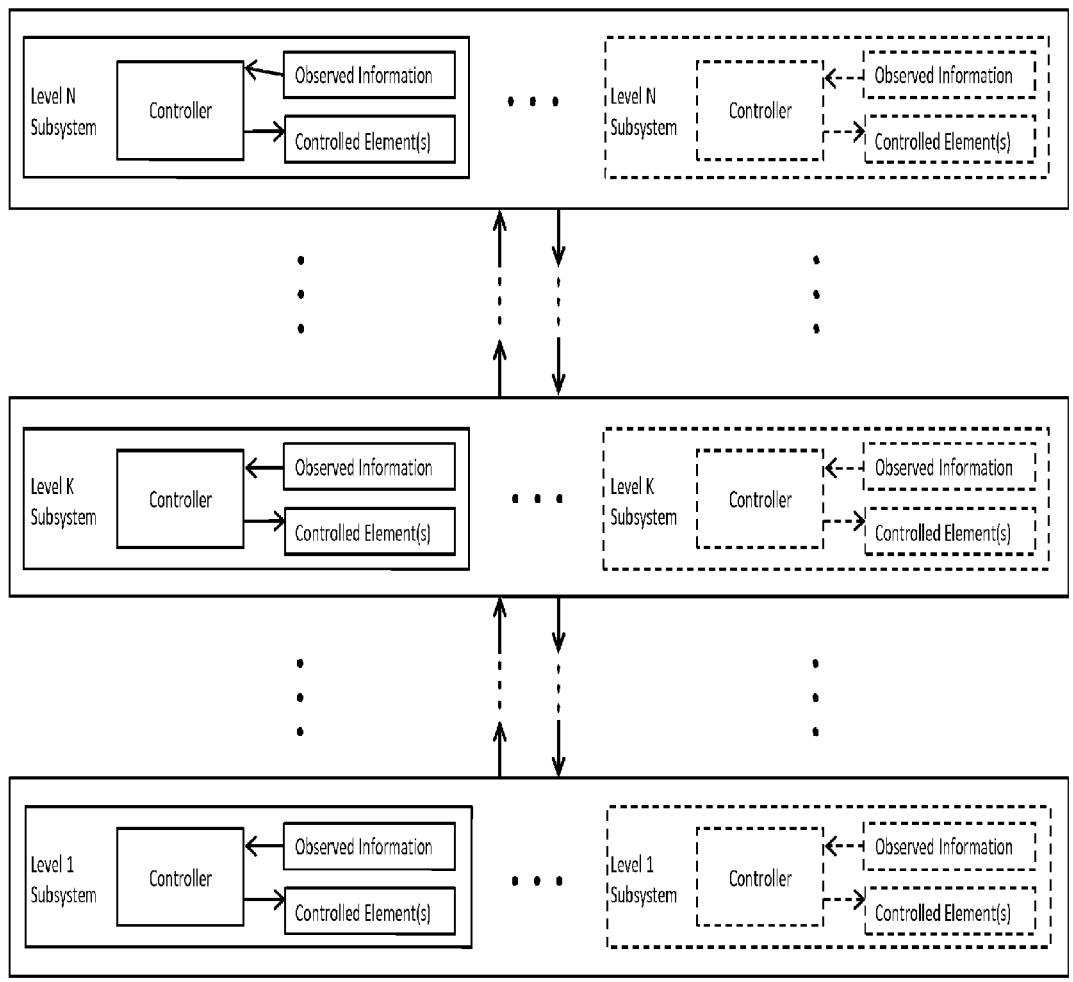

FIG. 56 depicts a variation on the representation of FIG. 55 wherein there is at least one subsystem associated with each level in the example hierarchy. Here again, strictly-layer parent-to-child and child-to-parent communications between pairs of consecutive subsystem levels in the example hierarchy is shown. However, the invention also provides for more general communications between pairs of subsystems in levels in the example hierarchy, for example such as in the arrangements provided in FIG. 53 and FIG. 54.

The invention provides for inclusion of communications among the subsystems assembled in an aggregate system. In one approach, a common network can be used. Such a network can be an IP network (such as cabled or wireless Ethernet®), a tapped buss (such as I²C, Dallas One-Wire®, etc.), USB, fiber, radio, infrared, power-line carrier (as in X10®), etc. If cables are used, such a network can be implemented in a daisy-chain among subsystems, implemented via connection hubs or switches (Ethernet, USB, etc.)

The invention provides for the communications among the subsystems to include at least one or more of:
Subsystem presence messages or indications,
Subsystem identification messages or indications,
Status messages or indications,
Measurement information to be shared with one or more other subsystems,
Control information directed to one or more other subsystems,
Configuration information directed to one or more other subsystems,
Diagnostics control and measurement information,
Logging information,
Timing and/or clock information.

7. Linear Controllers, Bilinear Controllers, and their Variations

In an embodiment, the invention provides for hierarchical multiple-level control system to include linear control systems, therein permitting the additive control of at least one controller state variables of one subsystem by control signals generated by or associated with at least one other subsystem.

FIG. 56a depicts a representation of an example linear control system accepting outside control and measurement inputs and internal feedback paths. The scalar or (more typically) vector state-variable x of the control system is directed, at least in some form and/or part, to the control of at least the internals of the subsystem to which the controller is associated. Typically the controller is internally comprised within the subsystem to which the controller is associated, but this is not required. The controller can be implemented in software, firmware, digital hardware, analog hardware, or various combinations of these.

FIG. 57b depicts a representation of an example variation on the arrangement of FIG. 57a wherein additional inputs are provided by other subsystems and additional outputs are provided to other subsystems. Each dashed oval represent operations such as scaling, offset, dynamical filtering, state-variable selection/suppression, etc. that can be relevant in various designs, implementations, and embodiments. The additional input and additional output information can be exchanged between and/or among subsystems employing one or more types of communication arrangements described earlier in Section 1.

Additionally, the representation depicted in FIG. 57b provides for changes to parameters and/or configuration of the controller responsive to the presence or existence of other subsystems (in other layers of the hierarchy, same layer of the hierarchy, etc.) as advantageous in various implementations and embodiments.

In an embodiment, the invention provides for hierarchical multiple-level control system to include bilinear control systems, therein permitting the multiplicative control of at least one controller state variables of one subsystem by control signals generated by or associated with at least one other subsystem.

In an embodiment, the invention provides for hierarchical multiple-level control system to include bilinear control systems, therein permitting both (1) additive control of at least one controller state variables of one subsystem by control signals generated by or associated with at least one other subsystem and (2) multiplicative control of at least one controller state variables of one subsystem by control signals generated by or associated with at least one other subsystem.

FIG. 58a depicts a representation of an example bilinear control system accepting outside control and measurement inputs and internal feedback paths. The scalar or (more typically) vector state-variable x of the control system is directed, at least in some form and/or part, to the control of at least the internals of the subsystem to which the controller is associated. Typically the controller is internally comprised within the subsystem to which the controller is associated, but this is not required. The controller can be implemented in software, firmware, digital hardware, analog hardware, or various combinations of these.

FIG. 58b depicts a representation of an example variation on the arrangement of FIG. 58a wherein additional inputs are provided by other subsystems and additional outputs are provided to other subsystems. Each dashed oval represent operations such as scaling, offset, dynamical filtering, state-variable selection/suppression, etc. that can be relevant in various designs, implementations, and embodiments. The additional input and additional output information can be exchanged between and/or among subsystems employing one or more types of communication arrangements described earlier in Section 1.

Additionally, the representation depicted in FIG. 58b provides for changes to parameters and/or configuration of the controller responsive to the presence or existence of other subsystems (in other layers of the hierarchy, same layer of the hierarchy, etc.) as advantageous in various implementations and embodiments.

8. Nonlinear Controllers

FIG. 59a depicts a representation of an example nonlinear control system accepting outside control and measurement inputs and internal feedback paths. The scalar or (more typically) vector state-variable x of the control system is directed, at least in some form and/or part, to the control of at least the internals of the subsystem to which the controller is associated. Typically the controller is internally comprised within the subsystem to which the controller is associated, but this is not required. The controller can be implemented in software, firmware, digital hardware, analog hardware, or various combinations of these.

FIG. 59b depicts a representation of an example variation on the arrangement of FIG. 59a wherein additional inputs are provided by other subsystems and additional outputs are provided to other subsystems. Each dashed oval represent operations such as scaling, offset, dynamical filtering, state-variable selection/suppression, etc. that can be relevant in various designs, implementations, and embodiments. The additional input and additional output information can be exchanged between and/or among subsystems employing one or more types of communication arrangements described earlier in Section 1.

Additionally, the representation depicted in FIG. 59b provides for changes to parameters and/or configuration of the controller responsive to the presence or existence of other subsystems (in other layers of the hierarchy, same layer of the hierarchy, etc.) as advantageous in various implementations and embodiments.

9. Addition of Synthesized Hysteresis to Open-Loop and Closed-Loop Controllers

It is common for many control systems, for example those controlling temperature, motor-controlled position, etc. to incorporate hysteresis. Additionally, many systems (such motor gear chains, mechanical thermostats, etc.) inherently comprise hysteresis processes. Accordingly the invention provides for at least one of:

- Introduction of synthesized hysteresis into controllers so as to obtain better performance,
- Introduction of synthesized hysteresis into controllers so as to obtain better stability,
- Introduction of synthesized hysteresis into controllers so as to allow for settling times during parameter or configuration changes,
- Inclusion of synthesized hysteresis in closed loop controller to compensate for inherently comprise hysteresis processes within controlled elements,
- Other uses.

Systems and methods for synthesized hysteresis for use in control and other systems is taught in, for example U.S. Pat. No. 7,309,828 and pending U.S. patent application Ser. No. 13/186,459. The synthesized hysteresis can be implemented in software, firmware, digital hardware, analog hardware, or various combinations of these.

10. Product Evolution and Phased Deployment

Recall the hierarchy of environments involved in heat transfer illustrated in FIGS. 2a-2j.

In an embodiment, the invention provides for a modular product hierarchy that can be designed to meet market need and demand.

Rather than necessitate replacement of existing system hardware structures all at once, the innovation will enable phased replacement as required due to the end of operating life, adequate degradation, or functional obsolescence.

Until such replacement or upgrade is enacted, the innovation can readily be incrementally implemented via incremental retrofit of computers, chip(s) within individual computers, cages, racks, etc.

The modular features used to implement scalability of the innovation can be implemented in such a way that each modular level can operate in a stand-alone mode, for example, relying on backup fans to expel excess heat. This can also provide a failsafe backup for heat dispersion should some part of a hierarchical deployment fail.

In an implementation or a deployment, aspects of the invention can be implemented at any one or more levels as determined appropriate in a given situation.

11. Other Forms of Operation

In an embodiment, the invention, the resulting system could be operated in a way that results in higher operating costs but which will provide active, controllable heat removal and heat aggregation for computer systems and data centers.

CLOSING

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

Although exemplary embodiments have been provided in detail, various changes, substitutions and alternations could be made thereto without departing from spirit and scope of the disclosed subject matter as defined by the appended claims. Variations described for the embodiments may be realized in any combination desirable for each particular application. Thus particular limitations and embodiment enhancements described herein, which may have particular advantages to a particular application, need not be used for all applications. Also, not all limitations need be implemented in methods, systems, and apparatuses including one or more concepts described with relation to the provided embodiments. Therefore, the invention properly is to be construed with reference to the claims.

REFERENCES

[1] Paik, P.; Chakrabarty, K.; Pamula, V. *Adaptive Cooling of Integrated Circuits Using Digital Microfluidics*. Artech House, Inc. Norwood, Me. 2007. ISBN 13: 978-1-59693-138-1.

[2] Aung, Win. *Cooling Techniques for Computers*. Hemisphere Publishing Corporation. New York. 1991. IBSN 0-89116-756-0.

[3] Rasmussen, Neil. APC by Schneider Electric. White Paper 138, Revision 7. "Cooling Strategies for Ultra-High Density Racks and Blade Servers". 2010.

[4] Moss, David, Dell Inc.; Bean, Jr., John H., APC by Schneider Electric. APC by Schneider Electric. White Paper 46, Revision 1. "Energy Impact of Increased Server Inlet Temperature". 2010.

[5] Bell, Lon E. "Cooling, Heating, Generating Power, and Recovering Waste Heat with Thermoelectric Systems". Science magazine. Volume 321. Sep. 12, 2008.

[6] Rowe, D. M. *Thermoelectrics Handbook: Macro to Nano*. Taylor & Francis. Boca Raton, Fla. 2006. ISBN 0-8493-2264-2. Chapter 57: Quantum Well Thermoelectric Devices and Applications.

[7] "The Science Behind Cool Chips™, An Introduction". http://www.coolchips.gi/technology/overview.shtml (visited Feb. 16, 2012). Cool Chips PLC. 2012.

[8] "Cool Chips™, Technical Overview". http://www-.coolchips.gi.technology/Coolchipstech3Jan06.pdf (visited Feb. 16, 2012). Cool Chips PLC. 2012.

[9] "Power Chips™, A Quantum Leap in Power Generation." http://www.powerchips.gi/(visited Feb. 16, 2012). Power Chips PLC. 2012.

[10] "Avto Metals—A World of Possibilities". http://www.avtometals.gi/ (visited Feb. 16, 2012). Avto Metals PLC. 2012.

[11] Li, Kam W. *Applied Thermodynamics: Availability Method and Energy Conversion*. Taylor & Francis. Washington, D.C. 1996. ISBN 1-56032-349-3.

[12] Maraquand, C.; Croft, D. *Thermofluids: An Integrated Approach to Thermodynamics and Fluid Mechanics Principles*. John Wiley & Sons. Chichester, West Sussex, England. 1994. ISBN 0-471-94357-6.

[13] Ioffe, A. F. *Semiconductor Thermoelements and Thermoelectric Cooling*. Infosearch Limited. London. 1957.

[14] Gray. *The Dynamic Behavior of Thermoelectric Devices*. The Technology Press of The Massachusetts Institute of Technology and John Wiley & Sons, Inc. New York. 1960. LCN 60-12981.

[15] Rowe, D. M. *Thermoelectrics Handbook: Macro to Nano*. Taylor & Francis. Boca Raton, Fla. 2006. ISBN 0-8493-2264-2. Chapter 59, Section 3: Heat Transfer Systems.

[16] Burshteyn, A. I. *Semiconductor Thermoelectric Devices*. Temple Press Books Ltd. London. 1964.

[17] Benedicks, Carl Axel Fredrik. *The Homogeneous Electro-thermic Effect (including the Thomson effect as a special case)*. A. B. Svenska Teknologföreningens Förlag. Stockholm. 1921.

[18] MacDonald, D. K. C. *Thermoelectricity: An Introduction to the Principles*. John Wiley & Sons. Inc. New York. 1962. LCN 62-10927.

I claim:

1. A system for incremental deployment of stand-alone and hierarchical adaptive cooling and energy harvesting arrangements for use in at least information technology, the system comprising:
a plurality of subsystems, each subsystem providing controlled cooling and energy harvesting functions within an associated article of heat-producing equipment, each subsystem comprising:
at least one thermal interface for heat transfer,
at least one thermoelectric device capable of acting as a thermoelectric cooler and as a thermoelectric generator,
a control system receiving at least one input signal and providing a control output,
electronics controlled by the control output and connected to the thermoelectric device, the electronics selectively configuring the thermoelectric device in at least one of a: thermoelectric cooler operating mode and a thermoelectric generation operating mode, and
at least one control interface for providing information transfer between the control system and at least one other associated subsystem;
an interconnection between the thermal interfaces of each subsystem of the plurality of subsystems; and
an interconnection between the control interfaces of each subsystem of the plurality of subsystems,
wherein the at least one thermal interface of a first of the plurality of subsystems is interconnected to the at least one thermal interface of a second of the plurality of subsystems to form a first thermal interconnection;
wherein the at least one control interface of the first of the plurality of subsystems is interconnected to the at least one thermal interface of the second of the plurality of subsystems, and
wherein the first and second subsystems provide coordinated cooling and energy harvesting functions.

2. The system of claim 1, wherein the at least one thermoelectric device is in thermal contact with an integrated circuit chip.

3. The system of claim 1, wherein subsystem can operate in isolation to perform controlled cooling and energy harvesting.

4. The system of claim 1, wherein at least some of the plurality of subsystems operate in a peer relationship.

5. The system of claim 1, wherein at least some of the plurality of subsystems assume a role in a cooling hierarchy.

6. The system of claim 1, wherein the control systems of at least some of the plurality of subsystems assume a role in a hierarchical control system.

7. The system of claim 1, wherein the control is a variable-hierarchy-structure hierarchical system.

8. The system of claim 7, wherein the hierarchical control system is a multiple-level control system.

9. The system of claim 1, wherein the at least one thermoelectric device comprises quantum-process thermoelectric material.

10. The system of claim 1, wherein the at least one thermoelectric device comprises quantum-well thermoelectric material.

11. The system of claim 1, further comprising a multiplexer to multiplexes the operating mode of the at least one thermoelectric device among at least two of a cooling mode, an energy-harvesting mode, and a temperature sensing mode.

12. The system of claim 1, further comprising a switch to adaptively switch the operating mode of the at least one thermoelectric device among at least two of a cooling mode, an energy-harvesting mode, and a temperature sensing mode.

13. The system of claim 1, wherein the at least one thermoelectric device is in thermal contact with a circulating cooling fluid arrangement, the circulating cooling fluid arrangement in thermal contact with at least one integrated circuit chip.

14. The system of claim 1, wherein the at least one thermoelectric device is in thermal contact with a heat pipe arrangement, the heat pipe arrangement in thermal contact with at least one integrated circuit chip.

15. The system of claim 1, wherein the at least one thermoelectric device is in thermal contact with a micro-droplet cooling arrangement, the micro-droplet cooling arrangement in thermal contact with at least one integrated circuit chip.

16. The system of claim 15, further comprising a three-dimensional micro-droplet cooling arrangement.

17. The system of claim 1, wherein the thermoelectric device is positioned between heat transfer subsystems within a cooling hierarchy.

18. The system of claim 1, wherein the thermal interconnection comprises fastener-facilitated thermal contact.

19. The system of claim 1, wherein the thermal interconnection comprises a mating arrangement.

20. The system of claim 1, wherein at least one subsystem comprises a backup fan to expel heat.

* * * * *